(12) United States Patent
Culver et al.

(10) Patent No.: US 7,391,707 B2
(45) Date of Patent: *Jun. 24, 2008

(54) DEVICES AND METHODS OF DETECTING MOVEMENT BETWEEN MEDIA AND PROBE TIP IN A PROBE DATA STORAGE SYSTEM

(75) Inventors: Joanne P. Culver, deceased, late of Oakland CA (US); by Thomas F. Rust, legal representative, Oakland, CA (US); Thomas F. Rust, Oakland, CA (US)

(73) Assignee: Nanochip, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/670,941

(22) Filed: Feb. 2, 2007

(65) Prior Publication Data

US 2007/0165444 A1    Jul. 19, 2007

Related U.S. Application Data

(63) Continuation of application No. 09/465,592, filed on Dec. 17, 1999, now Pat. No. 7,260,051.

(60) Provisional application No. 60/112,787, filed on Dec. 18, 1998.

(51) Int. Cl.
*G11B 9/00* (2006.01)

(52) U.S. Cl. .................. 369/126; 369/101; 250/306; 977/947

(58) Field of Classification Search .......... 369/126, 369/101, 246, 288, 284, 30.01; 250/306; 347/111; 977/947, 849; 73/105; 356/501, 356/496

See application file for complete search history.

(56) References Cited

U.S. PATENT DOCUMENTS 4,300,350 A    11/1981   Becker .................. 60/528

(Continued)

FOREIGN PATENT DOCUMENTS

EP        0 438 256 B1    7/1991

(Continued)

OTHER PUBLICATIONS

Bo Hong, Exploring the Usage of MEMS-based Storage as Metadata Storage and Disk Cache in Storage Hierarchy, Storage Systems Research Center, Jack Baskin School of Engineering, University of California at Santa Cruz, http://www.cse.ucsc.edu/~hongbo/publications/mems-metadata.pdf Technical Report, 2003.

(Continued)

*Primary Examiner*—Hoa T Nguyen
*Assistant Examiner*—Kim-Kwok Chu
(74) *Attorney, Agent, or Firm*—Fliesler Meyer LLP

(57) ABSTRACT

A memory apparatus comprises a media, a tip adapted to write information to and read information from said media, a media movement mechanism attached to said media and configured to move said media in response to media control signals, and a capacitive sensor configured to detect an amount of relative movement of said media and said tip in at least an x-axis direction. The capacitive sensor includes a fixed comb having fingers protruding in an x-axis direction, a moving comb connected having fingers protruding in an x-axis direction, and an electrical path connected to said fixed comb and an electrical path connected to said moving comb. The relative movement in at least the x-axis direction is determined at least in part on a change in capacitance between said fixed and moving combs of said capacitive sensor.

20 Claims, 58 Drawing Sheets

U.S. PATENT DOCUMENTS

| | | | |
|---|---|---|---|
| 4,340,953 A | 7/1982 | Iwamura et al. ............. 369/126 |
| 4,575,822 A | 3/1986 | Quate ......................... 365/174 |
| 4,710,899 A | 12/1987 | Young et al. ................. 365/113 |
| 4,719,594 A | 1/1988 | Young et al. ................. 365/113 |
| 4,737,934 A | 4/1988 | Ross et al. ................... 365/106 |
| 4,744,055 A | 5/1988 | Hennessey ................... 365/113 |
| 4,769,338 A | 9/1988 | Ovshinsky ..................... 437/39 |
| 4,769,682 A | 9/1988 | Yang et al. ...................... 357/2 |
| 4,775,425 A | 10/1988 | Guha et al. ................... 136/249 |
| 4,792,501 A | 12/1988 | Allred et al. ................. 428/699 |
| 4,820,394 A | 4/1989 | Young et al. ............ 204/192.21 |
| 4,829,507 A | 5/1989 | Kazan et al. ................. 369/126 |
| 4,831,614 A | 5/1989 | Duerig et al. ................ 369/101 |
| 4,843,443 A | 6/1989 | Ovshinsky et al. .......... 357/23.7 |
| 4,845,533 A | 7/1989 | Pryor et al. ...................... 357/2 |
| 4,868,616 A | 9/1989 | Johnson et al. ................. 357/17 |
| 4,876,667 A | 10/1989 | Ross et al. ................... 365/113 |
| 4,882,295 A | 11/1989 | Czubatyj et al. ............. 437/101 |
| 4,883,686 A | 11/1989 | Doehler et al. ................. 427/38 |
| 4,891,330 A | 1/1990 | Guha et al. ................... 437/81 |
| 4,916,002 A | 4/1990 | Carver ......................... 428/139 |
| 4,916,688 A | 4/1990 | Foster et al. ................. 369/126 |
| 4,924,436 A | 5/1990 | Strand ......................... 365/113 |
| 4,943,719 A | 7/1990 | Akamine et al. ............. 250/306 |
| 4,945,515 A | 7/1990 | Ooumi et al. ................. 365/174 |
| 4,962,480 A | 10/1990 | Ooumi et al. ................. 365/151 |
| 4,968,585 A | 11/1990 | Albrecht et al. ............. 430/320 |
| 4,987,312 A | 1/1991 | Eigler ..................... 250/492.3 |
| 5,008,617 A | 4/1991 | Czubatyj et al. ............. 324/158 |
| 5,038,322 A | 8/1991 | Van Loenen ................. 365/114 |
| 5,043,577 A | 8/1991 | Pohl et al. ................... 250/306 |
| 5,043,578 A | 8/1991 | Guthner et al. ............. 250/307 |
| 5,051,977 A | 9/1991 | Goldberg ..................... 369/126 |
| 5,091,880 A | 2/1992 | Isono et al. ................. 365/151 |
| 5,095,479 A | 3/1992 | Harigaya et al. ............. 369/288 |
| 5,097,443 A | 3/1992 | Kaneko et al. ............. 365/153 |
| 5,103,284 A | 4/1992 | Ovshinsky et al. ............. 357/60 |
| 5,126,635 A | 6/1992 | Doehler et al. ......... 315/111.21 |
| 5,128,099 A | 7/1992 | Strand et al. ................. 420/579 |
| 5,132,934 A | 7/1992 | Quate et al. ................. 369/126 |
| 5,144,148 A | 9/1992 | Eigler ..................... 250/492.3 |
| 5,144,581 A | 9/1992 | Toda et al. ................... 369/126 |
| 5,159,661 A | 10/1992 | Ovshinsky et al. ............. 395/24 |
| 5,166,758 A | 11/1992 | Ovshinsky et al. ............. 257/3 |
| 5,166,919 A | 11/1992 | Eigler et al. ................. 369/126 |
| 5,177,567 A | 1/1993 | Klersy et al. ..................... 257/4 |
| 5,180,686 A | 1/1993 | Banerjee et al. ............. 437/181 |
| 5,180,690 A | 1/1993 | Czubatyj et al. ............. 437/233 |
| 5,182,724 A | 1/1993 | Yanagisawa et al. ........ 365/151 |
| 5,187,367 A | 2/1993 | Miyazaki et al. ............. 250/306 |
| 5,196,701 A | 3/1993 | Foster et al. ................. 250/306 |
| 5,210,714 A | 5/1993 | Pohl et al. ................... 365/157 |
| 5,216,631 A | 6/1993 | Sliwa, Jr. ................... 365/174 |
| 5,222,060 A | 6/1993 | Kuroda et al. ............. 369/126 |
| 5,223,308 A | 6/1993 | Doehler ....................... 427/575 |
| 5,231,047 A | 7/1993 | Ovshinsky et al. ........... 437/101 |
| 5,233,582 A * | 8/1993 | Tanno et al. .............. 369/44.23 |
| 5,251,200 A | 10/1993 | Hatanaka et al. ............. 369/126 |
| 5,260,567 A | 11/1993 | Kuroda et al. .......... 250/227.19 |
| 5,262,981 A | 11/1993 | Rabe et al. ................... 365/120 |
| 5,264,876 A | 11/1993 | Kawade et al. ............. 346/153.1 |
| 5,265,046 A | 11/1993 | Fuchs et al. ................. 365/151 |
| 5,268,571 A | 12/1993 | Yamamoto et al. ............. 250/306 |
| 5,283,442 A | 2/1994 | Martin et al. ................. 250/307 |
| 5,289,455 A | 2/1994 | Kuroda et al. ............. 369/126 |
| 5,296,716 A | 3/1994 | Ovshinsky et al. ............. 257/3 |
| 5,307,311 A | 4/1994 | Sliwa, Jr. ................... 365/174 |
| 5,323,375 A | 6/1994 | Ihara et al. ................. 369/126 |
| 5,324,553 A | 6/1994 | Ovshinsky et al. .......... 427/571 |
| 5,329,122 A | 7/1994 | Sakai et al. ................. 250/306 |
| 5,329,514 A | 7/1994 | Eguchi et al. ............. 369/126 |
| 5,330,630 A | 7/1994 | Klersy et al. ........... 204/192.05 |
| 5,331,589 A | 7/1994 | Gambino et al. ............. 365/151 |
| 5,335,197 A | 8/1994 | Kaneko et al. ............. 365/153 |
| 5,341,328 A | 8/1994 | Ovshinsky et al. .......... 365/163 |
| 5,343,042 A | 8/1994 | Fuchs et al. ................. 250/307 |
| 5,359,205 A | 10/1994 | Ovshinsky et al. ............. 257/3 |
| 5,373,494 A | 12/1994 | Kawagishi et al. .......... 369/126 |
| 5,389,475 A | 2/1995 | Yanagisawa et al. .......... 430/19 |
| 5,390,161 A | 2/1995 | Kurihara et al. ............. 369/126 |
| 5,396,453 A | 3/1995 | Kawada et al. ............. 365/151 |
| 5,396,483 A | 3/1995 | Matsuda et al. ............. 369/283 |
| 5,398,229 A | 3/1995 | Nakayama et al. ......... 369/126 |
| 5,406,509 A | 4/1995 | Ovshinsky et al. .......... 365/113 |
| 5,411,591 A | 5/1995 | Izu et al. ..................... 118/718 |
| 5,412,597 A | 5/1995 | Miyazaki et al. ............. 365/174 |
| 5,414,271 A | 5/1995 | Ovshinsky et al. ............. 257/3 |
| 5,416,331 A | 5/1995 | Ichikawa et al. .......... 250/492.2 |
| 5,426,092 A | 6/1995 | Ovshinsky et al. .......... 505/461 |
| 5,432,771 A | 7/1995 | Shido et al. ................. 369/126 |
| 5,439,777 A | 8/1995 | Kawada et al. ............. 430/270 |
| 5,444,191 A | 8/1995 | Yamamoto et al. ........ 178/18.01 |
| 5,446,684 A | 8/1995 | Kaneko et al. ................. 365/46 |
| 5,453,970 A | 9/1995 | Rust et al. ................... 369/176 |
| 5,471,064 A | 11/1995 | Koyanagi et al. .......... 250/452.2 |
| 5,471,458 A | 11/1995 | Oguchi et al. ............. 369/126 |
| 5,475,318 A | 12/1995 | Marcus et al. ............. 324/762 |
| 5,481,528 A | 1/1996 | Eguchi et al. ............. 369/126 |
| 5,526,334 A | 6/1996 | Yamano et al. ............. 369/53 |
| 5,534,711 A | 7/1996 | Ovshinsky et al. ............. 257/3 |
| 5,534,712 A | 7/1996 | Ovshinsky et al. ............. 217/3 |
| 5,536,947 A | 7/1996 | Klersy et al. ..................... 257/3 |
| 5,537,372 A | 7/1996 | Albrecht et al. ............. 369/43 |
| 5,543,737 A | 8/1996 | Ovshinsky et al. .......... 326/104 |
| 5,547,774 A | 8/1996 | Gimzewski et al. ......... 428/694 |
| 5,557,596 A | 9/1996 | Gibson et al. ............. 369/101 |
| 5,561,300 A | 10/1996 | Wada et al. ............. 250/492.2 |
| 5,562,776 A | 10/1996 | Sapru et al. ................. 118/723 |
| 5,567,241 A | 10/1996 | Tsu et al. ..................... 118/723 |
| 5,591,501 A | 1/1997 | Ovshinsky et al. .......... 428/64.1 |
| 5,596,522 A | 1/1997 | Ovshinsky et al. .......... 365/113 |
| 5,597,411 A | 1/1997 | Fritzsche et al. ............. 117/104 |
| 5,606,162 A | 2/1997 | Buser et al. ................. 250/306 |
| 5,615,143 A | 3/1997 | MacDonald et al. ........ 365/112 |
| 5,623,295 A * | 4/1997 | Kishi et al. ................. 369/126 |
| 5,623,476 A | 4/1997 | Eguchi et al. ............. 369/126 |
| 5,670,224 A | 9/1997 | Izu et al. ..................... 428/35.8 |
| 5,679,952 A | 10/1997 | Lutwyche et al. ........... 250/306 |
| 5,687,112 A | 11/1997 | Ovshinsky et al. .......... 365/163 |
| 5,689,494 A | 11/1997 | Ichikawa et al. ............. 369/126 |
| 5,694,054 A | 12/1997 | Ovshinsky et al. .......... 326/35 |
| 5,694,146 A | 12/1997 | Ovshinsky et al. .......... 345/91 |
| 5,714,768 A | 2/1998 | Ovshinsky et al. ............. 257/40 |
| 5,721,721 A | 2/1998 | Yanagisawa et al. ........ 369/126 |
| 5,751,685 A | 5/1998 | Yi ................................ 369/126 |
| 5,757,446 A | 5/1998 | Ovshinsky et al. .......... 349/49 |
| 5,777,977 A | 7/1998 | Fujiwara et al. ............. 369/126 |
| 5,778,134 A | 7/1998 | Sakai et al. ..................... 386/46 |
| 5,793,743 A | 8/1998 | Duerig et al. ................ 369/126 |
| 5,801,472 A | 9/1998 | Wada et al. ................. 310/309 |
| 5,804,710 A | 9/1998 | Mamin et al. ................. 73/105 |
| 5,808,973 A | 9/1998 | Tanaka ......................... 369/14 |
| 5,812,516 A | 9/1998 | Nose et al. ................. 369/126 |
| 5,822,285 A | 10/1998 | Rugar et al. ............. 369/44.26 |
| 5,825,046 A | 10/1998 | Czubatyj ....................... 257/2 |
| 5,835,477 A | 11/1998 | Binnig et al. ................. 369/126 |
| 5,848,077 A | 12/1998 | Kamae et al. ................. 371/53 |
| 5,851,902 A | 12/1998 | Sakai et al. ................. 438/459 |
| 5,856,672 A | 1/1999 | Ried ........................... 250/306 |
| 5,856,967 A | 1/1999 | Mamin et al. ............. 369/126 |
| 5,861,754 A | 1/1999 | Ueno et al. ................. 324/660 |
| 5,877,497 A | 3/1999 | Binnig et al. ................. 250/306 |
| 5,886,922 A | 3/1999 | Saito et al. ................. 365/164 |
| 5,912,839 A | 6/1999 | Ovshinsky et al. ...... 365/185.03 |

| | | | | | | | |
|---|---|---|---|---|---|---|---|
| 5,929,438 A | 7/1999 | Suzuki et al. | 250/306 | 6,667,900 B2 | 12/2003 | Lowrey | 365/171 |
| 5,933,365 A | 8/1999 | Klersky et al. | 365/148 | 6,671,710 B2 | 12/2003 | Ovshinsky | 708/493 |
| 5,935,339 A | 8/1999 | Henderson et al. | 134/1 | 6,673,700 B2 | 1/2004 | Dennison | 438/466 |
| 5,953,306 A | 9/1999 | Yi | 369/126 | 6,680,808 B2 | 1/2004 | Allenspach et al. | 360/59 |
| 5,962,949 A | 10/1999 | Dhuler et al. | 310/307 | 6,692,145 B2 | 2/2004 | Gianchandani et al. | 374/185 |
| 6,000,021 A | 12/1999 | Saito et al. | 711/163 | 6,696,355 B2 | 2/2004 | Dennison | 438/597 |
| 6,000,047 A | 12/1999 | Kamae et al. | 714/710 | 6,723,421 B2 | 4/2004 | Ovshinsky | 428/315.7 |
| 6,001,519 A | 12/1999 | Yang et al. | 430/20 | 6,733,956 B2 | 5/2004 | Maimon | 430/314 |
| 6,017,618 A | 1/2000 | Gupta et al. | 428/321.1 | 6,762,402 B2 | 7/2004 | Choi et al. | 250/234 |
| 6,027,951 A | 2/2000 | MacDonald et al. | 438/20 | 6,784,475 B2 | 8/2004 | Hong et al. | 257/295 |
| 6,028,393 A | 2/2000 | Izu | 315/111.01 | 6,800,865 B2 | 10/2004 | Nakayama et al. | 250/492.3 |
| RE36,603 E | 3/2000 | Pohl et al. | 365/151 | 6,819,587 B1 | 11/2004 | Sharma et al. | 365/173 |
| 6,038,916 A | 3/2000 | Cleveland et al. | 73/105 | 6,819,588 B2 | 11/2004 | Baumeister et al. | 365/174 |
| 6,054,745 A | 4/2000 | Nakos et al. | 257/415 | 6,841,220 B2 | 1/2005 | Onoe | 428/66.7 |
| 6,075,719 A | 6/2000 | Lowrey | 365/148 | 6,854,648 B2 | 2/2005 | Hong et al. | 235/451 |
| 6,084,849 A | 7/2000 | Durig et al. | 369/126 | 6,862,206 B1 | 3/2005 | Carter et al. | 365/151 |
| 6,087,580 A | 7/2000 | Ovshinsky | 136/261 | 6,912,193 B2 | 6/2005 | Cho | 369/126 |
| 6,087,674 A | 7/2000 | Ovshinsky | 257/2 | 6,930,368 B2 | 8/2005 | Hartwell et al. | 257/418 |
| 6,088,320 A | 7/2000 | Bayer et al. | 369/101 | 6,942,914 B2 | 9/2005 | Onoe | 428/701 |
| 6,101,164 A | 8/2000 | Kado | 369/126 | 6,982,898 B2 | 1/2006 | Rust | |
| 6,124,663 A | 9/2000 | Haake et al. | 310/307 | 6,985,377 B2 | 1/2006 | Rust | |
| 6,141,241 A | 10/2000 | Ovshinsky | | 7,020,064 B2 | 3/2006 | Kim et al. | 369/126 |
| 6,186,090 B1 | 2/2001 | Dotter, II | 118/718 | 7,026,676 B2 | 4/2006 | Ahner et al. | 257/295 |
| 6,196,061 B1 | 3/2001 | Adderton et al. | 73/105 | 7,027,364 B2 | 4/2006 | Hong et al. | 369/13.01 |
| 6,236,589 B1 | 5/2001 | Gupta et al. | 365/151 | 7,041,394 B2 | 5/2006 | Weller et al. | 428/836 |
| 6,245,280 B1 | 6/2001 | Tan et al. | 264/430 | 7,065,033 B2 | 6/2006 | Onoe | 369/125 |
| 6,249,747 B1 | 6/2001 | Binnig et al. | 369/126 | 7,071,031 B2 | 7/2006 | Pogge et al. | 216/2 |
| 6,252,226 B1 | 6/2001 | Kley | 250/306 | 7,149,180 B2 | 12/2006 | Onoe | 369/276 |
| RE37,259 E | 7/2001 | Ovshinsky | | 7,151,739 B2 | 12/2006 | Cho | 369/126 |
| 6,275,410 B1 | 8/2001 | Morford | 365/151 | 7,212,484 B2 | 5/2007 | Maeda | 369/101 |
| 6,305,788 B1 | 10/2001 | Silverbrook | 347/54 | 7,218,600 B2 | 5/2007 | Cho | 369/126 |
| 6,314,014 B1 | 11/2001 | Lowrey | 365/100 | 7,221,639 B2 | 5/2007 | Onoe | 369/126 |
| 6,339,217 B1 | 1/2002 | Kley | 250/216 | 7,227,830 B2 | 7/2007 | Cho | 369/126 |
| 6,359,755 B1 | 3/2002 | Dietzel et al. | 360/244.3 | 7,242,661 B2 | 7/2007 | Cho | 369/126 |
| 6,366,340 B1 | 4/2002 | Ishibashi et al. | 355/69 | 7,260,051 B1 * | 8/2007 | Rust et al. | 369/126 |
| 6,369,400 B1 | 4/2002 | Haeberle et al. | 250/548 | 7,265,937 B1 | 9/2007 | Erden | 360/55 |
| 6,370,306 B1 | 4/2002 | Sato | 385/129 | 7,276,173 B2 | 10/2007 | Onoe | 523/466 |
| 6,411,589 B1 | 6/2002 | Hoen et al. | 369/126 | 7,283,453 B2 | 10/2007 | Onoe | 369/126 |
| 6,452,891 B1 | 9/2002 | Hennessey | 369/116 | 2001/0045530 A1 | 11/2001 | Haeberle et al. | |
| 6,463,874 B1 | 10/2002 | Dotter, II et al. | 118/723 | 2002/0021139 A1 | 2/2002 | Jackson | |
| 6,480,438 B1 | 11/2002 | Park | 365/260.06 | 2002/0037438 A1 | 3/2002 | Takami | |
| 6,487,113 B1 | 11/2002 | Park | 365/163 | 2002/0101573 A1 | 8/2002 | Ishibashi et al. | |
| 6,501,210 B1 | 12/2002 | Ueno et al. | 310/331 | 2002/0110074 A1 | 8/2002 | Gibson | |
| 6,507,552 B2 | 1/2003 | Gibson | 369/126 | 2002/0135917 A1 | 9/2002 | Davidson | |
| 6,511,862 B2 | 1/2003 | Hudgens | 438/95 | 2002/0173153 A1 | 11/2002 | Lee et al. | |
| 6,511,867 B2 | 1/2003 | Lowrey | 438/128 | 2003/0007443 A1 | 1/2003 | Nickel | |
| 6,515,898 B2 | 2/2003 | Baumeister et al. | 365/174 | 2003/0020725 A1 | 1/2003 | Trivedi | |
| 6,515,957 B1 | 2/2003 | Newns | 360/55 | 2003/0032290 A1 | 2/2003 | Lee et al. | |
| 6,521,921 B2 | 2/2003 | Lim et al. | 257/255 | 2003/0081527 A1 | 5/2003 | Gibson et al. | |
| 6,522,566 B2 | 2/2003 | Carter | 365/118 | 2003/0081532 A1 | 5/2003 | Gibson | |
| 6,531,373 B2 | 3/2003 | Gill | 438/400 | 2003/0108777 A1 | 6/2003 | Gunsel et al. | |
| 6,534,781 B2 | 3/2003 | Dennison | 257/5 | 2003/0128494 A1 | 7/2003 | Birecki et al. | |
| 6,542,400 B2 | 4/2003 | Chen et al. | 365/151 | 2003/0133324 A1 | 7/2003 | Baumeister et al. | |
| 6,545,907 B1 | 4/2003 | Lowrey et al. | 365/163 | 2003/0185139 A1 | 10/2003 | Ives | |
| 6,563,164 B2 | 5/2003 | Lowrey et al. | 257/314 | 2003/0189200 A1 | 10/2003 | Lee et al. | |
| 6,566,700 B2 | 5/2003 | Xu | 257/296 | 2003/0218960 A1 | 11/2003 | Albrecht et al. | |
| 6,567,293 B1 | 5/2003 | Lowrey et al. | 365/100 | 2004/0027935 A1 | 2/2004 | Cho | |
| 6,567,296 B2 | 5/2003 | Casagrande et al. | 265/105 | 2004/0042351 A1 | 3/2004 | Onoe | |
| 6,570,784 B2 | 5/2003 | Lowrey | 365/163 | 2004/0047275 A1 | 3/2004 | Cherubini et al. | |
| 6,589,714 B2 | 7/2003 | Maimon | 430/313 | 2004/0071021 A1 | 4/2004 | Binnig et al. | |
| 6,593,176 B2 | 7/2003 | Dennison | 438/200 | 2004/0076047 A1 | 4/2004 | Cho | |
| 6,597,639 B1 | 7/2003 | Hamann | 369/14 | 2004/0077123 A1 | 4/2004 | Lee et al. | |
| 6,608,773 B2 | 8/2003 | Lowrey | 365/100 | 2004/0090823 A1 | 5/2004 | Brocklin et al. | |
| 6,611,033 B2 | 8/2003 | Hsu et al. | 257/414 | 2004/0095868 A1 | 5/2004 | Birecki et al. | |
| 6,611,140 B1 | 8/2003 | Bloechl et al. | 324/207 | 2004/0097002 A1 | 5/2004 | Pogge et al. | |
| 6,613,604 B2 | 9/2003 | Maimon | 438/95 | 2004/0105323 A1 | 6/2004 | Giovanni et al. | |
| 6,617,192 B1 | 9/2003 | Lowrey | 438/95 | 2004/0107770 A1 | 6/2004 | Despont et al. | |
| 6,617,569 B2 | 9/2003 | Narita et al. | 250/216 | 2004/0113641 A1 | 6/2004 | Birecki et al. | |
| 6,621,095 B2 | 9/2003 | Chiang | 257/5 | 2004/0114490 A1 | 6/2004 | Antonkaopoulos et al. | |
| 6,628,452 B2 | 9/2003 | Haeberle | 359/298 | 2004/0136277 A1 | 7/2004 | Binnig et al. | |
| 6,646,297 B2 | 11/2003 | Dennison | 257/296 | 2004/0145941 A1 | 7/2004 | Rust | |
| 6,647,766 B2 | 11/2003 | Despont et al. | 73/105 | 2004/0150472 A1 | 8/2004 | Rust et al. | |
| 6,665,258 B1 | 12/2003 | Dietzel et al. | 369/126 | 2004/0168527 A1 | 9/2004 | Nakayama et al. | |

| | | |
|---|---|---|
| 2004/0218507 A1 | 11/2004 | Binnig et al. |
| 2004/0233817 A1 | 11/2004 | Antonkapoulos et al. |
| 2004/0245462 A1 | 12/2004 | Binning |
| 2004/0245547 A1 | 12/2004 | Stipe |
| 2004/0252553 A1 | 12/2004 | Sharma |
| 2004/0252590 A1 | 12/2004 | Sharma |
| 2004/0252621 A1 | 12/2004 | Cho |
| 2004/0257887 A1 | 12/2004 | Binnig et al. |
| 2005/0013230 A1 | 1/2005 | Adelmann |
| 2005/0018588 A1 | 1/2005 | Duerig et al. |
| 2005/0025034 A1 | 2/2005 | Gibson |
| 2005/0029920 A1 | 2/2005 | Birecki et al. |
| 2005/0036428 A1 | 2/2005 | Adelmann |
| 2005/0037560 A1 | 2/2005 | Duerig et al. |
| 2005/0038950 A1 | 2/2005 | Adelmann |
| 2005/0047288 A1 | 3/2005 | Maeda |
| 2005/0047307 A1 | 3/2005 | Frommer et al. |
| 2005/0050258 A1 | 3/2005 | Frommer et al. |
| 2005/0055170 A1 | 3/2005 | Gibson et al. |
| 2005/0066107 A1 | 3/2005 | Bachtold et al. |
| 2005/0082598 A1 | 4/2005 | Liao et al. |
| 2005/0088873 A1 | 4/2005 | Tran et al. |
| 2005/0095389 A1 | 5/2005 | Newns |
| 2005/0099430 A1 | 5/2005 | Nauka |
| 2005/0099895 A1 | 5/2005 | Maeda |
| 2005/0122786 A1 | 6/2005 | Antonakopoulos et al. |
| 2005/0122886 A1 | 6/2005 | Takahashi |
| 2005/0128616 A1 | 6/2005 | Johns et al. |
| 2005/0128927 A1 | 6/2005 | Milligan et al. |
| 2005/0128928 A1 | 6/2005 | Takahashi |
| 2005/0135199 A1 | 6/2005 | Mejia et al. |
| 2005/0135200 A1 | 6/2005 | Mejia et al. |
| 2005/0135203 A1 | 6/2005 | Mejia et al. |
| 2005/0135224 A1 | 6/2005 | Mejia et al. |
| 2005/0139883 A1 | 6/2005 | Sharma |
| 2005/0147017 A1 | 7/2005 | Gibson |
| 2005/0152175 A1 | 7/2005 | Ashton |
| 2005/0156271 A1 | 7/2005 | Lam et al. |
| 2005/0157562 A1 | 7/2005 | Smith et al. |
| 2005/0157575 A1 | 7/2005 | Binnig et al. |
| 2005/0169063 A1 | 8/2005 | Cherubini et al. |
| 2005/0185567 A1 | 8/2005 | Adelmann |
| 2005/0190684 A1 | 9/2005 | Kley |
| 2005/0201255 A1 | 9/2005 | Champion et al. |
| 2005/0201256 A1 | 9/2005 | Champion et al. |
| 2005/0201257 A1 | 9/2005 | Champion et al. |
| 2005/0201258 A1 | 9/2005 | Champion et al. |
| 2005/0207234 A1 | 9/2005 | Baechtold et al. |
| 2005/0226117 A1 | 10/2005 | Champion et al. |
| 2005/0232004 A1 | 10/2005 | Rust et al. |
| 2005/0232061 A1 | 10/2005 | Rust et al. |
| 2005/0233596 A1 | 10/2005 | Chen et al. |
| 2005/0237906 A1 | 10/2005 | Gibson |
| 2005/0243592 A1 | 11/2005 | Rust et al. |
| 2005/0243659 A1 | 11/2005 | Rust et al. |
| 2005/0243660 A1 | 11/2005 | Rust et al. |
| 2005/0247873 A1 | 11/2005 | Hilton |
| 2005/0259366 A1 | 11/2005 | Champion et al. |
| 2005/0259503 A1 | 11/2005 | Hilton |
| 2005/0281075 A1 | 12/2005 | Chen et al. |
| 2005/0281174 A1 | 12/2005 | Gotsmann et al. |
| 2005/0286321 A1 | 12/2005 | Adelmann |
| 2006/0003493 A1 | 1/2006 | Milligan et al. |
| 2006/0006471 A1 | 1/2006 | Rossel et al. |
| 2006/0023606 A1 | 2/2006 | Lutwyche |
| 2006/0023612 A1 | 2/2006 | Hilton et al. |
| 2006/0023613 A1 | 2/2006 | Mejia et al. |
| 2006/0028964 A1 | 2/2006 | Mejia et al. |
| 2006/0028965 A1 | 2/2006 | Fasen et al. |
| 2006/0039250 A1 | 2/2006 | Cherubini et al. |
| 2006/0043288 A1 | 3/2006 | Binnig et al. |
| 2006/0064624 A1 | 3/2006 | Albrecht |
| 2006/0072420 A1 | 4/2006 | Albrecht |
| 2006/0083152 A1 | 4/2006 | Albrecht |
| 2006/0182004 A1 | 8/2006 | Maeda |
| 2006/0187803 A1 | 8/2006 | Baechtold |
| 2006/0211154 A1 | 9/2006 | Buehlman |
| 2006/0219655 A1 | 10/2006 | Cho |
| 2006/0238185 A1 | 10/2006 | Kozicki |
| 2006/0239129 A1 | 10/2006 | Kley |
| 2006/0245312 A1 | 11/2006 | Maeda |
| 2006/0291364 A1 | 12/2006 | Kozicki |
| 2007/0014047 A1 | 1/2007 | Cho |
| 2007/0041233 A1 | 2/2007 | Roelofs |
| 2007/0047427 A1 | 3/2007 | Cherubini |
| 2007/0125961 A1 | 6/2007 | Despont |
| 2007/0152253 A1 | 7/2007 | Lee |
| 2007/0158731 A1 | 7/2007 | Bae |
| 2007/0195682 A1 | 8/2007 | Duerig |
| 2007/0196645 A1 | 8/2007 | Duerig |
| 2007/0210812 A1 | 9/2007 | Yoo |
| 2007/0253314 A1 | 11/2007 | Jones |
| 2007/0254383 A1 | 11/2007 | Buehlmann |
| 2007/0296101 A1 | 12/2007 | DiPietro |
| 2007/0296500 A1 | 12/2007 | Yang |
| 2008/0013437 A1 | 1/2008 | Albrecht |
| 2008/0017609 A1 | 1/2008 | Takahashi |
| 2008/0020489 A1 | 1/2008 | Im |

FOREIGN PATENT DOCUMENTS

| | | | |
|---|---|---|---|
| EP | 0 734 017 B1 | | 9/1996 |
| EP | 0 788 149 A1 | | 6/1997 |
| JP | 3295043 | | 12/1991 |
| JP | 3295044 | | 12/1991 |
| JP | 4159636 | | 6/1992 |
| JP | 9198726 | | 7/1997 |
| WO | WO 96/11472 | | 4/1996 |
| WO | WO 97/05610 | | 2/1997 |
| WO | WO 02/37488 A1 | | 5/2002 |

OTHER PUBLICATIONS

Sumio Hosaka, Hajime Koyanagi and Atsushi Kikukawa, Nanometer Recording on Graphite and Si Substrate Using an Atomic Force Microscope in Air, Japan Journal of Applied Physics, vol. 32 (1993) pp. L464-467, Part 2, No. 3B, Mar. 15, 1993, Central Research Laboratory, Hitachi Limited, Kokubunji, Tokyo 185.

Atsushi Kikukawa, Sumio Hosaka, Yukio Honda[1] and Ryo Imura, Phase-Controlled Scanning Force Microscope, Japanese Journal of Applied Physics, vol. 33 (1994) pp. L1286-L1288, Part 2, No. 9A, Sep. 1, 1994, Advanced Research Laboratory, Hitachi Limited, 1-280 Higashi-koigakubo, Kokubunji-shi, Tokyo 185, Central Research Laboratory, Hitachi Limited, 1-280 Higashi-koigakubo, Kokubunji-shi, Tokyo 185.

William P. King, Daniel A. Fletcher and Y. Sungtaek Ju, Nanometer-Scale Thermal Processing for Advanced Manufacturing (YIP '96), Office of Naval Research Annual Grant Report, First Annual Report: May 1, 1996-Apr. 30, 1997, pp. 1-8.

T. C. Reiley, T.R. Albrecht, D.W. Albrecht, K. Kuroki and M. Aoyagi, A Micro Hard Disk Drive, I.B.M.—Almaden Research Center, I.B.M. Storage System Division, Electrochemical Society Processing, vol. 98-20, pp. 10-18 Apr. 10, 2006.

Seiji Heike, Yasuo Wada and Tomihiro Hashizume, Correlation Between Tip-Apex Shape and Surface Modification by Scanning Tunneling Microscopy, Journal of Applied Physics, vol. 86, No. 8, pp. 4220-4224, Oct. 15, 1999.

Michael Brooks, Hole in One, New Scientist, Mar. 27, 1999, pp. 46-48.

H. Jonathon Mamin, Robert P. Ried, Bruce D. Terris and Daniel Rugar, High-Density Data Storage Based on the Atomic Force Microscope, Proceeding of the IEEE, vol. 87, No. 6, Jun. 1999, pp. 1014-1027.

Steven W. Schlosser, John Linwood Griffin, David F. Nagle and Gregory R. Ganger, Filling the Memory Access Gap: A Case for On-Chip Magnetic Storage, School of Computer Science, Carnegie Mellon University, Nov. 1999.

Steven W. Schlosser, John Linwood Griffin, David F. Nagle and Gregory R. Ganger, Carnegie Mellon University, Designing Computer Systems with MEMS-Based Storage, 9th International Conference on Architectural Support for Programming Languages and Operating Systems, 2000.

S. Hosaka, K. Etoh, A. Kikukawa and H. Koyanagi, Megahertz Silicon Atomic Force Microscopy (AFM) Catilever and High-Speed Readout in AFM-Based Recording, Journal of Vacuum Science Technology, vol. 18, No. 1, Jan./Feb. 2000, pp. 94-99.

Robert P. Ried, Air-Bearing Sliders and Plane-Plane-Concave Tips for Atomic Force Microscope Cantilevers, Journal of Microelectromechanical Systems, vol. 9, No. 1, Mar. 2000, pp. 52-57.

L. Richard Carley, Gregory R. Ganger and David F. Nagle, Mems-Based Integrated-Circuit Mass-Storage Systems, Communications of the ACM, vol. 43, No. 11, Nov. 2000, pp. 73-80.

P. Vettiger, M. Despont, U. Drechsler, U. Durig, W. Haberle, M.I. Lutwyche, H.E. Rothuizen, R. Stutz, R. Widmer and G.K. Binnig, The "Millipede"—More than one thousand tips for future AFM data storage, I.B.M. J. Res. Develop., vol. 44, No. 3, May 2000, pp. 323-340.

R.B. Zmood, L. Qin, D.K. Sood, T. Vinay and D. Meyrick, School of Electrical and Computer System Engineering, Royal Melbourne Institute of Technology, Melbourne, Victoria 3000, Australia, Magnetic MEMS Used in Smart Structures Which Exploit Magnetic Materials Properties, Smart Structures and Devices, Proceeding of the SPIE, vol. 4235, 2001, pp. 173-187.

Michael Gross, Small is Great!, New Scientist, Jul. 14, 2001, pp. 1-4.

G. Cherubini, T. Antonakopoulos, P. Bachtold, G.K. Binnig, M. Despont, U. Drechsler, A. Dholakia, U. Durig, E. Eleftheriou, B. Gotsmann, W. Haberle, M.A. Lantz, T. Loeliger, H. Pozidis, H.E. Rothuizen, R. Stutz and P. Vettiger, I.B.M. Research, Zurich Research Laboratory, The Millipede, a Very Dense, Highly Parallel Scanning-Probe Data-Storage System, ESSCIRC 2002, pp. 121-125.

E. Eleftheriou, G. Cherubini, H. Pozidis, H.E. Rothuizen and P. Vettiger, Millipede—a MEMS-Based Scanning-Probe Data-Storage System, APMRC 2002, pp. 1-8.

Satoshi Kawamura, Electronics Device Division, Hitachi Maxell, Limited, Coil on Chip RFID System by Super EF2 Technology, Nippon Oyo Jiki Gakkai Kenkyukai Shiryo, vol. 123, pp. 21-25, 2002.

Molecular Chip Patent, Poptronics, vol. 3, No. 5, May 2002, pp. 11-12.

Kenneth J. Korane, A King-Size Future for Nanosize Machines, Machine Design, vol. 74, No. 18, Sep. 19, 2002, pp. 88-94.

Peter Vettiger and Gerd Binnig, The Nanodrive Project: Inventing a Nanotechnology Device for Mass Production and Consumer Use is Trickier than it Sounds, Scientific American, vol. 288, No. 1, 2002, pp. 47-53.

Mustafa Uysal, Arif Merchant, Guillermo A. Alvarez, Hewlett Packard Laboratories, Using MEMS-Based Storage in Disk Arrays, Proceedings of Fast '03: 2nd USENIX Conference on File and Storage Technologies, USENIX Association, pp. 89-101, 2003.

Kiyoshi, T. et al., "Switching and memory phenomenon in Langmuir-Blodgett film using a scanning tunneling microscope," Canon, Inc., IEIC Technical Report (1994), vol. 93, No. 524 (OME93 54-59), pp. 7012, Fig. 6, Ref. 15.

Kiyoshi, T. et al., Application and Progess in the Scanning Probe Microscopy, High Density Information Storage Using Langmuir-Blodgett Film and Atomic Force Microscopy, Canon, Inc., Journal of the Surface Science Society of Japan (1997), vol. 18, No. 4, pp. 213-218, Fig. 7, Ref. 14.

Kado, H. and Tohda, T., "Nanometer-scale recording on chalcogenic films with an atomic force microscope," Appl. Phys. Lett., vol. 66, No. 22, May 29, 1995, pp. 2961-2962.

Yano, K. et al., "Nanometer scale conductance change in a Langmuir-Blodgett film with the atomic force microscope," Appl. Phys. Lett., vol. 68, vol. 2, Jan. 8, 1996, pp. 188-190.

Yano, K. and Ikeda, T., "Stable bit formulation in polyimide Langmui-Blodgett film using an atomic force microscope," Appl. Phys. Lett., vol. 80, vol. 6, Feb. 11, 2002, pp. 1067-1069.

Barrett, R.C. and Quate, C.F.., "Large-scale charge storage by scanning capacitance microscopy," Ultramicroscopy 42-44 (1992) pp. 262-267.

Gardner, E., "AFM Fabricates a Tiny Transistor," Science, vol. 266, Oct. 28, 1994, p. 543.

Hagan, H.P., et al., "Temporal behaviour of nanofeatures on Au," Ultramicroscopy, 42-44 (1992), pp. 587-593.

Majumdar, A., et al., "Nanometer-scale lithography using the atomic force microscope," Appl. Phys. Lett., vol. 61, No. 19, Nov. 9, 1992, pp. 2293-2295.

Mamin, H.J. and Ruger, D., "Thermomechanical writing with an atomic force microscope tip," App. Phys. Lett., vol. 61, No. 8, Aug. 24, 1992, pp. 1003-1005.

Mamin, H.J. et al., "High Density data storage using proximal probe techniques," The IBM Journal of Research and Development, vol. 39, No. 6, Nov. 1995, pp. 681-699.

Manalis, S. et al., "Submicron studies of recording media using thin-film magnetic scanning probes," Applied Physics Letters, vol. 66, No. 19, May 8, 1995, pp. 2585-2587.

Terris, B.D. et al., "Atomic force microscope-base data storage: track servo and wear study," Applied Physics A vol. 66, pp. S809-S813 (1998), (IBM Almaden Research Center, presented STM 97).

Uesugi, K. and Yao, T., "Nanometer-scale fabrication on graphite surfaces by scanning tunneling microscopy," Ultramicroscopy, 42-44 (1992), pp. 1443-1445.

PCT Written Opinion mailed Dec. 18, 2000, International Application No. PCT/US99/30326, filed Dec. 20, 1999.

T.C. Shen et al., Ion irradiation effects on graphite with the scanning tunneling microscope; J.Vac.Sci. Technol. B9(2), Mar./Apr. 1991; pp. 1376-1379.

U. Staufer et al., Tailoring nanostructures with a scanning tunneling microscope; J. Vac.Sci. Technol. B9(2), Mar./Apr. 1991; pp. 1389-1393.

H.J. Mamin, Gold deposition from a scanning tunneling microscope tip; et al., J.Vac.Sci. Technol. B9(2), Mar./Apr. 1991, pp. 1398-1402.

J.A. Dagata, et al., Pattern generation on semiconductor surfaces by a scanning tunneling microscope operating in air, J. Vac. Sci. Technol. B9(2), Mar./Apr. 1991, pp. 1384-1388.

T.R. Albrecht, et al., Nanometer-scale hole formation on graphite using a scanning tunneling microscope, Appl. Phys. Lett., vol. 55, No. 17, Oct. 23, 1989, pp. 1727-1729.

M. Aono, Has Japan Begun to Move Toward Atomic Level Material Processing?, Science, vol. 258, Oct. 23, 1992.

Rosei, Federico, "Nanostructured surfaces: Challenges and frontiers in nanotechnology," 2004 Journal of Physics: Condensed Matter. Apr. 16, 2004, pp. 1373-1436.

Lapshin, Rostislav V., "Digital data readback for a probe storage device," Review of Scientific Instruments, vol. 71, Issue 12, Dec. 2000, pp. 4607-4610.

Serry, F.M., et al., "Electric Force Microscopy, Surface Potential Imaging, and Surface Electric Modification," Veeco Instruments, Inc., 2004, pp. 1-8.

Honda, Koichiro, et al., "Visualization of electrons and holes localized in the thin gate film of metal-oxide-nitride-oxide-semiconductor type Flash memory by scanning nonlinear dielectric microscopy," Nanotechnology, Institute of Physics Publishing, 2005, pp. 590-593.

Kalinin, et al., "A Decade of Piezoresponse Force Microscopy: Progress, Challenges and Opportunities," IEEE Tuff, pp. 1-41 vol. 53, No. 12, Dec. 2006.

Kalinin, et al., "Electric scanning probe imaging and modification of ferroelectric surfaces," pp. 0-42, Jan. 2003 arxiv.org/pdf/cond-mat/0301535.pdf.

International Search Report, in connection with Application No. PCT/US2007/67800 dated Feb. 12, 2008, 8 pages.

International Search Report, in connection with Application No. PCT/US2007/67805 dated Feb. 25, 2008, 8 pages.

* cited by examiner

DEVICES AND METHODS OF DETECTING MOVEMENT BETWEEN MEDIA AND PROBE TIP IN A PROBE DATA STORAGE SYSTEM

This application is a Continuation of U.S. application Ser. No. 09/465,592 entitled "Molecular Memory Medium and Molecular Memory Integrated Circuit," by Culver et el. filed Dec. 17, 1999 now U.S. Pat. No. 7,260,051 which claims the benefit of United States Provisional Application entitled "Molecular Memory Medium and Molecular Memory Integrated Circuit," Culver et al, filed Dec. 18, 1998, and having a U.S. Application No. of 60/112,787.

BACKGROUND OF THE INVENTION

1. Field of the Invention

This invention relates to memory reading and writing apparatus. The invention is more particularly related to memory reading and writing apparatus that utilize operations on single atoms or molecules, and groups of atoms or molecules for performing memory reading and writing.

2. References

This application incorporates by reference, in their entirety, the following documents:
1) U.S. Pat. No. 5,453,970, (Rust et al.)
2) AFM Fabricates a Tiny Transistor, Science Vol 266, 28 Oct. 1994, p. 543
3) Gold deposition from a scanning tunneling microscope tip, H. J. Mamin, S. Chiang, H. Birk, P. H. Guethner, and D. Rugar, J. Vac. Sci. Tech. B9 (2) March/April 91 p. 1398
4) Temporal behaviors of nanofeatures on Au, H. P. Hagan, P. A. Campbell, K. W. Smith, R. J. Turner and D. G. Walmsley, Ultrmicroscopy 42-44 1992 p. 587
5) Nanometer-scale hole formation on graphite using a scanning tunneling microscopes. T. R. Albrecht, M. M. Dovek, D. Kirk, C. A. Lang, C. F. Quate, D. P. E. Smith, Appl. Phys. Lett. 55 (17) 23 Oct. 1989 p. 1727
6) Nanometer-scale fabrication on graphite surfaces by scanning tunneling microscopy, K. Uesugi and T. Yao, Ultramicroscopy, 42-44 1992 p. 1443
7) Ion irradiation effects on graphite with the scanning tunneling microscope, T. C. Shen, R. T. Brockenbrough, J. S. Huacek, J. R. Tucker, and J. W. Lyding, J. Vac. Sci. Tech. B9 (2) March/April 1991 p. 1376
8) Tailoring nanostructures with a scanning tunneling microscope, U. Staufer, L. Scandella, H. Rudin, H. J. Guntherodt, and N. Garcia, J. Vac. Sci. Rech. B9 (2) March/April 1991 p. 1389
9) Has Japan Begun to Move Toward Atomic Level Processing?, M. Aono, Science, Vol. 258, 23 Oct. 1992, p. 586
10) Nanometer-scale lithography using the atomic force microscope, A Majumdar, P. I. Oden, J. P. Carrejo, L.A. Nagahara, J. J. Graham and J. Alexander, Appl. Phys. Lett. 61 (19) 9 Nov. 1992 p. 2293
11) Thermomechanical writing with an atomic force microscope tip, H. J. Mamin and D. Ruger, App. Phys. Leff. Vol. 61 No. 8, 24 Aug. 1992 p. 1001
12) Large-scale charge storage by scanning capacitance microscopy, R. C. Barrett and C. F. Quate, Ultramicroscopy 42-44 (1992) p. 262
13) High Density data storage using proximal probe techniques, The IBM Journal of Research and Development, Volume 39, #6, November 1995.
14) Disk/Trends, private conversation with Jim Porter, August, 1996
15) Submicron Studies of Recording Media Using Thin-Film Magnetic Scanning Probes, advance copy to appear in Applied Physics letters, 4/95
16) Atomic Force Microscope-base Data Storage: Track Servo and Wear Study, IBM Almaden Research Center, presented STM 97.
17) U.S. Pat. Nos. 5,216,631, and 5,307,311 (Silwa, Jr.)

Discussion of the Background

Current technology for high density solid state memory employ various means for storing and reading data.

A summary of previous patent applications in this area are listed in U.S. Pat. No. 5,453,970, entitled "Molecular Memory Medium and Molecular Memory Disk Drive for Storing Information Using a Tunneling Probe" by Thomas F. Rust and Joanne P. Culver.

Current technologies using movement of atoms and molecules (molecular scale technologies) are not practical because my problems exist regarding the efficient reading, writing (including maintaining a high density of storage) on media materials. Further problems with current devices include structures that are difficult or impossible to build using existing tools.

SUMMARY OF THE INVENTION

Accordingly, the present invention provides a device capable of reading and/or writing on a substrate by affecting (via movement of molecules/atoms, and/or modification of electrical properties (including any of charges, resistance, capacitance, inductance, and magnetic properties) stored on the media.

The present invention includes a media prepared for storage of data bits in a high density via movement of molecules/atoms on the media and/or the modification of electrical properties on the media.

The present invention, in it's various embodiments, has many distinguishing features, for example:
1) The present invention utilizes multiple tips on each moving platform surface, where there are multiple surfaces are each movable independently.
2) The present invention memory operation does not rely on tunneling mode only.
3) The present invention does not rely on sharing Z actuators.
4) The present invention overcomes problems associated with the fact that the media surface is very difficult to form atomically flat (<1 Angstrom) over a usefully large area, and that tunneling current is useful only under approximately 10 Angstrom.
5) The present invention does not rely on multiple resonating columns operating in perfect synchrony. A problem associated with synchrony of resonating columns is that small differences in size cause a column to resonate at a slightly different frequency. The phase is also very sensitive to sub-harmonic distortion. Even a slight change would mean a large phase difference would quickly appear between columns. Manufacturing difficulties arise in manufacturing columns exactly identical.
6) Most molecular media have occasional large particle defects. These defects, when swinging past the tips would destroy the tips. Either the tip or the media is in constant lateral motion, making such defects difficult to avoid. Provided herein is a method and device to overcome these problems.

7) The present invention utilizes platforms of very low mass. As a result, the present invention provides fast access speed.

A molecular memory integrated circuit (IC) is a device for storing very large quantities of information, and is also uniquely capable of providing very high data rates of this information to and from the IC. The molecular memory IC may be manufactured at a cost comparable to current ICs, yet at a fraction of the cost required to achieve the same amount of storage. The molecular memory IC may substitute for many devices which currently are used as a storage medium. The molecular memory IC may be used to replace disk drives in computer systems, the magnetic tape systems in video and audio tape recorders, photographic film used for information storage, and even EEPROM (electrically erasable read only memory), VRAM (video random access memory) and DRAM (dynamic random access memory) where access time is not a high priority. Data transfer rates will depend on the architecture used in the IC, and may involve trade offs between overall memory capacity versus maximum latency. A typical molecular memory IC of 1.6 $cm^2$ will store over 860 Megabytes of data. The molecular IC may replace magnetic tape in camcorders, digital and analog audio tape, video tape, and CD-ROM players. In one embodiment, the present invention has been fabricated using a laser ablated diamond media to produce a Molecular Array Read/write Engine (MARE) IC with the following specifications:

Given:

Domain spacing 0.030 microns.

Compaction function ratio 1.15 using honeycomb data structure

Space utilization 22:1 (ratio of total area of IC to usable media)

Then:

Number of bits per square centimeter=111 billion.

Maximum latency to access any bit is 500 microsec.

Total capacity of 1.2 square centimeter IC is 860 Megabyte.

45 Platforms with 12 read/write heads per platform—total of 540 heads

Scan rate 90 KHz per bit/tip.

Platform thickness 4 micron, platform and actuator cell size 1900 u×1400 u

6 Mbyte/sec data transfer rate

In accordance with the present invention, there is provided a memory apparatus comprising an input section which comprises one or more fine tip portions, a control means for controlling the input section, whereby high density recording is achieved, an output section, comprising a similar or identical fine tips, and fixed or moving substrate surface or surfaces, comprising sets of molecules, atoms, electrons, or the void left by sets of molecules, atoms, or electrons the position of each set or void or orientation of molecules, atoms, or electrons defining the states of memory regions.

In an alternate embodiment, there is provided a memory apparatus comprising an input section which comprises a source of fine electromagnetic radiation and/or a fine tip, a control means for controlling the input section, whereby high density recording is achieved, an output section, comprising a fine tip and/or electromagnetic radiation sensitive receptor, and fixed or moving substrate surface or surfaces, comprising sets of molecules, atoms, or electrons, or the void left by sets of molecules, atoms, or electrons the position of each set or void of molecules, atoms, or electrons defining the states of memory regions. Magneto-optic effects are also contemplated.

In an alternate embodiment, there is provided a memory apparatus comprising an input section which comprises a fine tip with a ferromagnetic coating, a control means for controlling the input section, whereby high density recording is achieved, an output section, comprising a fine tip with a sensitive magnetic receptor, and fixed or moving substrate surface or surfaces, comprising sets of magnetic domains the position of each set or void of domains defining the states of memory regions.

Generally, the recording of information is performed by the addition, removal or repositioning of atoms, molecules, electrons or magnetic domains from the region either immediately above, on, or immediately below the surface of the molecular media. The removal or repositioning force is either a mechanical force, chemical reaction (as in chemical bond interactions, catalyst, etc.), electrostatic force, electromagnetic radiation, DC or AC magnetic field, electric current, or thermal force. A combination of these above forces come into play to perform writing on the molecular media. The reading of information is performed by one of the methods of one of or a combination of:

a) analyzing patterns of current (field emissive, tunneling, or purely resistive) between a fine tip and the surface of the molecular media, b) analyzing patterns of electromagnetic radiation through a receptor received from the surface of the molecular media in response to a stimulus, c) analyzing patterns of shifting phase in a vibrating tip, d) analyzing patterns of changing amplitude of a vibrating tip, e) analyzing patterns of current and/or voltage between a fine tip and the surface of the molecular media which vary over time during the reading of each bit, in conjunction with topological information concerning the media surface computed dynamically, to provide very high speed access to the information stored.

One of the techniques for re-write capability involves re-planing of the memory surface, to effect more than a write-once capability.

The medium of a molecular memory surface can be any one of a large class of materials. The present invention describes a number of different materials, and several different techniques for reading and writing the materials. The present invention allows for a large class of materials to be used as the memory surface by virtue of the ability of the read/write head to fly above a relatively uneven surface at very high speeds, and the large range of forces with which to read and write information.

DETAILED DESCRIPTION OF THE INVENTION

Figure 1:
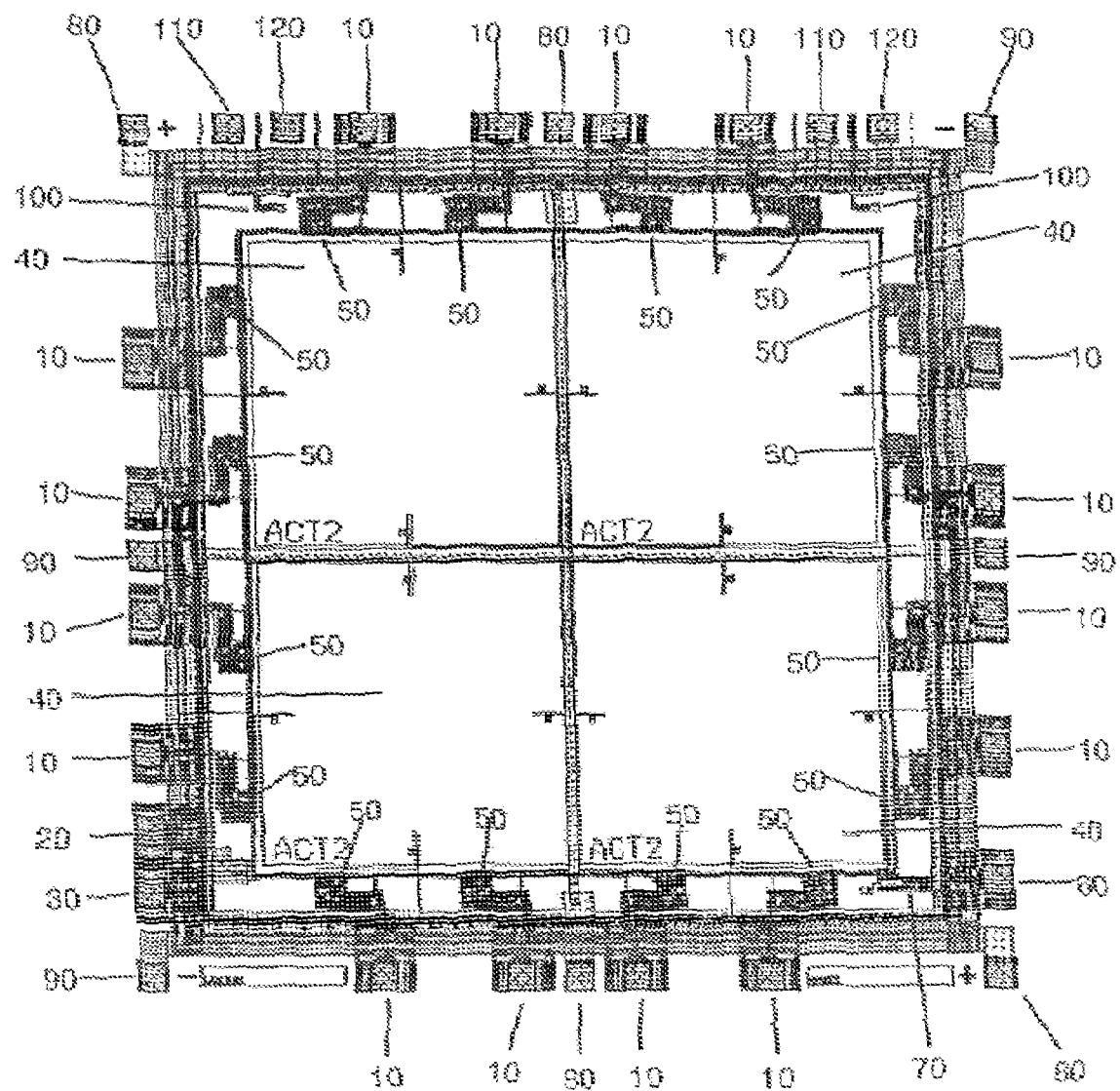
FIG. 1 shows a molecular memory integrated circuit apparatus according to the present invention utilizing four moving platforms each containing 8 fine tips and a single memory surface (positioned over the IC with the media facing down—not shown)

According to the present invention, a molecular memory integrated circuit apparatus comprises one or more stacked systems each comprising a memory element comprising one or more media surfaces, optional servo tracking marks embedded in the media surface, a positioning mechanism for positioning the media surfaces, a control means for controlling the positioning mechanism, an input/output section which comprises at least one head having a fine tip portion faced towards the memory media surface, a positioning mechanism for positioning the head or heads above the memory media surface or surfaces, a control means for controlling the positioning mechanism, a write section which converts an analog or digital signal to write information, a sense section which converts the input section to analog or digital information, an optional sense section which converts position information to analog or digital information, an optional cleaning section which removes unwanted particles, an optional sharpening area where unwanted particles are removed and/or added to the tip, and a fine tip alignment section.

The control section comprises means for bringing the tip portion of the head close to the surface of the memory media to thereby effect positioning, means for allowing the tip portion to scan the memory, means for controlling the distance between the tip and the memory media during scanning, and means for positioning the tip at, above, or below the surface of the memory media. The head or heads have a fine tip portion attached to an oscillating mechanism operating at or near a resonant peak such that when the tip is operated near the memory surface, the phase of the oscillation shifts from its free space value. The amount of this phase shift increases as the distance between the memory and the tip at its closest position to the media decreases. In addition, the state of data bits under the tip may shift the phase of the oscillation above or below the free space value.

Description of the Tunneling Mode Alternate Embodiments

According to the present invention, a molecular memory integrated circuit apparatus comprises a memory element comprising one or more media surfaces, an input/output section which comprises at least one head having a fine tip portion faced towards the memory media surface, a positioning mechanism for positioning the head or heads above the memory media surface, a control means for controlling the positioning mechanism, a sense section which converts the input section to analog or digital information, an optional cleaning section which removes unwanted particles, an optional sharpening area where unwanted particles are removed and/or added to the tip, and a fine tip alignment section.

The control section comprises means for bringing the tip portion of the head close to the surface of the memory media to thereby effect positioning, means for allowing the tip portion to scan the memory, means for controlling the distance between the tip and the memory media during scanning, and means for positioning the tip at, above, or below the surface of the memory media. The head or heads have a fine tip portion such that a current flows between the tip portion and the memory surface. The amount of this current indicates the distance between the memory and the tip.

Description of Force Mode Alternate Embodiments

According to the present invention, a molecular memory integrated circuit apparatus comprises a memory element comprising one or more media surfaces, an input/output section which comprises at least one head having a fine tip portion faced towards the memory media surface, a positioning mechanism for positioning the head or heads above the memory media surface, a control means for controlling the positioning mechanism, a sense section which converts the input section to analog or digital information, an optional cleaning section which removes unwanted particles, an optional sharpening area where unwanted particles are removed and/or added to the tip, and a fine tip alignment section.

The control section comprises means for bringing the tip portion of the head close to the surface of the memory media to thereby effect positioning, means for allowing the tip portion to scan the memory, means for controlling the distance between the tip and the memory media during scanning, and means for positioning the tip at, above, or below the surface of the memory media. The head or heads have a fine tip portion which is attached to a cantilever. This cantilever may be vibrating above or such that the tip slightly touches the surface, or the tip may be placed directly on the media surface. The cantilever is connected to a Z axis drive mechanism which is electrostatic and capacitive, or may have a separate capacitive sensor for the Z axis. In the vibrating mode, the change in phase of the resonance of the vibrating cantilever indicates the tip is touching or near the memory surface. In the dragging mode, the deflection of the cantilever by the surface changes the capacitance of the drive electrodes, indicating position.

It is important to note here that individual parts of any of the embodiments described herein may be interchanged to produce a molecular memory device according to the present invention.

Figure 23:
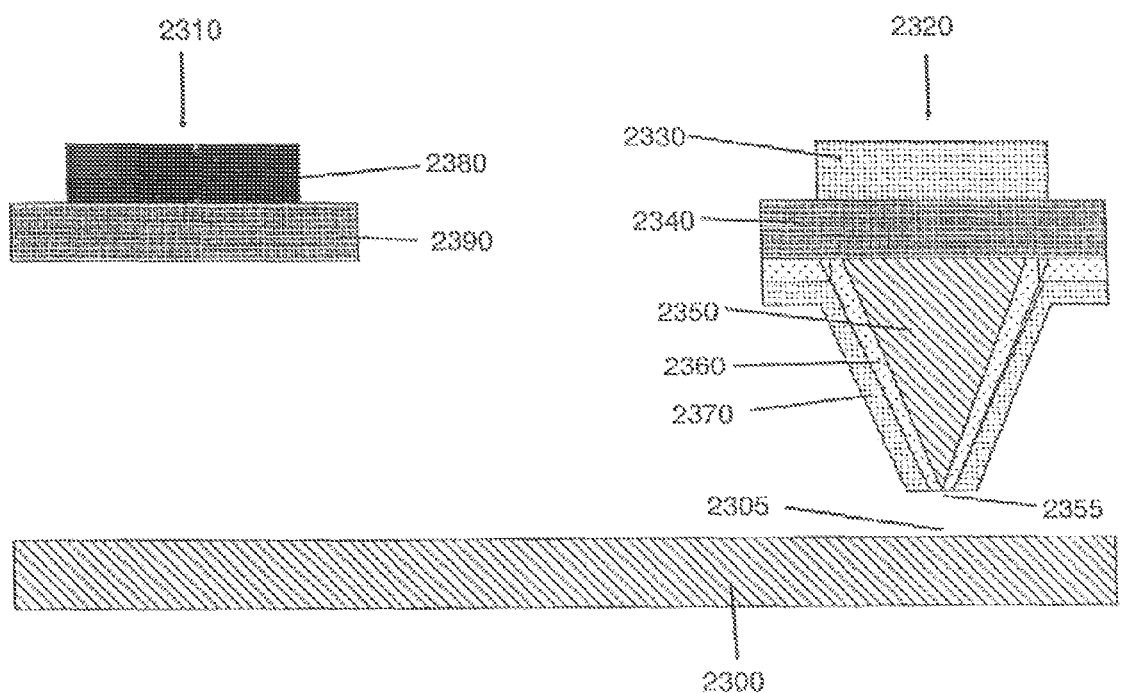
FIG. 23 is an enlarged view of an electro-magnetic radiation emitter and electromagnetic radiation receptor with media.

Description of an Electromagnetic Radiation Source/Receptor Alternate Embodiment FIG. 23 shows a cross section of the head portion of this embodiment. According to the present invention, a molecular memory integrated circuit apparatus comprises a memory element comprising one or more media surfaces 2300, an input/output section which comprises at least one fine electromagnetic radiation generating source 2310 and/or electromagnetic radiation receptor 2320 (hereafter referred to as head) faced towards the memory media surface, a positioning mechanism for positioning the head above the memory media surface, a control means for controlling the positioning mechanism, a sense section which converts the input section to analog or digital information, a cleaning section which removes unwanted particles, a sharpening area where unwanted particles are removed and/or added to the tip, and a fine tip alignment section. The electromagnetic radiation sources and receptors in this diagram may be reversed.

The control section comprises means for bringing the head close to the surface of the memory media to thereby effect positioning, means for allowing the head to scan the memory, means for controlling the distance between the head and the memory media during scanning, and means for positioning the head above the surface of the memory media.

Electromagnetic Radiation Source as Fine Tip

In one version, the electromagnetic radiation sources 2320 consists of a source such as a light emitting diode or LASER 2330 which may pass through a polarizing film 2340, then is piped through the waveguide structure consisting of materials 2350, 2360 and optionally 2370. The waveguide focuses the electromagnetic radiation to a fine tip portion 2355 such that a narrow beam emanates from the tip portion, impinges on the memory element 2305, and a modulated version of the electromagnetic radiation, the return electromagnetic radiation, emanates from the memory element. Some versions of the memory media modifies the electromagnetic radiation by altering the polarization of the electromagnetic radiation, such as with magneto-optic materials. The return electromagnetic radiation may again pass through a filtering polarization film 2390 and is then sensed by an electromagnetic radiation receptor such as a photodiode 2380. In some versions one or more of the materials 2350,2360,2370, may be conductive and the tip used in a tunneling mode for sensing, and/or the tip used to modify the memory element using any of the memory modification techniques which use such a tip. The use of the electromagnetic radiation may then be used as a sensor to read the media.

Electromagnetic Radiation Receptor as Fine Tip

In another version, the electromagnetic radiation source 2310 consists of a source such as a light emitting diode or LASER 2380 which may pass through a polarizing film 2390, and emanates as a broad beam. The beam impinges on the memory element 2305, and a modulated version of the electromagnetic radiation, the return electromagnetic radiation, emanates from the memory element. Some versions of the memory media modifies the electromagnetic radiation by altering the polarization of the electromagnetic radiation, such as with magneto-optic materials. The return electromagnetic radiation is piped through the waveguide structure consisting of materials 2350, 2360 and optionally 2370. The wave-guide directs the electromagnetic radiation through an optional filtering polarization film 2340 and is then sensed by an electromagnetic radiation receptor such as a photodiode 2330. In some versions one or more of the materials 2350, 2360,2370, may be conductive and the tip used in a tunneling mode for sensing, and/or the tip used to modify the memory element using any of the memory modification techniques which use such a tip. The use of the electromagnetic radiation may then be used as a sensor to read the media.

Figure 24:
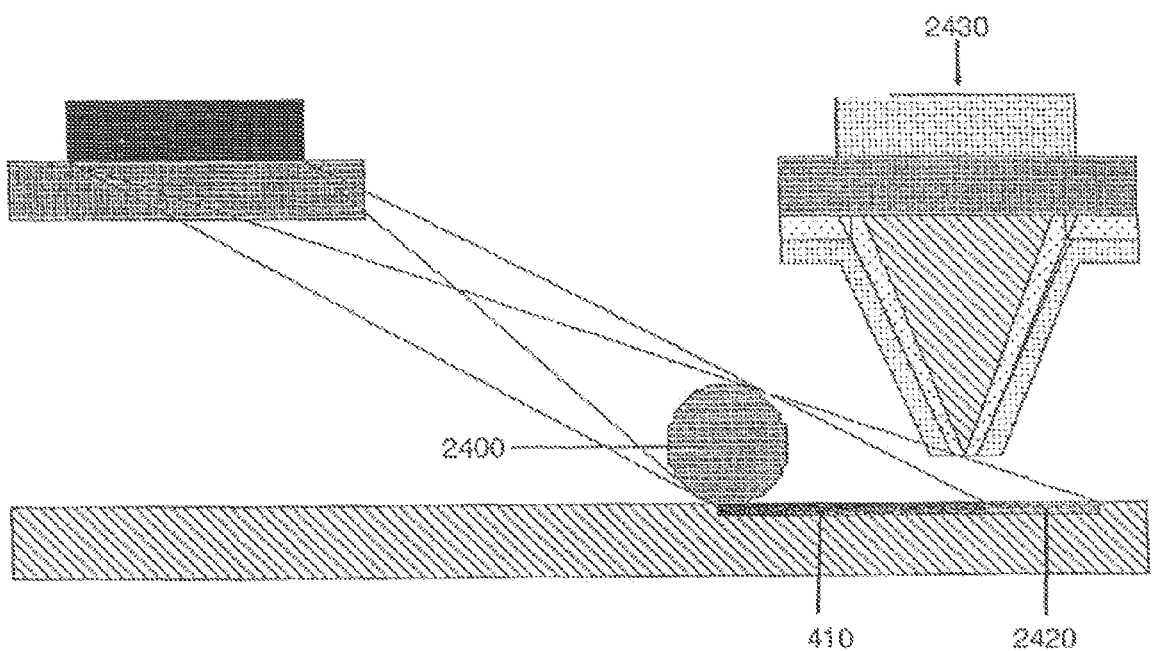
FIG. 24 is an enlarged view of an electro-magnetic radiation emitter and electromagnetic radiation receptor with media and a particle, showing shadow paths.

This version also has an additional advantage in the sensing of large particles, as in FIG. 24. A large particle 2400 casts a complete shadow area in region 2410, and a penumbra in region 2420. The shape of these will vary due to quantum effects of the emanated photons. As the media moves to the right relative to the head, the tip assembly 2430 senses a strong decrease in light, indicating the presence of an obstruction or particle in the path of the beam. The control system instructs the head assembly to lift, so that the obstruction passes under the head assembly, rather than striking it.

Memory Techniques

In the following descriptions, first the different techniques for reading and writing the memory surface will be discussed, followed by descriptions of apparatus for a molecular memory integrated circuit.

Detailed Description Charge Storage Read/Write Memory System

The following description is for one tip/head. Typically, all platforms and tip/heads are operated simultaneously, with data being multiplexed by time division multiplexing to/from A/Ds and D/As through transmission gate muxes. Alternately, one row of platforms with all tips/heads may be operated simultaneously. Alternately, only one tip/head per platform may be operated simultaneously.

In addition, when power is first applied to the system, a calibration sequence is entered (see calibration).

Note: The X and Y actuators operate in pairs. Normally, only one of the pairs receives an active control signal at any time. For example, to move to the extreme left, the left actuator receives a signal to move to the maximum position (typically 50 u), and the right actuator is left off.

Typical READ Operation:

A Digital Signal Processor takes data of where scan sector/track (X,Y coordinates) is to a start position, and loads parameters which initiate a ramp to the desired coordinates. Normally, this will be to a position near a "sector" mark on the X axis, with Y position being a desired "track". The media has a series of marks which consist of trenches or raised areas, typically 1 u wide, which do not contain any data, but are used to identify the beginning of blocks of data. In addition, in systems which have moving media, control systems will move the media to a position, normally consisting of one of 9 positions, +/center/− of X and Y.

Once the start position is reached, tip/heads begin oscillating at slightly off resonance and start moving towards media. The oscillations of the tip/heads, in one embodiment, are produced via a thermal heater supplied with current at resonance frequency. The thermal heater is embedded in a cantilever arm attached to the head tip and causes the tip to vibrate. For example, referring to FIG. 47, a cantilever arm in view A is shown constructed of an Oxide and Aluminum conductor (other conductor or insulative materials may also be utilized). A heating element 4751 is attached on top of the Oxide layer (other positions and attachments of the heating element are also suitable). The Aluminum is heated via an electrical current applied to the heating element at an approximate resonant frequency of the cantilever arm. The thermal expansion and contraction of the Aluminum conductor cause the cantilever and tip to vibrate at that resonant frequency.

Other materials may be substituted for the Al. In one embodiment, Ti is used, other substitutes include PolySi, NiCr or other hi-r materials.

A feedback loop of the tip/head will look for phase shifts in the signal coming back from the piezoresistors sensor on the tip/head cantilever, indicating proximity to the media surface. In one embodiment, this feedback signal is generated by changes in the resistance of single crystal (or poly-silicon) doped silicon due to stresses in the film (for example, 4750 of FIG. 47, which detects both phase changes of a vibrating cantilever/head, and position of the cantilever based on stresses placed on the piezoresistors).

3) As soon as all tip/heads on a platform have engaged the media, a scan can begin. A DSP optimized control signal, similar to a ramp (the DSP functions to produce a ramp voltage to move the actuators to a new position as opposed to applying the voltage all at once, thereby preventing overshoot of the actuator) is applied to the X actuators. The data returning from each of the tip/heads is manifested in a phase shift from the nominal (or near free space) drive frequency of the Z actuator. In addition, there will be a phase shift due to proximity of the tip to the media surface which is based on the gap at the shortest distance the tip travels towards the media. And in addition to that phase shift the magnitude of the phase shift due to the data will be based on the tip potential and the charge potential of the domain under the tip. These two phase shifts will be used for various purposes. First, a phase shift due to the media surface is used to position the heads relative to the surface initially. The second phase shift is used to acquire data.

Figure 47:
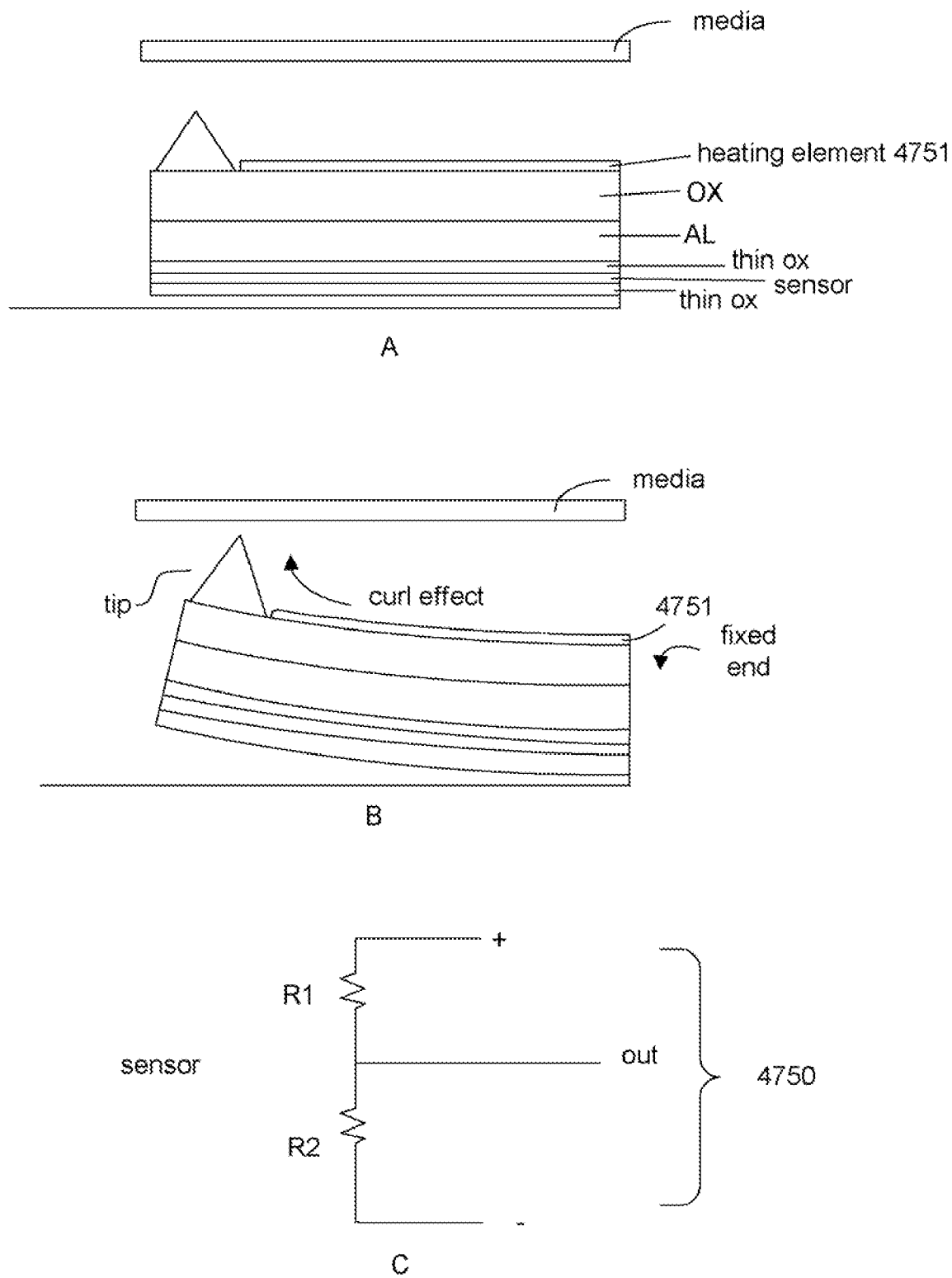
FIG. 47 is an example structure of thermally activated cantilever having an embedded piezo electric sensor for detecting an amount of movement of the cantilever.

As shown in FIG. 47, in one embodiment, positioning of the heads via a cantilever is shown. In view A, the cantilever is in an uncurled position. An amount of current is sent through a heating layer (comprising a resistor, for example), heating the Ox and Al layers. The Aluminum layer has a higher coefficient of expansion than the Oxide layer, which is also relatively less affected by the heat generated via the current. The Aluminum and Oxide expand at different rates, causing a curl effect of the cantilever assembly, as seen in view B. A sensor layer embedded in the cantilever for detecting how far the cantilever has moved. In one embodiment, the sensor comprises a set of piezoresistors 4750, one piezoresistor being placed at a position in the cantilever such that it is bent during the curling of the cantilever more than a second piezoresistor. Each piezoresistor also has a resistance change due to temperature change. The bridge formed by the two piezo resistors provides a means to cancel out the effect of the changing heating on the piezoresistors (both resistors are equally affected by the temperature change). However, since one of the piezoresistors will be affected more strongly by the change in film stresses due to curling, the result will be a net change in the potential across the bridge, but only due to the stress, not the temperature change.

At the beginning of the scan the cantilever is put in a mode to sense the media data. A guide mark (servo line) made out of a physical trench, typically 1 u wide, which marks the beginning of a track. The interface will sense this as the phase from the piezo electric position sensor will shift towards the free space value. When it shifts back (the sensor is past the trench), the track read will begin (the cantilever changes modes from sensing the surface to sensing the data).

In one embodiment, there will be an initial set of charge domains which, encoded in some form of NRZ, which will encode the track (or Y) position. Once this is read and decoded it will be compared with the desired position. If it is incorrect, the difference information will be used to reposition the platform for a retry. Once the correct track is in scan progress, data can be decoded from the stream of phase shift information.

A fine track position mechanism will be in effect to keep the platform positioned on tracks.

In one embodiment, the tracks for data are optimally laid out such that sequentially positioned (in Y) track data is 90 degrees phase shifted from the previous track. This provides for tight packing of the data. In addition, the phase of the clock embedded in the NRZ encoded data will be flipped 180 degrees after every pair of tracks. This means that the track immediately adjacent to any track will have phases 180 degrees apart. In the sampled data from the cantilevers, should the tip wander off track, data will begin to appear from the adjacent track. The phase of this data, relative to the current track, will indicate which side of the track the tip is wandering in, so that an opposing control signal can be supplied to move the tip back on track.

A Z positioning mechanism will use the average phase shift and the desired average phase shift and move the tip/head up or down to maintain a constant distance of the minimum tip gap point during oscillations while scanning across the surface. Although a resonant scheme is slower than dragging the tip in contact with the surface, the resonant scheme allows for a completely non-contact form of media interaction—thus minimizing tip wear.

Figure 44:
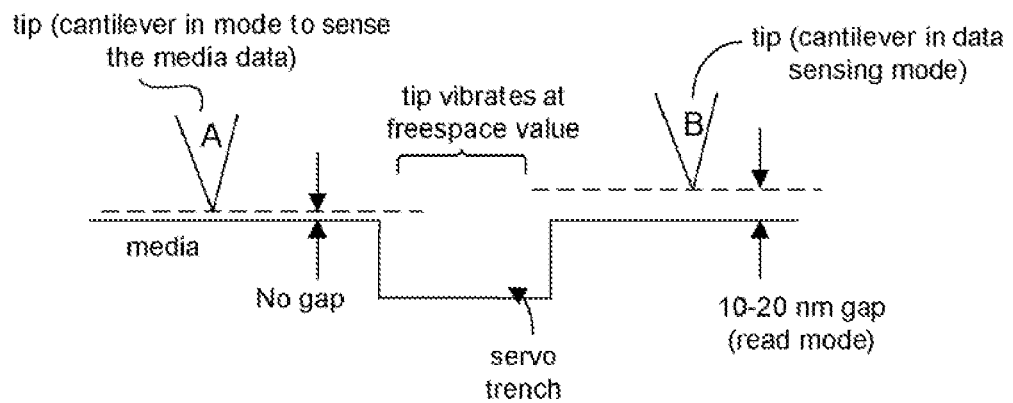
FIG. 44 is an example of a fine tip acquiring the media, and data.

A particular track is identified by reading a first few encoded data bits on each track that uniquely identify each track. Only enough bits are utilized to uniquely identify the correct track, alternatively additional bits may also identify a particular sector. In yet another alternative, a minimum number of bits may be used to identify a particular sector. In preparing to read data from the media, the cantilever swings the tip down to acquire the surface of the media (note tip position A, FIG. 44). After acquiring the surface, the tip moves in a direction towards data written on the media until it encounters a guidemark (servo line, or servo trench) which is detected because a free space value of the vibrating tip/cantilever is recognized. After recognition of the servo line, the height of the tip is adjusted to read the data. The free space value reference is a phase shift from the vibrations occurring while the tip had acquired the surface of the media. After adjusting the height of the tip to read data, any new phase shifts that occur are due to data stored on the media after the servo line.

In one embodiment, a mechanism for determining whether or not the tip is drifting between tracks utilizes a set of sync bits that are set in a predetermined sync bit area set at predetermined intervals among each of the tracks. The sync bits are previously written as shown in the sync bit area of FIG. 43. The sync bits are utilized as described with the reference to Track 2. When encountering a first boundary of the sync bit area, the tip on Track 2 should be vibrating at approximately a free space value until the second bit on Track 2 in the sync bit area is encountered. The second bit in the synch bit area of Track 2 is a writ en (high) synch bit (represented as a darkened circle in sync bit area on Track 2), and when the tip passes over the written (high) synch bit, the tip will vibrate according to interaction with the written (high) sync bit. As the tip passes over the third sync bit on Track 2, the tip will have returned to its approximate free space value (approximate because of minor interactions with the media, environment, etc.). If upon entering the sync bit area on Track 2, the tip is not vibrating at the free space but instead is vibrating closer to what would indicate a written bit shows that the tip has drifted towards Track 1 because it would be reading the first darkened circle representing a high bit on Track 1 in the sync bit area. If the tip were drifting towards Track 3, however, the tip and cantilever would still be vibrating at the free space value and only until the tip reached a position for the second bit would the vibrations indicate being off of Track 2, in this case those indications being that it would be vibrating not at the free space value but slightly above the free space value because close proximity to the first darkened circle (high bit) located in Track 3. Thus, more than one bit position in the sync bit area is utilized to determine drift.

Figure 43:
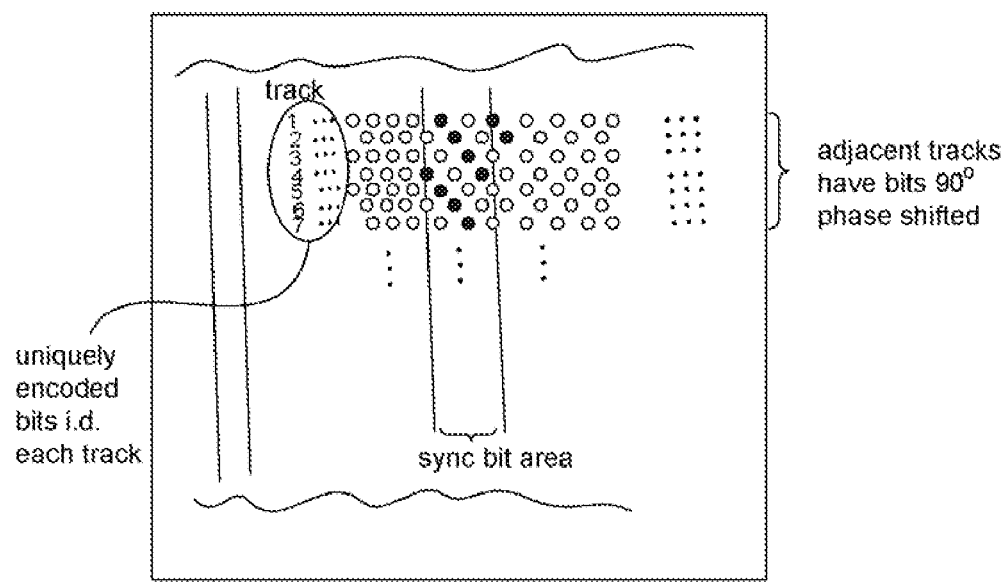
FIG. 43 is an example of sync bits maintained in tracks of a media material.
Figure 45:
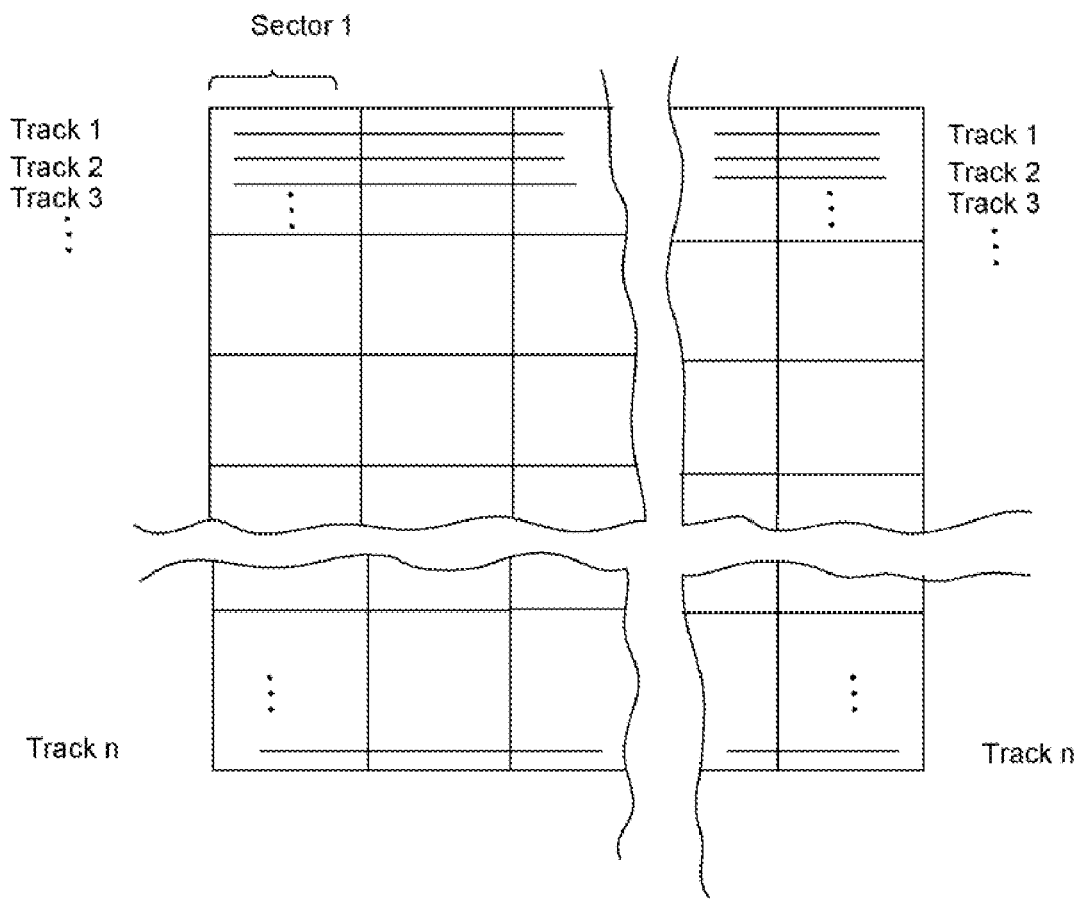
FIG. 45 is an example of a track and sector layout of a media material.

The sync bits may also be utilized to assure that the tip is positioned a proper height above the media surface. For example, again following along Track 2 and entering the sync bit area, if the tip is vibrating at other than the free space value, it would indicate that the tip is too close and is acquiring the media rather than acquiring bits writ en in the sync bit area. Along the same lines, if at the second bit position within the sync bit area (and therefore over the first darkened circle, high bit, on Track 2 in the sync bit area) and tip were not vibrating at a frequency indicating a data bit having been written, but instead was vibrating at the free space value, this would indicate that the tip is too high above the media surface. Sync bit areas as illustrated in FIG. 43 may be provided at an interval that maintains the tip on track based on position accuracy of the hardware moving the tip. For example, precise hardware may only need one sync bit area within each sector, while less precise hardware may require additional sync bit areas within each sector. In one embodiment, sync bit areas are maintained every 32 bits to maintain the cantilever and tip on a specified track. Because the sync bits are phased at slightly different positions between tracks, the drifting between tracks may be detected as the tip passes specific positions in the sync bit area.

WRITE Operation:

A write operation is essentially identical to a read except for the following difference:

In one embodiment, when the data portion of the track is reached, each time the tip swings down to its closest point to the media surface, a write pulse of appropriate polarity is applied to the tip. If a charge already exists, an opposite polarity pulse will remove the charge (making the data point a free space value, meaning when the tip passes over the data point, it will vibrate at the free space value). If no charge exists, an appropriate pulse will store the charge. In an alternate mode, the tip may remain in contact with the surface during writing.

Calibration:

After power up, the system will perform a calibration sequence. This involves:

Driving all the Z actuators in free space (well above the media) over a scan range (scan ranges of 70-130 Khz and higher) to determine the resonant frequency of each tip/head/actuator system, and setting the drive frequency tables accordingly.

Moving all platforms to the extreme corner positions, initiating scans, and determining the coordinates of the extreme scan positions, as well as the center positions (in Y, for example), to set the coefficients for ramping the Y position controls. This process is performed in both x and y position controls.

The control system will first perform a scan from left to right, and time the scan from grid mark to grid mark across the extremes of positions. This can be performed at slower than normal speed for increased accuracy. This timing information can be used to adjust the X speed controls, as well as the X position controls. The scans can be performed at different Y positions, and likewise in the Y axis. This will calibrate the X and Y positioning and speed controls.

Thus, by driving the heads and determining timing between servo marks, it can be mathematically calculated how much force (current/voltage) is needed to drive the actuators to place the media and platforms in specific positions. Such information is maintained in tables or other data storage. The DSP utilizes the stored data with respect to driving the x-y actuators and resonant frequencies to determine a ramp to send to the actuators to position the media and platforms.

Each cantilever is tested by the DSP by applying a current at different frequencies to each cantilever to determine resonant frequencies (via amplitude peaks) of each cantilever. The resonant frequencies will be maintained by hardware or software in a table, and utilized in tip operations (reading, for example).

Formatting:

Like any non-volatile memory, the system needs to be formatted. To aid the process of formatting, a set of guide (servo) marks will be etched in the surface of the media. In one embodiment, these marks will consist primarily of 1 u lines, in a grid pattern. Then a series of write tracks will be executed, which write all the tracks with known data and track position information.

Detailed Description Magnetic Read/Write Memory System

The magnetic system is similar in most respects to the charge storage system, with the following differences:

Typical READ Operation:

Same as 1, 2, and 3 above (typical read of charge storage system), except that the phase shift is due to interaction of magnetic material on a coated tip of the cantilever and magnetic domain under the tip and in the media (medium).

Figure 37:
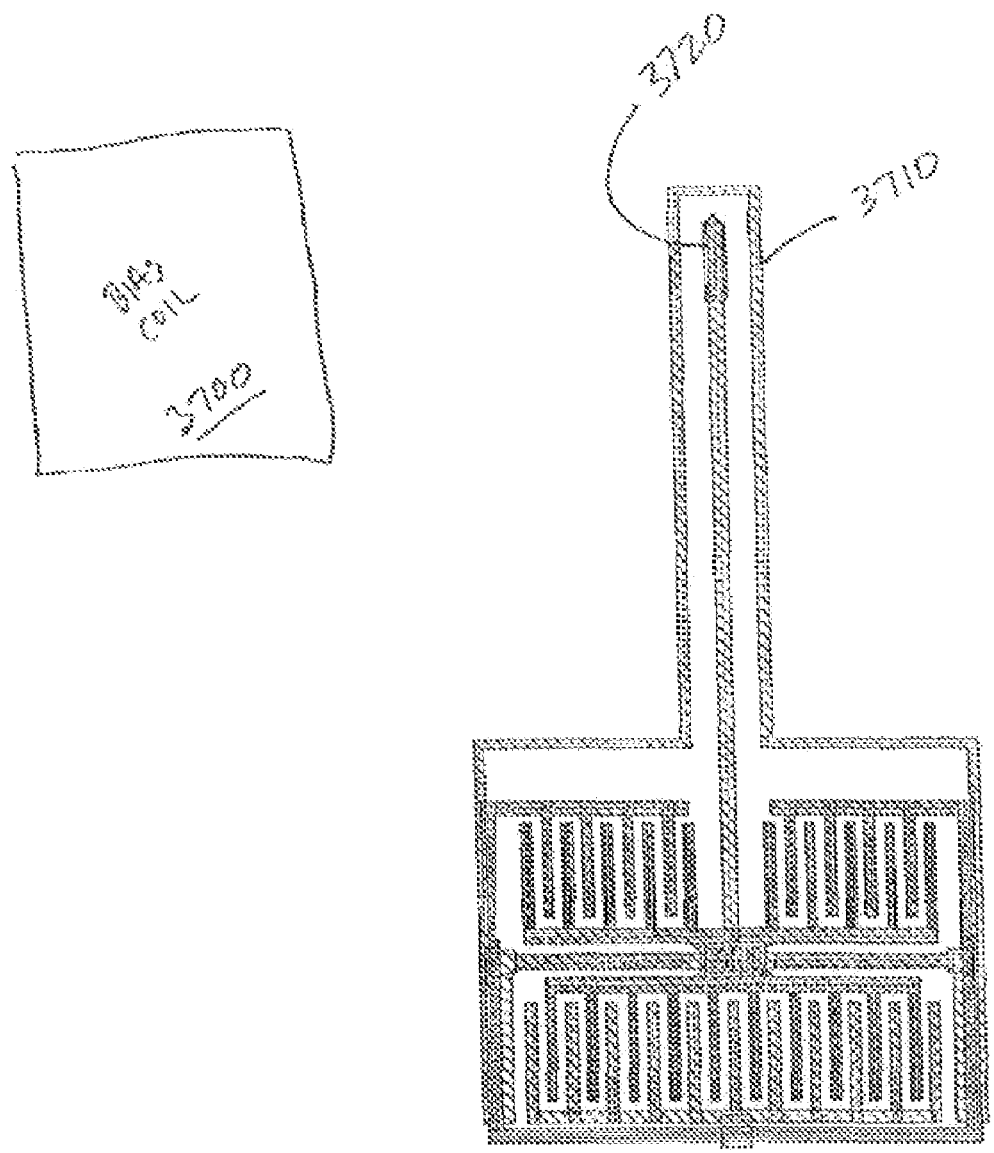
FIG. 37 is an enlarged area of the Z actuator from FIG. 30.

WRITE Operation:

A write operation is essentially identical to a read except for the following difference:

When the data portion of the track is reached, each time the tip swings down to its closest point to the media surface, a write pulse of appropriate polarity is applied to the write/sense coil. This creates a magnetic field which induces a field in the ferrous coated tip (Co, for example), which then flips the polarity of the domain immediately under the tip. The duration of this pulse must be short enough to prevent driving the tip into the media, yet long enough to flip the domain (which fortunately can be achieved in a short time span). The intensity must be controlled for the same reason. For example, FIG. 37 shows a bias coil 3700 that emits a bias field over the whole molecular memory device (read/write portion of the device). An individual write sense coil 3710 in close proximity to a corresponding tip 3720 applies a field to write the media. The tip 3720 collects and concentrates the bias and write fields at the point where the write is to occur.

Alternate Write Operation Technique—Synchronous Write

When the data portion of the track is reached, all of the tips or a block of tips are moved towards the media and positioned at the closest point ONLY if a bit of a certain state is to be written for that bit. If an opposite state is destined for a bit, the tip is moved away from the media. When all the tips of the appropriate state are at their closest point to the media surface, a write pulse of appropriate polarity is applied with an external coil. This creates a magnetic field which induces a field in the Co coated tip, which then flips the polarity of the domain immediately under the tip. A second pass is then initiated to write all the bits of the opposite state. The Z head/tip assemblies may be periodically switched back to a resonant sensing mode to ensure that the assemblies are still tracking the desired tracks correctly (in one embodiment, by reading sync bits).

This technique has the advantage of overcoming the small fields producible by the individual write coils by substituting a large field coil. It has the disadvantage of requiring a slower write time.

Memory Techniques Using Current Flow and Fine Tip

In the previously described techniques, the tip/media interaction operated in the tunneling regime, a distance nominally from 1 to 10 Angstroms between the tip and the media. A larger distance is typically referred to as the field-emission regime. Nominally lower currents flow in this regime and the current is also largely affected by the presence or absence of environmental gases. A smaller distance we will refer to as the purely resistive regime. In this regime, one or more atoms of the tip will be within a range which will allow substantial currents to flow between the tip and the media.

In the field-emissive regime, provided sensitive enough electronics, the sense mechanisms will still operate all the described memory techniques. Provided also that the voltage is raised to a high enough value, the memory element altering mechanisms will also operate for all those techniques which require an electrostatic force to operate.

In the purely resistive regime, the sense electronics need be much less sensitive, providing for much simpler sense electronics. An important consideration in the resistive regime is that the tip generally not move laterally over the media surface while sensing or altering the media in order to reduce tip wear. Here again, the same mechanisms will operate for all those techniques which require an electrostatic force to operate.

In addition to the Memory techniques already described in the previous patent (Rust, et al., U.S. Pat. No. 5,453,970) are the following techniques:

Memory Technique 1

For this technique, an example surface and memory element is doped diamond. The memory altering technique is the same as Technique 6 in the previous application.

Figure 19:
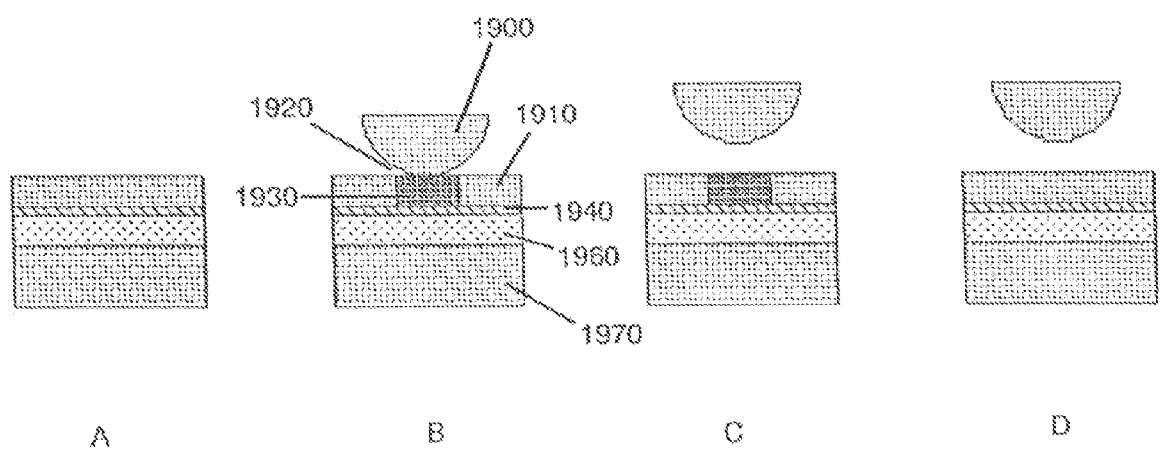
FIG. 19 is an enlarged view of three states of an amplifying memory media.

In this technique depicted in FIG. 19 any one of the disk drive apparatus in the previous patent application or the MARE IC is used and a molecular memory comprising atoms or molecules and a memory element comprising atoms or molecules exists on the same plane as the surface of the rotating disk or a fixed or moving plane above the MARE IC.

Figure 20:
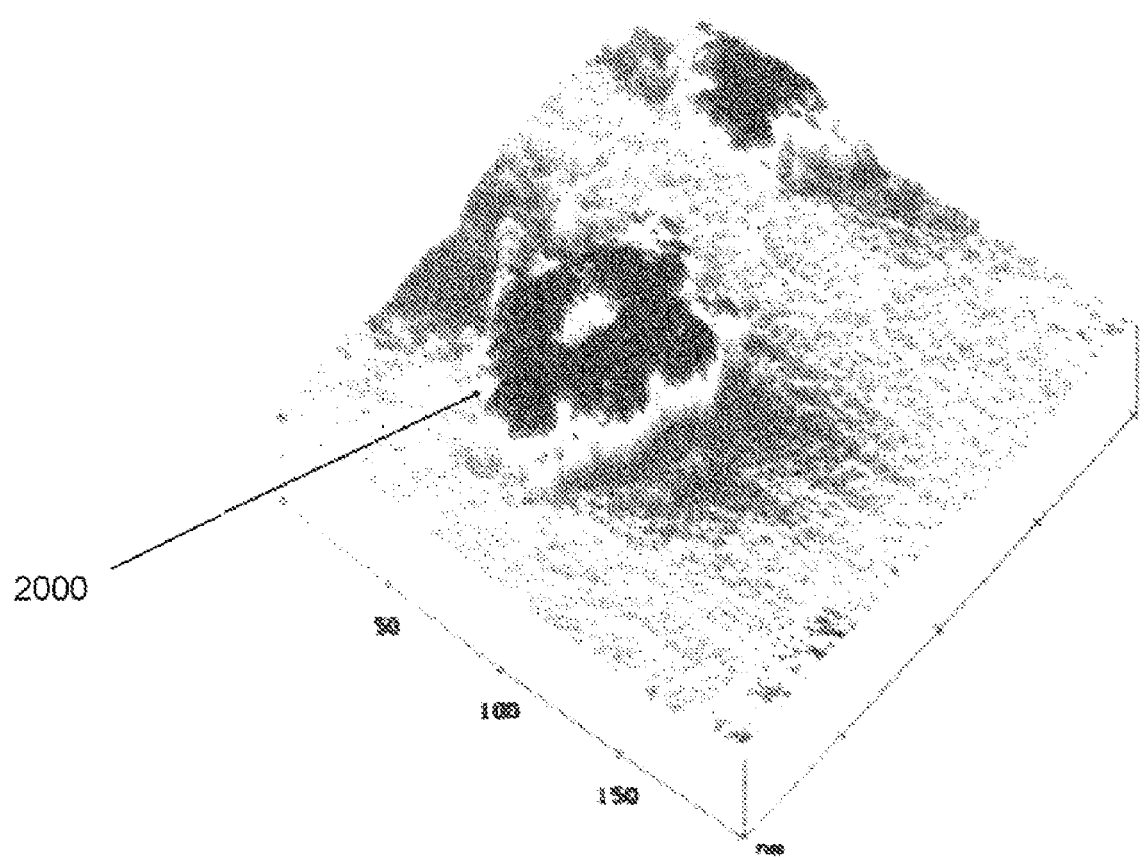
FIG. 20 is an enlarged view of an STM image of a bit formed on doped diamond.

When a pulse of greater than 23V is applied of typically 100 ns, the new lattice state of the diamond is in the form of a donut shape 2000 typically 30 nm wide by 10 nm high as shown in FIG. 20.

Memory Technique 2

For this technique, an example surface is silicon, the memory element are electrons or depleted electrons (holes) stored on a thin insulator such as silicon dioxide.

In this technique depicted in FIGS. 26A-D, the memory element comprising electrons or holes exists as a thin layer on the surface of a rotating disk or fixed or moving surface.

Figure 26:
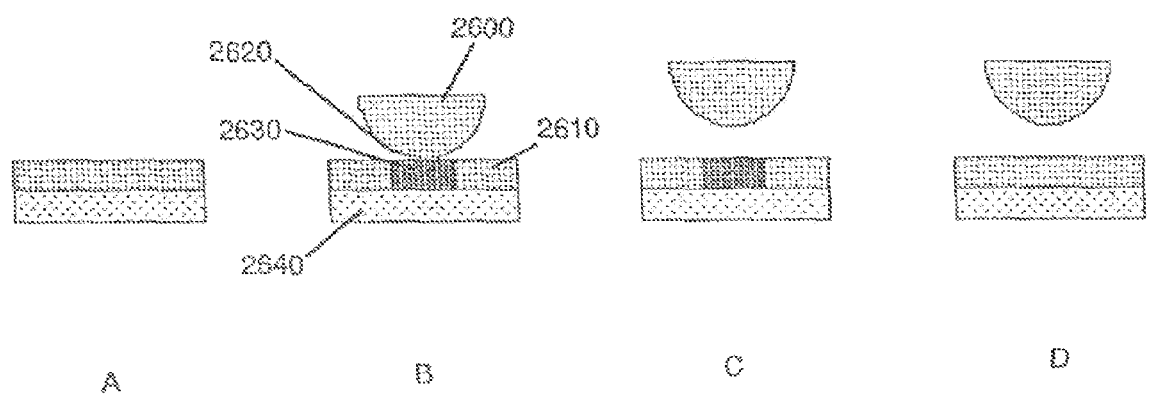
FIG. 26 is an enlarged view of the states of an insulator on silicon memory media.

The unwritten state is depicted in FIG. 26A.

To effect a written state in the memory, a head tip 2600 is positioned above or at the plane of the insulator 2610. When it is desired to write a bit of data, a bias voltage is applied between a tip and a memory element 2620. The bias voltage stores a charge in the form of electrons or holes 2630 as the memory element. It is possible to store analog information by using a larger or smaller bias voltage as well.

To read the information stored, the tip is passed over the surface in the same manner as writing. The electronics are put in a read mode. The read electronics discharges the electrons or holes to sense the information. The information is then restored in a subsequent re-write.

A disadvantage of this technique is that it requires re-writing the information after every read.

Memory Technique 3

Figure 25:
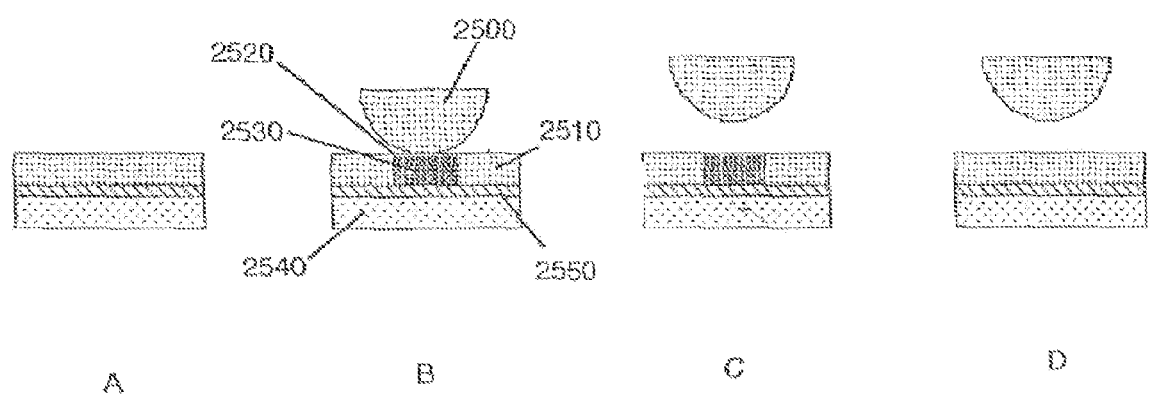
FIG. 25 is an enlarged view of the states of a nitride on silicon memory media.

For this technique shown in FIG. 25, an example substrate surface is silicon (S) 2540, the memory element are electrons or depleted electrons (holes) 2530 stored on a thin material such as silicon nitride (N) 2510. Below the top layer material is a tunneling insulator such as silicon dioxide (O) 2550. A tunneling insulator is a thin layer of material which is conductive if a threshold bias is exceeded. This is referred to as a NOS structure.

In addition, one of several techniques are used to improve the performance of this structure. In one form, a series of trenches are fabricated in the substrate 2540 and the NO or ONO structure is formed over the surface of the trenches. This has the effect of increasing the effective capacitance of the structure by a large factor causing a larger change in capacitance (stored charge) between a written and non written area of the media. In addition, the preformed structure of trenches serve as guides for the tracking servo mechanism.

In another form, a processing technique is used to etch the NO areas N 2510 and O 2550 into discrete islands. In another technique, in addition to forming the islands, additional doping is injected into the regions between the islands. Both of these techniques have the effect of allowing smaller bits to be formed. In the additional doping technique, the bits tend to have deeper depletion regions as well.

The unwritten state is depicted in FIG. 25A.

To effect a written state in the memory, a head tip 2500 is positioned above or at the plane of the insulator 2510 at 2520. When it is desired to write a bit of data, a bias voltage exceeding a certain threshold is applied between a tip 2500 and a substrate 2540, creating memory element 2530. The electrons tunnels to/from the substrate material and stores a charge in the form of electrons or holes as the memory element on the insulator 2510. It is possible to store analog information by using a larger or smaller bias voltage as well.

In one embodiment, to read the information stored, the tip is operated on a cantilever operating in a resonant mode. As the tip passes over a region of stored charge, based on the potential of the tip and the potential of the charge, a force will be exerted between the tip and the stored charge which will alter the phase of the cantilever.

In an alternate embodiment, the tip is passed over the surface in the same manner as writing. The electronics are put in a read mode. The existence of a charge forms a depletion layer in the substrate 2540, effectively changing the relative capacitance of the region between the substrate and the surface. A read technique which senses the difference in capacitance of written and unwritten states may be used.

Memory Technique 4

Figure 18:
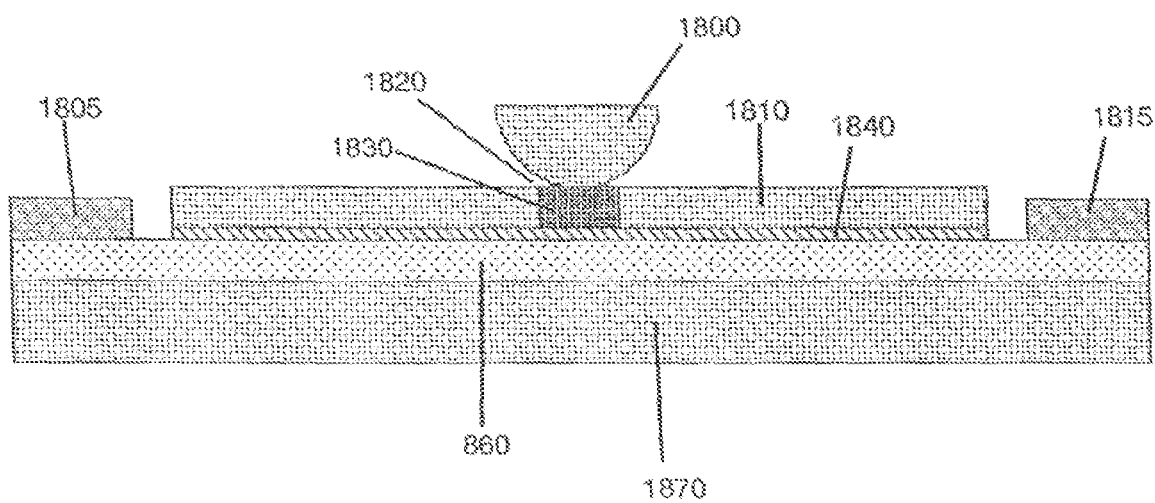
FIG. 18 is an enlarged cross section view of an amplifying memory media.

This technique is shown in FIGS. 18 and 19. For this technique, an example substrate surface is silicon (S) 1870 and 1970, the memory element are electrons or depleted electrons (holes) 1830 and 1930 stored on a thin material such as silicon nitride (N) 1810 and 1910. Below the top layer material is a tunneling insulator such as silicon dioxide (O) 1840 and 1940. A tunneling insulator is a thin layer of material which is conductive if a threshold bias is exceeded. This is referred to as a NOS structure. In addition, in the top layer of the substrate, an oppositely doped region (from the bulk substrate) is formed. Electrodes 1805 and 1815 are placed to form contacts to this doped region in two places opposite the region where charge is to be stored. The result is to form an active gate region under the NO.

The unwritten state is depicted in FIG. 19A.

To effect a written state in the memory, a head tip 1800/1900 is positioned above or at the plane of the insulator 1820/1920. When it is desired to write a bit of data, a bias voltage exceeding a certain threshold is applied between a tip 1800/1900 and the substrate 1870/1970, creating a memory element under 1820/1920. The electrons tunnel to/from the substrate material 1970 and stores a charge in the form of electrons or holes as the memory element on the insulator 1910. It is possible to store analog information by using a larger or smaller bias voltage as well.

To read the information stored, the tip is passed over the surface in the same manner as writing. The tip is set to a bias voltage for the read mode. A potential is applied between the two electrodes. The existence of a stored charge 1830/1930 forms a depletion layer in the doped region. The existence of the read mode bias adds to the induced field, raising the field enough to create an inversion region in the doped area 1860/1960. The existence of the inversion region will cause a current to flow between the electrodes 1805 and 1815, greater than that which would occur without the tip-induced field.

This greatly simplifies the electronics needed for this type of memory device.

In an alternate embodiment of this technique, the doped regions are formed into narrow channels between sets of two electrodes. The existence of the sets of narrow channels allows the ability to select which regions are to be read or written by selecting the electrodes.

Figure 46:
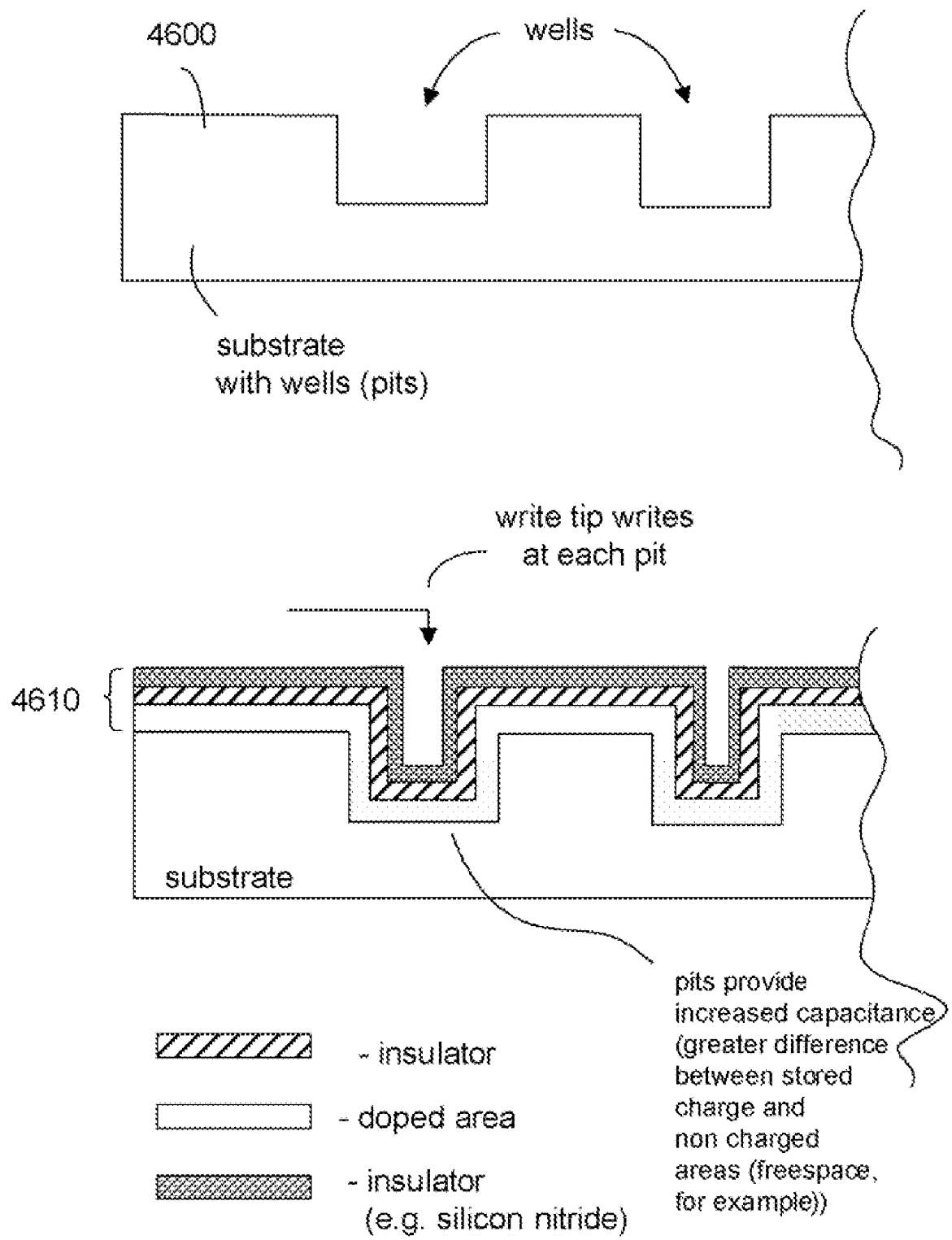
FIG. 46 is an example of a media material constructed with capacitive wells for increasing an amount of charge stored in the media.

In one embodiment, the molecular memory media (storage medium) is produced by depositing layers similar to those seen in the previous figures (FIGS. 18 and 19, for example) with the substrate being modified such that it has many wells (or pits) at locations where bits are to be stored in the media. For example, referring to FIG. 46, a substrate having wells (or pits) 4600 at predetermined intervals is shown. The substrate is then coated with a doped area and a variety of insulators similar to those shown in the previous figures (layers 4610). The wells provide a structure having increased capacitance for charges stored at each hole, therefore providing increased charge retention and easier detection of data bits written. In one embodiment, the wells (or pits) are patterned (or otherwise formed) into the substrate at a surface of the substrate prior to applying the additional layers 4610. In another embodiment, the wells take the form of a honeycomb shape produced from the substrate material. Layers 4610 are then deposited over the honeycomb shape.

Memory Technique 5

In an alternate media embodiment, the media consists of structures forming quantum dots. These may be formed using multiple quantum well (MQW) techniques. The media is written by applying a voltage pulse sufficient to change the electron state energy in the trapped quantum well regions.

Memory Technique 6

In this technique, the memory substrate consists of a material such as silicon (Si). The substrate has the property of two or more bonding interface states with the layer of atoms or molecules (memory elements) in the adjoining layer.

This technique is similar to Memory Technique 6 in the previous application, but with several differences in the way the memory elements are read and written.

To effect a written state in the memory, a head tip 1900 is positioned above or at the plane of the memory element layer. When it is desired to write a bit of data, the tip is moved laterally with respect to the memory element layer at a rate TV for tip velocity. At the same time, a periodically fluctuating bias voltage (VBF) of a sufficient amplitude to move the memory elements is applied. The fluctuating bias matches the energy level of the selected media material. The distance between bond center of a substrate-memory element bond, in one of the desired states is DBCS1 (distance bond centers state 1).

VBF will be of such a frequency to be a harmonic relationship of TV/DBCS1. (Alternatively, the TV may match the VBF vs. the lattice structure of the media.) A phase relationship which correctly applies the forces relative to the bond centers may be applied, such that the memory elements are lifted and then forced to fall into the least bonding barrier energy well associated with that state, and so form a structure with that state. This forms a bit in one state B0 (bit value 0).

A VBF with a different frequency and phase is applied to form a bit in another state, where VBF will be of such a frequency to be a harmonic relationship of TV/DBCS2, where DBCS2 (distance bond centers state 2) is another stable state bit value 1 (B1). If there are more than 2 stable states, the memory element may hold more than 1 digital bit.

To read the memory, the tip is passed over the surface using any of several forms of reading where either current or topological information is read back to indicate the positions of the memory elements. The signal indicating data B is applied to any form of filter which distinguishes between the characteristic frequencies of each of the states of the memory elements. For example, in a two state system, a low pass filter with cutoff frequency between the characteristic frequencies of the two states, followed by an integrator and comparator would output one voltage (bit) for one state and another voltage for another state. The use of two bandpass filters, each with their own integrator and comparators, would indicate valid data states and invalid data states.

Memory Technique 7

Figure 48:
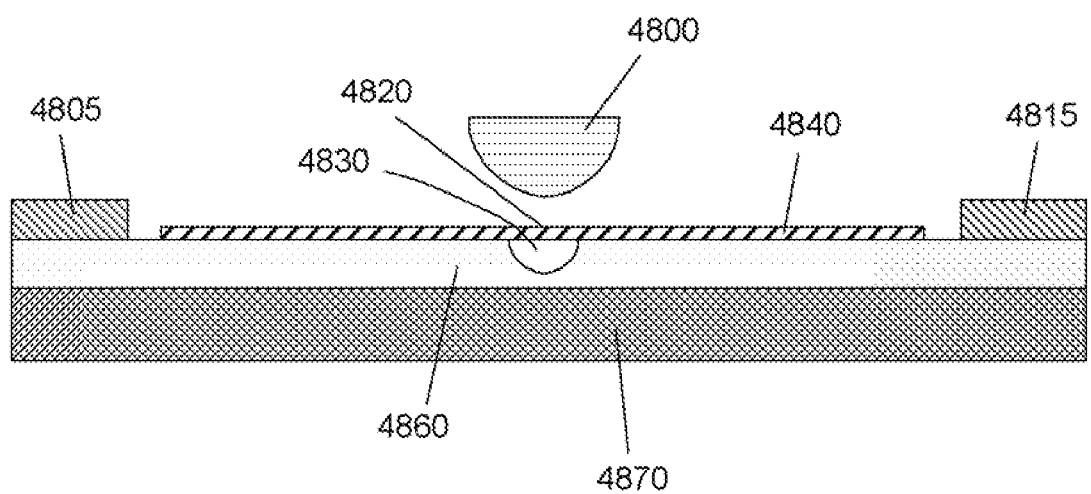
FIG. 48 is an example of an amplifying media.
Figure 49:
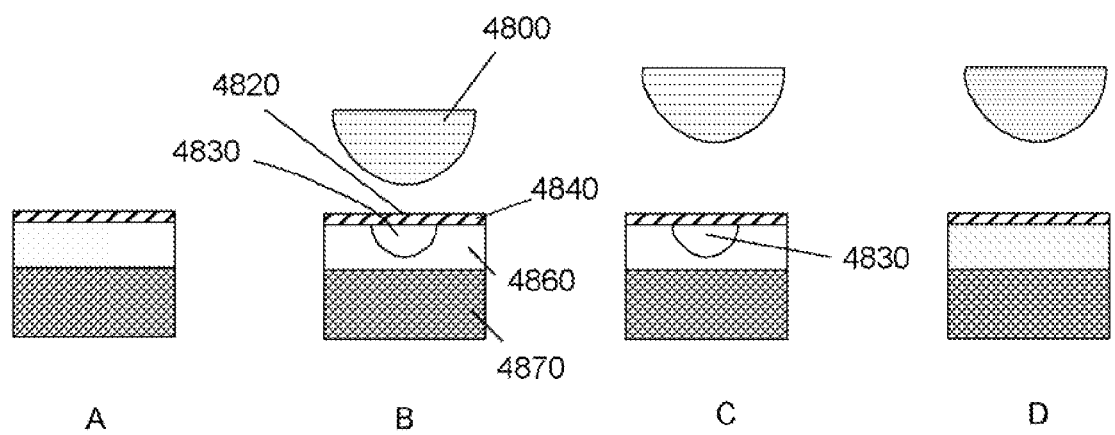
FIG. 49 is an enlarged view of the amplifying media of FIG. 48.
Figure 50:
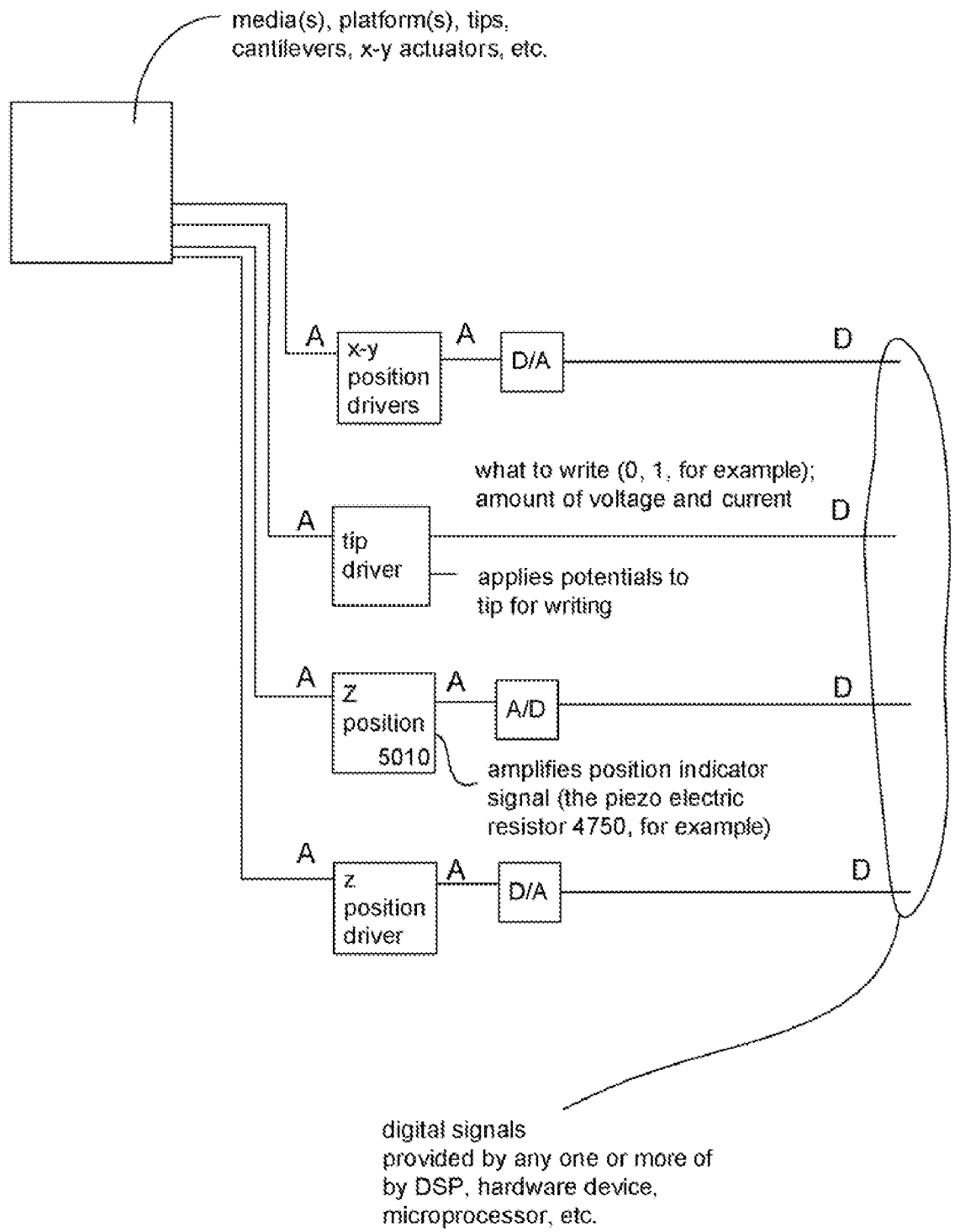
FIG. 50 is a block diagram of example control devices interfacing with the media/platform, cantilevers, and tips.

For this technique, referring to FIGS. 48 and 49, an example substrate surface is silicon (S) 4870, the memory element are a combination of electrons and depleted electrons (holes) stored on a thin material insulator such as silicon dioxide (O) 4840 and a top layer of the substrate (an oppositely doped region 4860). Either the thin material insulator or the oppositely doped region may store the elections and the other storing the holes, or vice versa depending on the polarity of the tip relative to the substrate. Electrodes 4805 and 4815 are placed to form contacts to this doped region in two places opposite the region where charge is to be stored. The result is to form an active gate region under the oxide.

The unwritten state is depicted in FIG. 49A.

To effect a written state in the memory, a head tip 4800 is positioned above or at the plane of the insulator 4820. When it is desired to write a bit of data, a bias voltage exceeding a certain threshold is applied between a tip 4800 and a memory element 4820. The electrons tunnel to/from the substrate material 4870 and stores a charge in the form of electrons or holes as the memory element on the insulator 4840 and oppositely doped region 4860 at 4830. It is possible to store analog information by using a larger or smaller bias voltage as well.

To read the information stored, the tip is passed over the surface in the same manner as writing. The tip is set to a bias voltage for the read mode. A potential is applied between the two electrodes. The existence of a stored charge at 4830 forms a depletion layer in the doped region 4860. The existence of the read mode bias adds to the induced field, raising the field enough to create an inversion region in the doped area 4860. The existence of the inversion region will cause a current to flow between the electrodes 4805 and 4815, greater than that which would occur without the tip-induced field. This greatly simplifies the electronics needed for this type of memory device.

In an alternate embodiment of this technique, the doped regions are formed into narrow channels between sets of two electrodes. The existence of the sets of narrow channels allows the ability to select which regions are to be read or written by selecting the electrodes. This technique has the advantage over technique 5 in that the erase times are typically much faster, and programming voltages can be much lower because a single material that is very thin and a potential needed to perform tunneling can be therefore done with a lower voltage.

Memory Technique 8

The memory media consists of a ferromagnetic thin film layer. The tip of the Z cantilever consists of a tip region of a ferromagnetic material which may be surrounded by a hard buffer material which is not ferromagnetic, typically a hard insulator such as silicon nitride. The apparatus is placed in a pulsed magnetic field.

To write a bit, the tip is brought into proximity to the media, then the magnetic field is pulsed. To read a bit, the tip is brought into proximity of the media while vibrating at a resonance frequency. The force of the magnetic attraction or repulsion caused by a written bit will change the resonant frequency and the phase of the oscillation will be shifted.

Drive Apparatus 1

Figure 30:
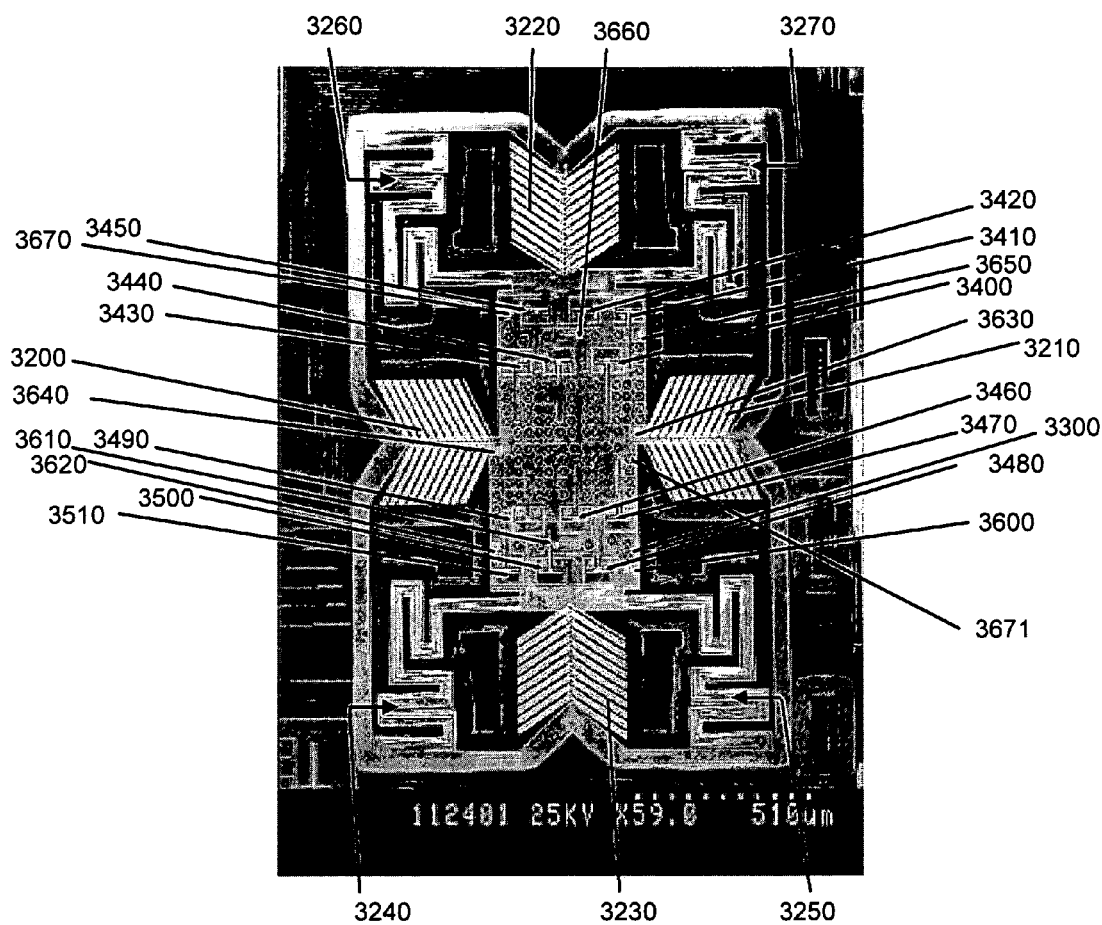
FIG. 30 is an enlarged view of one cell of a molecular array read/write engine with a chevron electrostatic X and Y actuators, and 12 sets of assemblies consisting of electrostatically operated Z actuators with cantilevers, heads with fine tips, position sensors, read/write coils and 8 spacing nub assemblies integrated on one platform, with connecting wires.

FIG. 30 shows one embodiment of one cell of an array of a molecular array read/write engine (MARE) memory integrated circuit apparatus according to the present invention. Not shown is the media itself, which is placed over the MARE device. External electronics interface through I/O pads (not shown). These pads pass both analog and digital information to/from the MARE. This information contains data to be written and data read from the memory, positioning information for the actuators, and position feedback information from the actuators. The cell contains pairs of X actuators 3200 and 3210, Y actuators 3220 and 3230, connecting leads 3240, 3250, 3260, 3270, and the platform 3300 consisting of 12 sets of assemblies consisting of Z actuators with cantilevers, heads with fine tips, position sensors, read/write coils 3400, 3410, 3420, 3430, 3440, 3450, 3460, 3470, 3480, 3490, 3500, 3510, and nub assemblies 3600, 3610, 3620, 3630, 3640, 3650, 3660, 3670. Patterns with an X shape (3671, for example) are holes in the platform to allow etchants to flow under the platform and release the platform more quickly.

Figure 31:
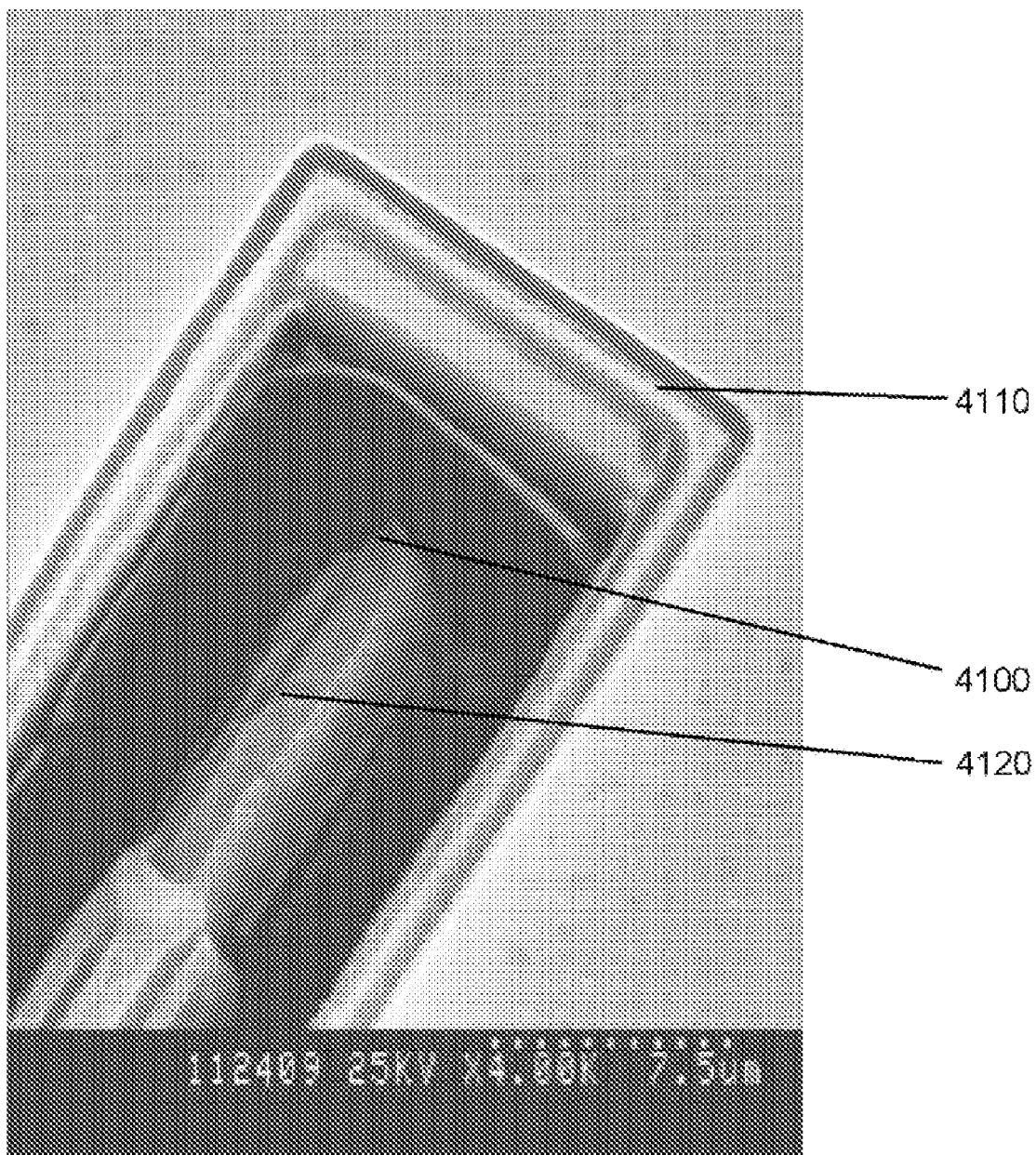
FIG. 31 is an enlarged view of the area around a tip from FIG. 30.
Figure 32:
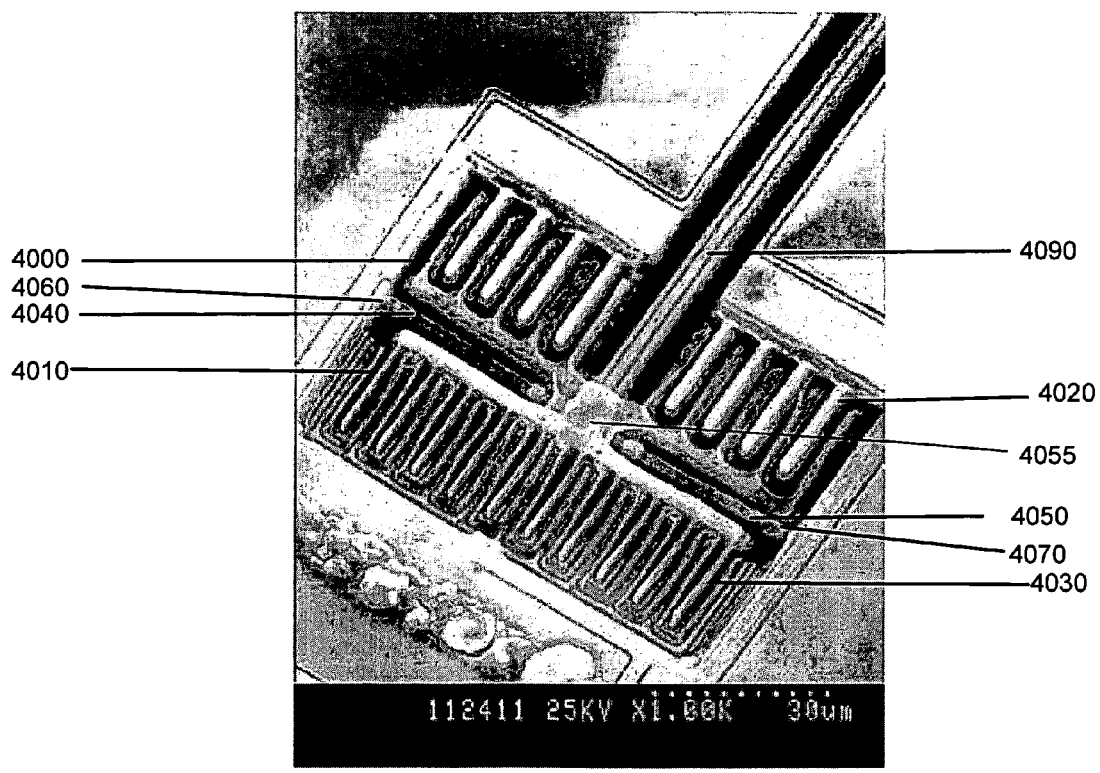
FIG. 32 is an enlarged area of the Z actuator from FIG. 30.
Figure 33:
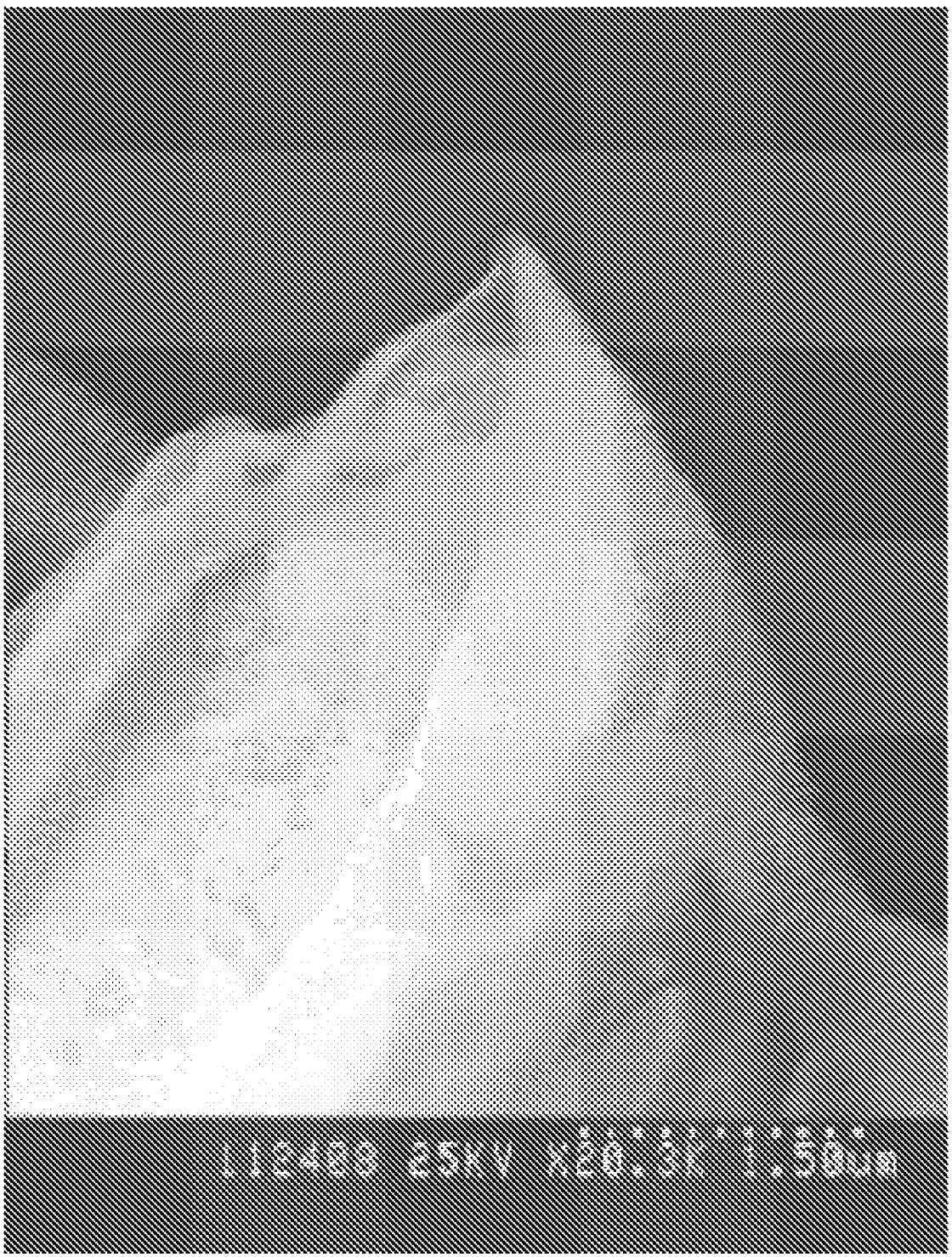
FIG. 33 is an enlarged area of the tip from FIG. 31.

The Z actuators with cantilevers, heads with fine tips, position sensors, and read/write coils are shown in detail in FIGS. 31, 32, and 33. The spring and actuator assemblies are a multi-layer film of highly conductive patterned thin film (typically aluminum, other materials will suffice (copper, for example) with insulators in between the layers (typically silicon dioxide). Z motion (in and out of the plane of the surface of the platform) is effected by electrostatic force. There are two sets of moving fingers 4000 and 4010 interdigitated between two sets of non-moving fingers 4020 and 4030. The moving fingers are mechanically tied together, tied to cantilever 4090 and mechanically coupled to a pair of electrically isolated torsion bars 4040 and 4050. Conductor plate 4055 which crosses the torsion bars and is electrically isolated from the tip torsion bar 4040 is electrically connected to the Z drive conductor which is also torsion bar 4050. The torsion bars are mechanically clamped at points 4060 and 4070. Cantilever 4090 is connected electrically to torsion bar 4040 and tip region 4100. The moving assembly consisting of fingers 4000 and 4010, torsion bars 4040 and 4050, conductor plate 4055, cantilever 4090 and tip 4100 form a teeter-totter assembly which rotates between the points 4060,4070 twisting the torsion bars 4040 and 4050.

Figure 13:
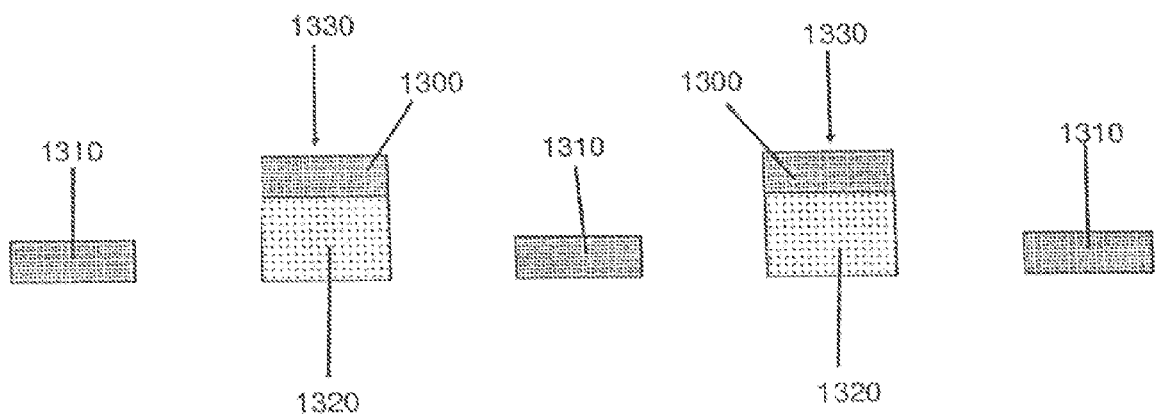
FIG. 13 is a cross section of the actuator portion of the electrostatic Z actuator from FIG. 9.

A cross section of the fingers assembly is in FIG. 13. The conductive part of the moving fingers are conductors 1300 on top of insulator 1320. The fixed conductors are 1310. An electrostatic potential is applied between conductors 1300 and 1310. The attractive force pulls the fingers 1330 in FIG. 13, 4010 in FIG. 32, downward. An opposite arrangement is configured on the other side of the fulcrum. The raised conductors are the fixed conductor fingers, while the lower conductors are the moving conductors. This produces the effect of forming a rising force on the fingers 4000. The net effect is two forces, one downward on the 4010 side of the torsion bars, the other an upward force on the 4000 side of the fulcrum formed by the torsion bars. This motion is typically a fraction of a micron. This movement is amplified by cantilever 4090 to form a motion of the tip 4100 of typically a 5-10 microns.

The tip region 4100 (see FIG. 31 and magnified in FIG. 33) is surrounded by a coil 4110. The tip region is coated with a magnetic material such as Co (cobalt), additional thicknesses of magnetic material may be added in the region adjoining the tip 4120. The motion of the tip region in and out of the plane of the coil induces a current in the coil, which can be used to sense the position of the tip, the proximity of the tip to a surface and the intensity and direction of the magnetic domain beneath the tip. Additionally, a current applied externally to the coil creates a magnetic field which induces a concentrated field at the tip region. An external biasing magnetic field may also be applied to augment the small field of the coil. The concentrated field, when in the proximity of a domain of the media, causes the direction of the field of the domain to align with the direction of the write field, overcoming the point coercivity of the media.

Referring again to the actuator of FIG. 32, it has several advantages over other embodiments. It can be fabricated from as few as two materials, a conductor typically aluminum or poly-silicon and an insulator, typically silicon oxide. The process is self-aligning, in that the top metal layers form a mask. A subsequent anisotropic oxide etch clears any unwanted bridges between moving parts. Normally this actuator is formed over a silicon substrate.

Figure 10:
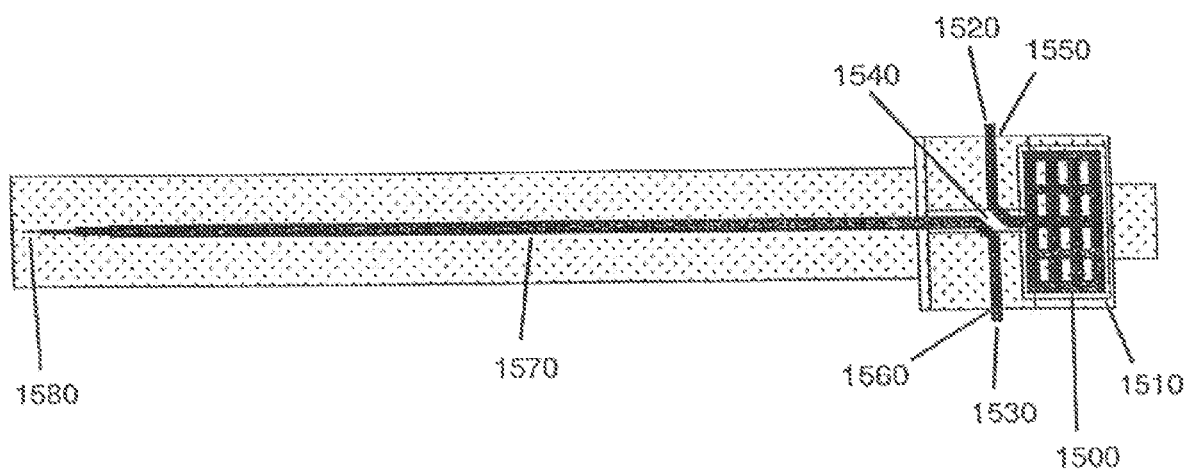
FIG. 10 is an enlarged view of an alternate Z actuator using electrostatic attraction.

Another significant advantage of this actuator over the actuator in FIG. 10 is that travel of the fingers up and down in the Z plane is not limited by contact of the upper plate 1500 with the lower plate 1510 as in FIG. 10. Another advantage is that there is not contact between the upper and lower conductors, which in the case of FIG. 10 would short the plates, removing the attractive potential, and potentially damaging the plates and associated electronics.

A typical problem with micromechanical devices is stiction. Once components touch, they tend to need a disproportionally large force to separate them. Since, in the embodiment of FIG. 32, the fingers do not touch, even at the travel extremes, stiction is not a problem.

Figure 34A:
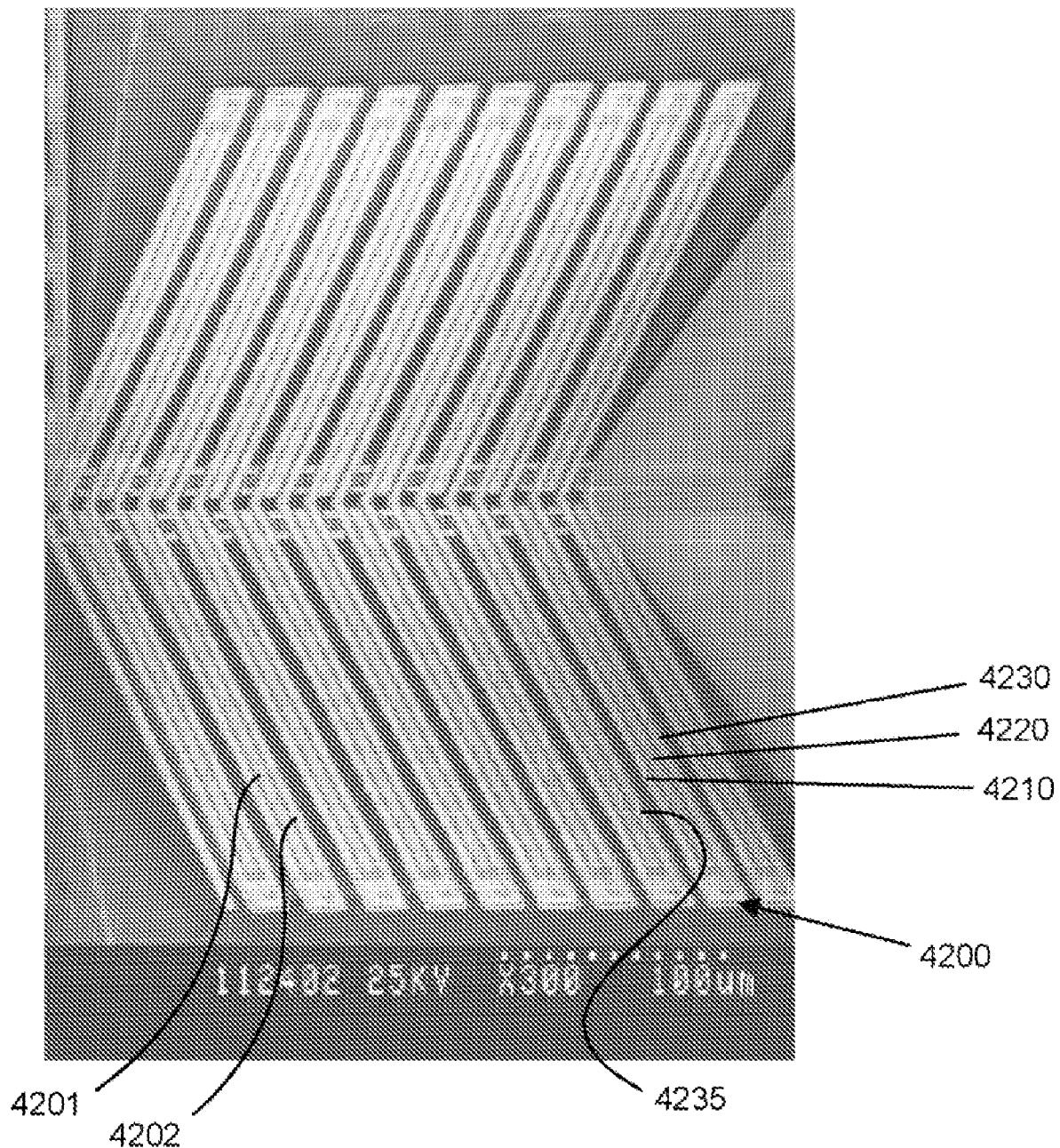
FIG. 34A is an enlarged area of the X actuator from FIG. 30.
Figure 34B:
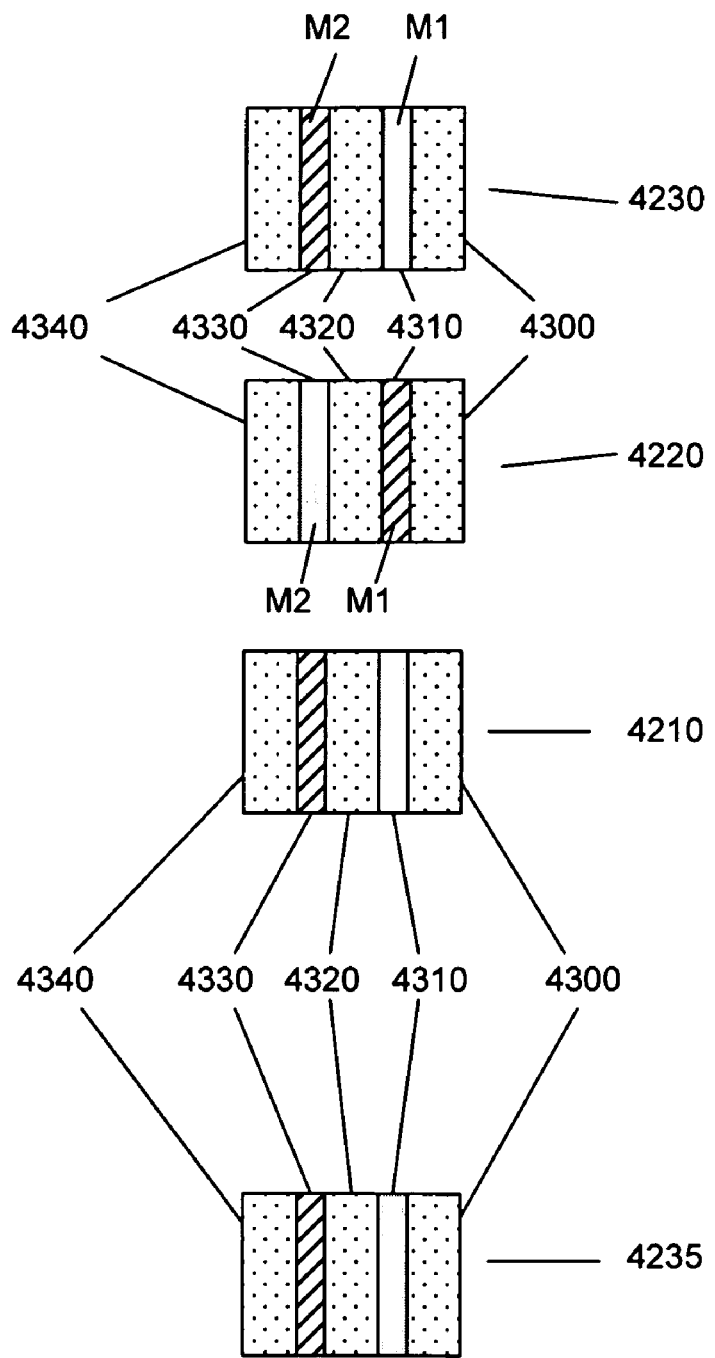
FIG. 34B is a cross section of one arm area of the X actuator from FIG. 30.

The X and Y actuators are shown in more detail in top view FIG. 34A and cross section FIG. 34B. Each arm 4200 consists of 3 prongs 4210,4220,4230. The end prongs 4210,4230 are each made of a stack of optional bottom dielectric OX1 4300 (see FIG. 34B), conductor M1 4310, dielectric OX2 4320, conductor M2 4330 and optional top dielectric OX3 4340. Additional dielectrics may be added to increase stiffness in the Z plane which helps reduce bowing of the actuator due to film stresses.

The polarity of the conductors is reversed in the center prong 4220 for M1 and M2. When a voltage potential is applied to the two conductors, an electrostatic force is created which attracts the end prongs to the center prong. As actuation increases, the gap (between prongs) is shortened (4201 and 4202, for example). All of the prongs acting together generate a force which tends to make the actuator compress and reduce all the gaps. Additionally, the arms aligned at an angle to each other and the actuation axis allows for lower spring constant in the opposite axis.

Of each of the pairs of X actuators 3200 and 3210 and Y actuators 3220 and 3230 (FIG. 30, for example), one of the pairs is normally not actuated when the other is being actuated. For example 3200 pulls the platform to the left, 3210 to the right, 3220 pulls up, 3230 pulls down. However, additionally, the normally off actuator of the pair may be actuated to act as a brake, thus improving deceleration performance.

Each platform also contains a set of 8 nub assemblies 3600, 3610, 3620, 3630, 3640, 3650, 3660, and 3670. The nubs are a platform consisting of an array of one or more sharp tips, typically of the same configuration as the tips on the cantilevers. When the media surface is placed over the MARE, if the platform has any bow which causes it to bow towards the media surface, the tips of the nubs will touch the media surface, and thus keep the platform at a fixed distance relative to the media. The very low surface area of the tips reduces the friction between the platform and the media.

A separate media contactor assembly 3100, similar to the above Z actuators with cantilever and head with fine tip, provide a means for electronically controlling a physical and electronic contact with the media. When input pads are given a control voltage of high enough value, the tip is raised into position against the media and electrical connection to the media via a separate input pad is achieved. When no voltage is applied to pads, the Z actuator remains in the off position and the media is electrically isolated from the media biasing voltages as a safety means. This applies only to media which require an electrical connection. More than one contactor may be implemented as backup or to provide more uniform current flow over the media. Alternately, connection to the media may be effected by bonding to the back side of the media wafer.

Each of these cells described above may be integrated into arrays of cells to increase the capacity of the drive. In the simplest form, diodes are placed around each cell to allow each cell to be individually addressed, or addressed by rows and columns selectors. In alternate forms, interface electronics are embedded near each cell.

Alternate Drive Apparatus 2

Figure 35:
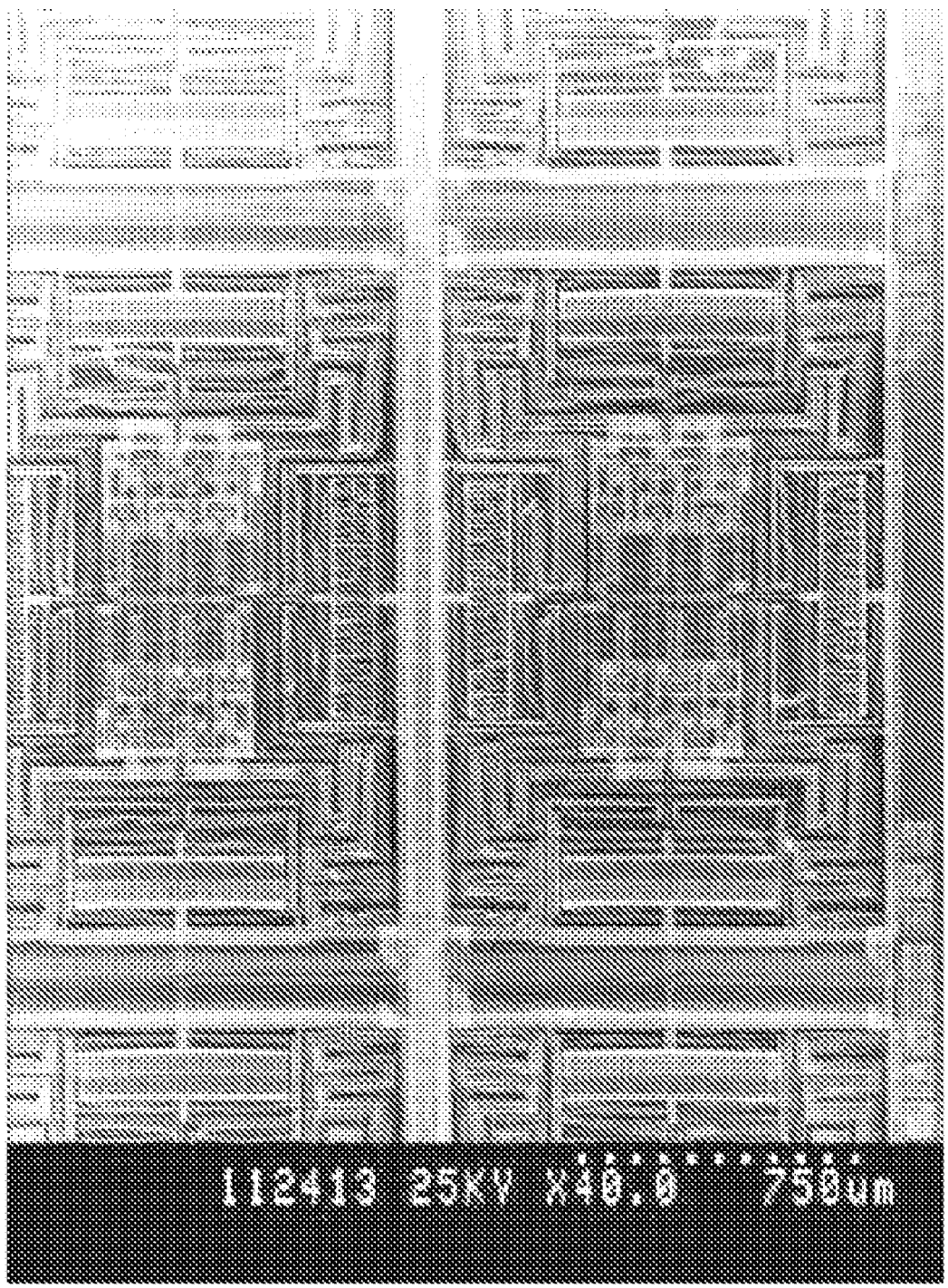
FIG. 35 is an enlarged view of several cells of a molecular array read/write engine with an enhanced electrostatic comb X and Y actuators, and 12 sets of assemblies consisting of electrostatically operated Z actuators with cantilevers, heads with fine tips, position sensors, read/write coils and 8 spacing nub assemblies integrated on one platform, with connecting wires.
Figure 35B:
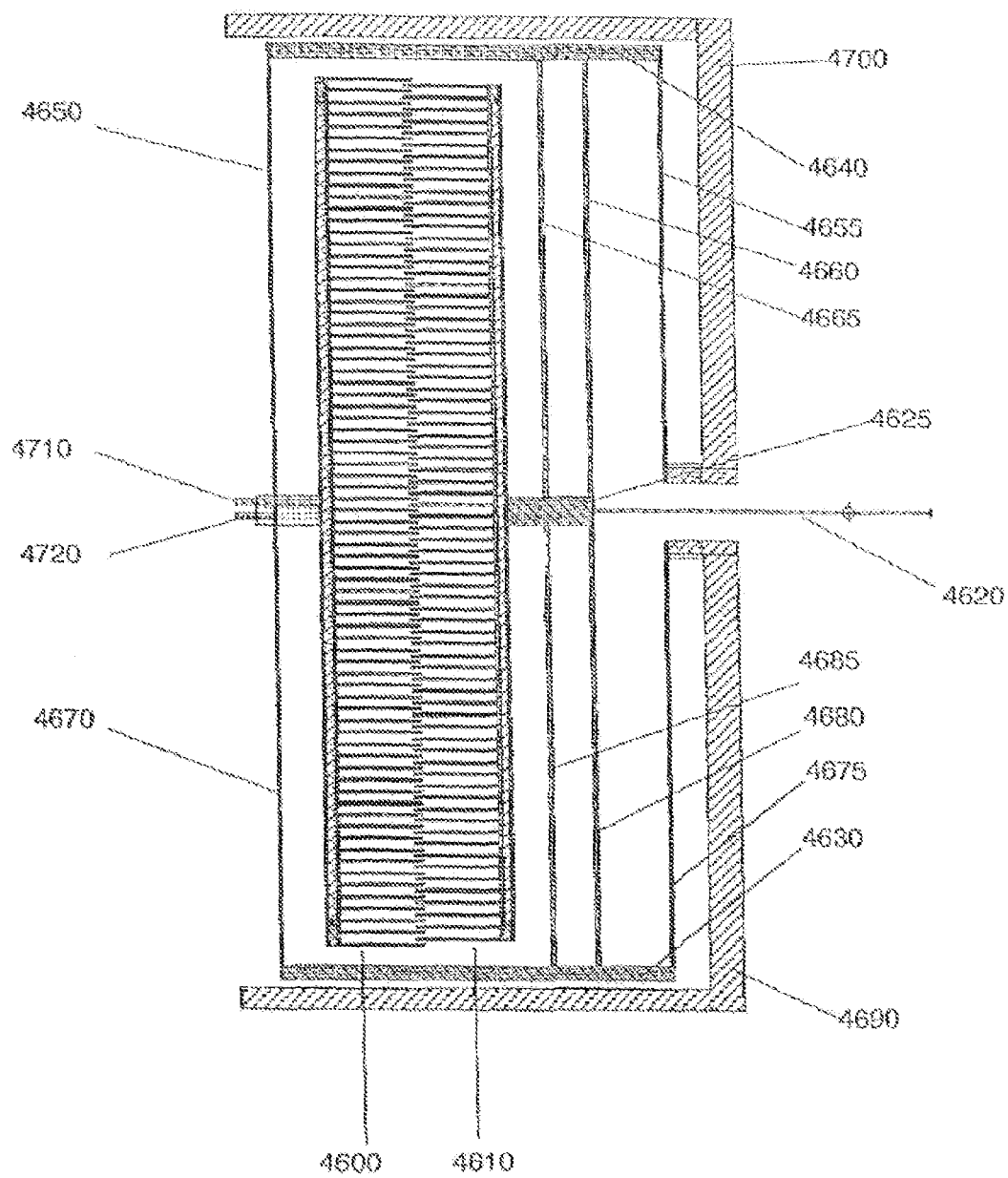
FIG. 35B is an enlarged area of the X actuator from FIG. 35.
Figure 35C:
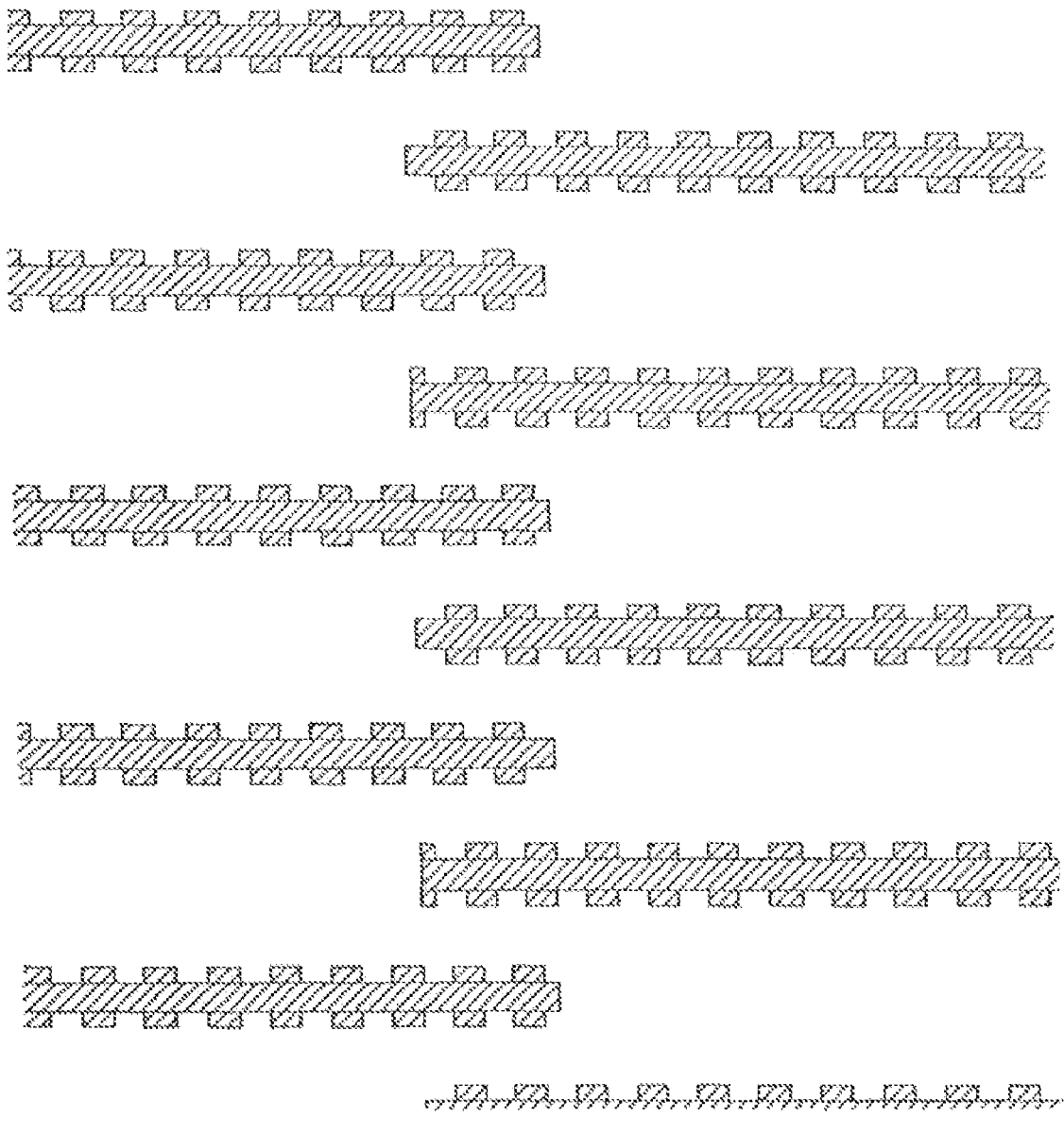
FIG. 35C is an enlarged area of the comb fingers of the X actuator from FIG. 35B.

FIG. 35 shows an embodiment of a MARE device with an array of platforms utilizing a modified electrostatic comb drive for X and Y actuators. This apparatus is identical to the Drive Apparatus 1 with the difference being the type of X,Y actuator. FIGS. 35B and 35C show this actuator in detail. The actuator consists of a fixed comb 4600, a moving comb 4610, comb-to-flex rod coupler 4625, coupling flex rod 4620, coupling bars 4630 and 4640, thin flex rods 4650, 4655, 4660, 4665, 4670, 4675, 4680, 4685, and fixed holders 4690 and 4700.

When a voltage is applied between the inputs 4710 and 4720, the voltage is carried by conductors through the thin flex rods and coupling bars to the moving comb, so the voltage appears between the two combs. In FIG. 35C a detail of the fingers of the combs are shown. These fingers employ a different architecture from normal comb drives. By employing notches on each finger, the surface area of the combs is increased (nearly a factor of 2 increase occurs in the embodiment of FIG. 35C, other increase factors may be realized via varying geometries and dimensions), thus increasing the electrostatic force by an amount comparable to the increased surface area The notches are staggered in their position to reduce the non-linear effect produced by the difference in gap distance from a notch facing a notch and a notch facing a bar. The electrostatic force pulls the combs together. The force is coupled by the thin flex rods to coupling bars 4630 and 4640, which move at about ½ the speed of the moving comb. This structure has a large rigidity in the Y axis, thus preventing the comb fingers from moving in the Y axis and touching. In addition, a spring action of the thin flex rods and the coupling bars brings the combs and coupling flex rod back to their original positions. The actuation movement is coupled through 4625 to coupling flex rod 4620, the end of which is attached to the platform. This flex rod is designed to be able to bend in the Y axis, when the platform is moved in Y.

Any of the notching techniques described herein may be utilized by any of the electrostatic devices and drivers also described herein.

Alternate Drive Apparatus 3

Figure 36:
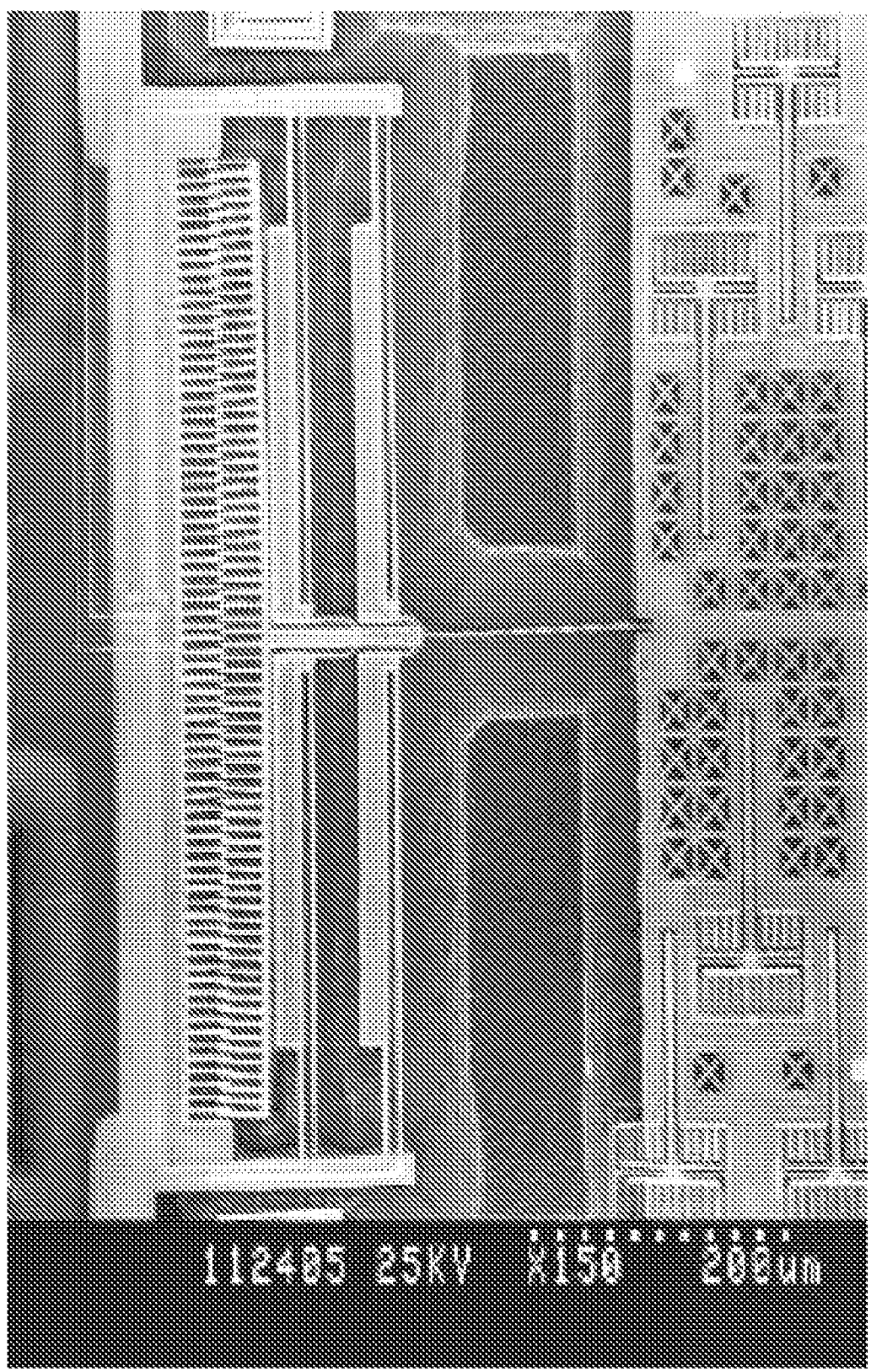
FIG. 36 is an enlarged area of a thermal X actuator with capacitance sensor.
Figure 36B:
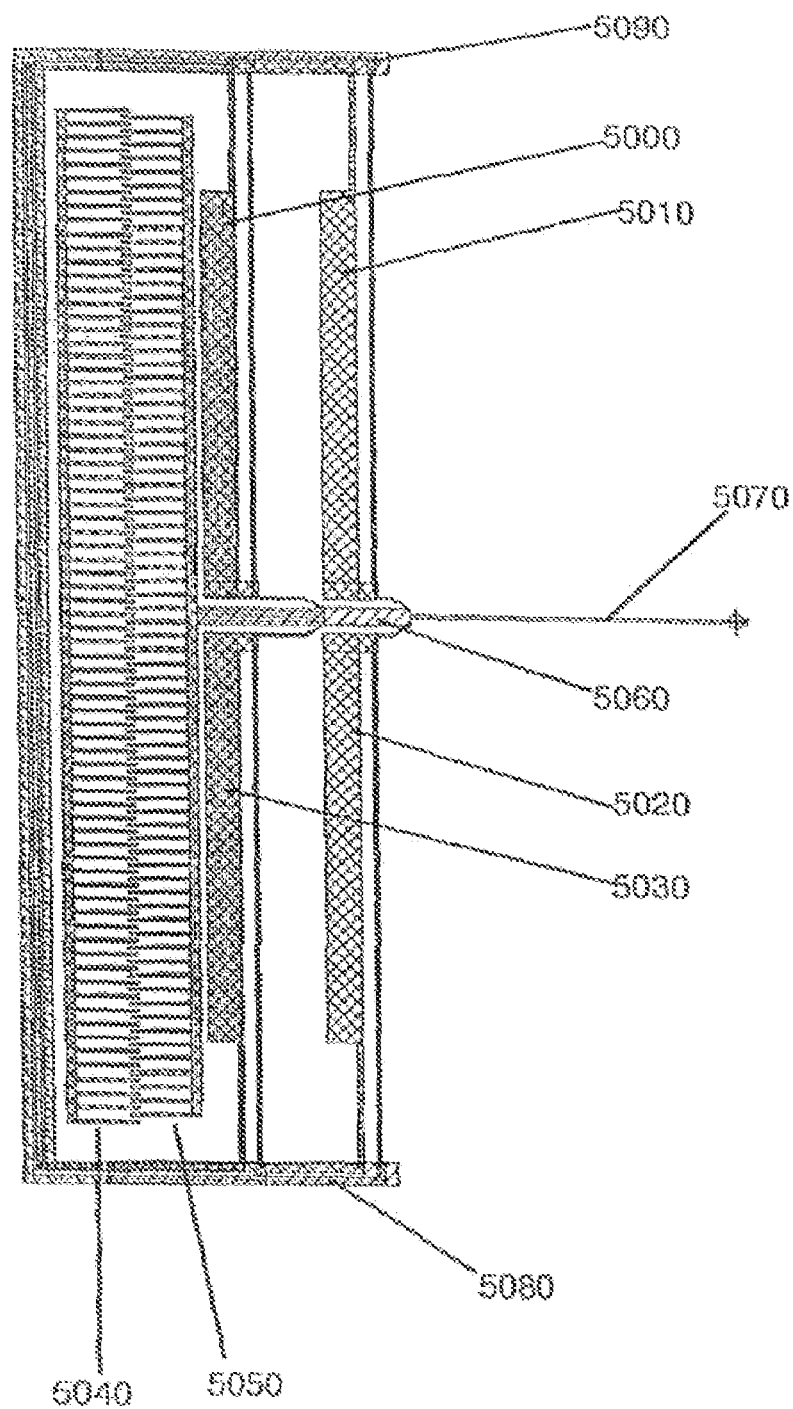
FIG. 36B is an enlarged area of the X actuator from FIG. 36.
Figure 36C:
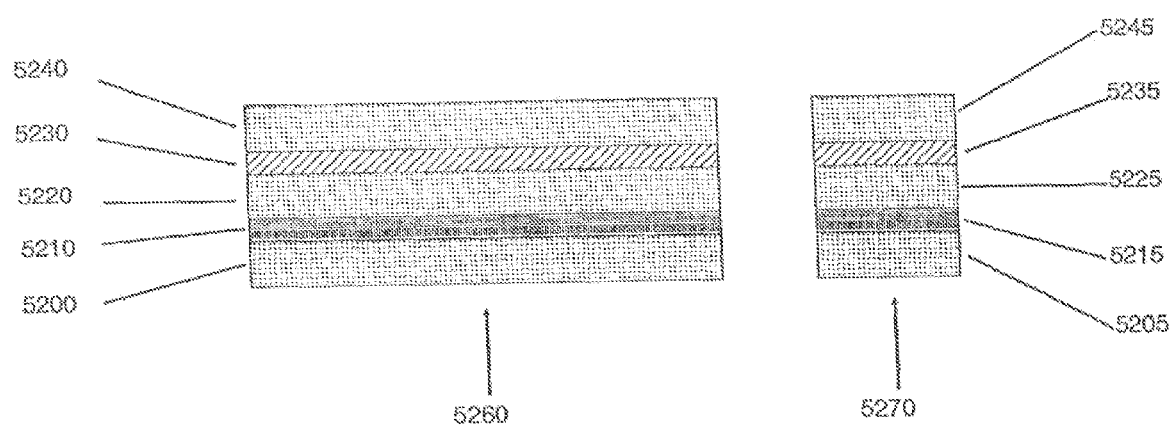
FIG. 36C is a cross section of one of the X actuators from FIG. 36.

FIG. 36 shows an embodiment of a MARE device with an array of platforms utilizing a thermal drive with capacitance sensor for X and Y actuators. This apparatus is similar to the Drive Apparatus 1, one difference being the type of X,Y actuator. FIGS. 36B and 36C show this actuator in detail. The actuator consists of four sets of thermal actuators 5000, 5010, 5020, 5030, a fixed comb portion of the capacitance sensor 5040, and a moving comb portion of the capacitance sensor 5050, connecting block 5060, flexible coupling rod 5070, and fixed blocks 5080 and 5090.

A cross section of one embodiment of the thermal actuator is shown in FIG. 36C. It consists of an optional dielectric 5200,5205, metal 1 5210,5215, delectric 5220,5225, optional metal 2 5230,5235, and optional delectric 5240,5245. The combined thermal properties of block 5260 are such that it will remain cooler than block 5270, so block 5270 will expand more than 5260. The result is that the combined group will push towards the left in FIG. 36B. The 4 actuators can be operated electrically in parallel or in series. Their combined force will sum, to push the moving comb sensor 5050, connecting block 5060, and coupling rod 5070 towards the left. The platform attached at the end of rod 5070 (not shown) will be pulled to the left. As the moving comb 5050 reduces the gap inside comb 5040, the capacitance of the assembly will increase. This capacitance can be used to sense the position of the actuator.

Alternate Drive Apparatus 4

FIG. 1 shows one embodiment of a molecular array read/write engine (MARE) memory integrated circuit apparatus according to the present invention. External electronics interface through I/O pads 10. These pads pass both analog and digital information to/from the MARE. This information contains data to be written and read from the memory, positioning information for the actuators, and control information for the state engines. Input pad 20, input enable, when logic 0 enables the transfer of information from the pads to the platform assemblies 40 through the tri-state bidirectional buffer amplifiers 50. Input pad 30, output enable, when logic 0 enables the transfer of information from the platform assemblies 40 to the I/O pads 10 through the tri-state bidirectional buffer amplifiers 50.

Input pad 60 clock-reset, transfers a 3 state clock and reset signal, buffered by assembly 70 to each of the platform assemblies 40. Separate control signals for the X-Y actuators may optionally be supplied though input pads (not shown in FIG. 1). Power is applied via pads 80 for +, 90 for −. A separate pair of media contactor assemblies 100 similar to the Z actuators provide a means for electronically controlling a physical and electronic contact with the media. Input pads 110 and 120 provide both control voltages to raise the contactors into position against the media and electrical connection to the media via pad 120. When no power is applied to these pads, the media is electrically isolated from the media baising voltages as a safety means.

Figure 2:
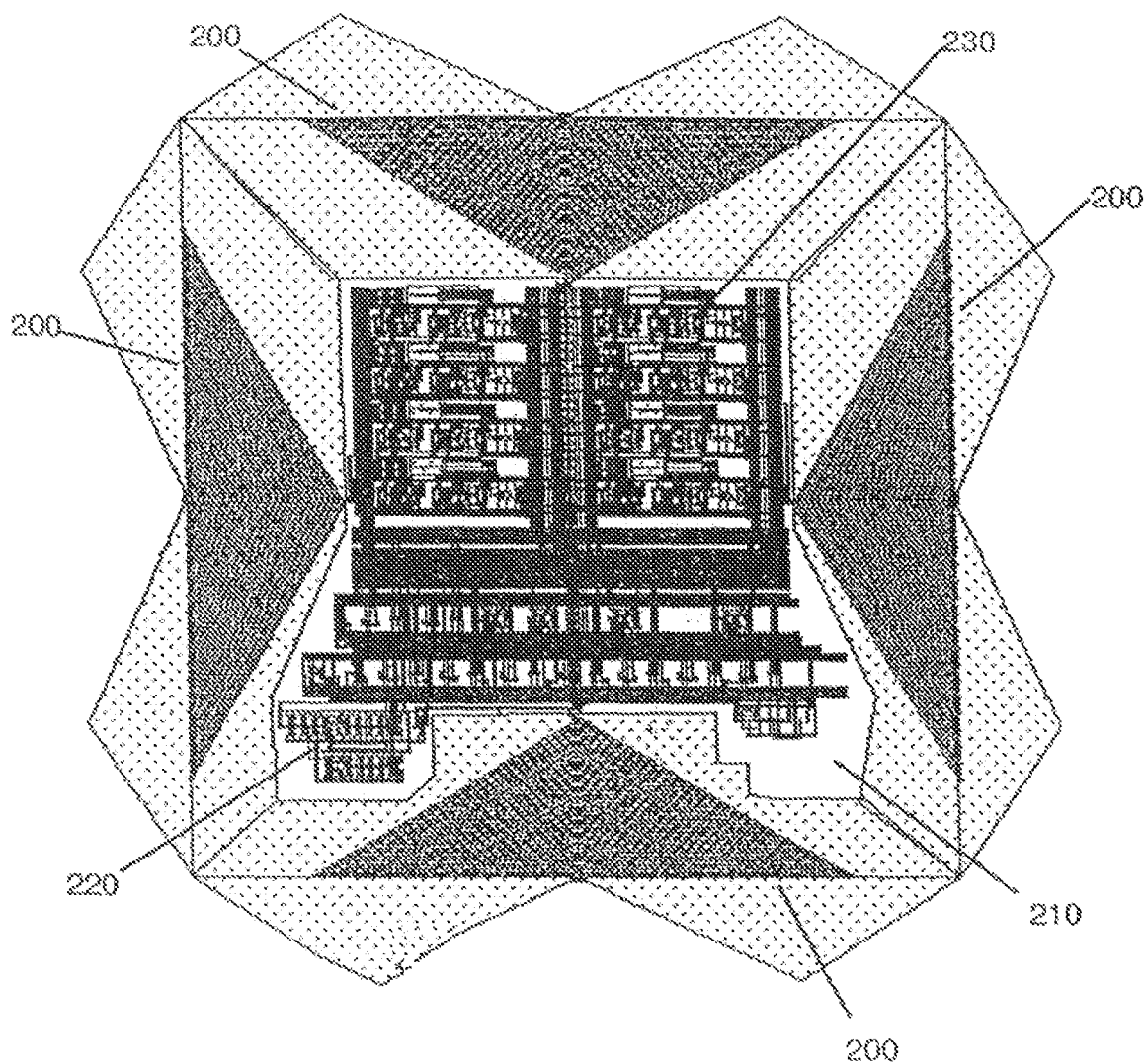
FIG. 2 shows an enlarged view of one of the platforms with the springs, electrostatic actuators, electronics, and 8 fine tip assemblies.

The data, control, and power information is conveyed to platform assemblies 40 shown in detail in FIG. 2. The spring and actuator assemblies are a multi-layer film of highly conductive patterned thin film (typically aluminum) with insulators in between the layers (typically silicon dioxide). There are typically at least 2 conductive layers, one layer providing power (+ or −) or clock-reset, the other control and data. When a potential differential exists between any two layers of the film, an electrostatic force will be exerted in a direction relative to the generated electrostatic force lines. This force causes the spring actuators to either expand or contract. This expansion or contraction is used to move the central platform 210 which is suspended between the 4 spring actuator assemblies. Each spring actuator also embodies a compliance in a direction at right angles to the expansion/− contraction actuation, allowing the central platform to move freely in both X and Y axis. The motion generated by the actuators is typically controllable from −50 to +50 microns travel.

In another embodiment, a third layer embodies the layer used for carrying the X-Y electrostatic control voltages. The third layer has the advantage of electrical isolation from the other electronics. Typical CMOS devices operate up to 15V. Breakdown voltage of thermal oxide is typically 600V/micron. The third layer metal typically has 1 micron oxide spacing. Therefore a control voltage up to 300V (thus with adequate safety margin) can be applied to this separate layer. As electrostatic force increases by the square of the voltage, higher voltages are a distinct advantage.

Figure 12:
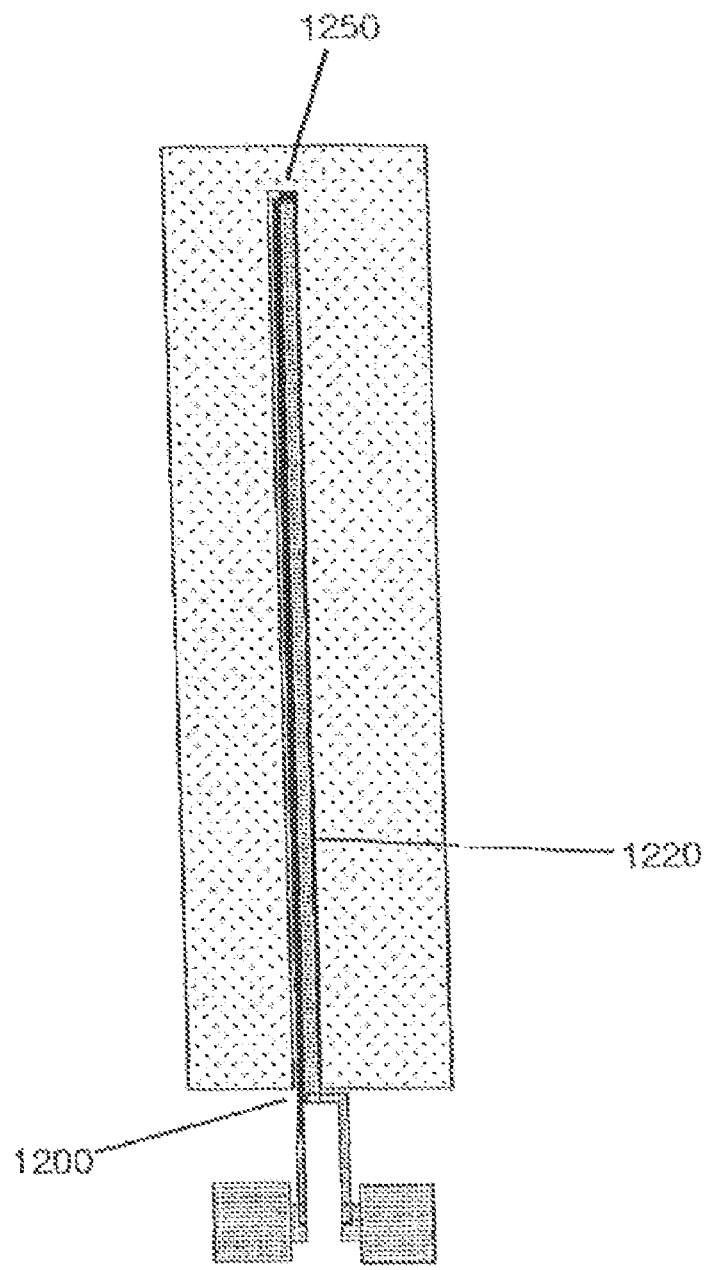
FIG. 12 is an enlarged view of a thermal bimorph actuator with extra conductor.
Figure 15:
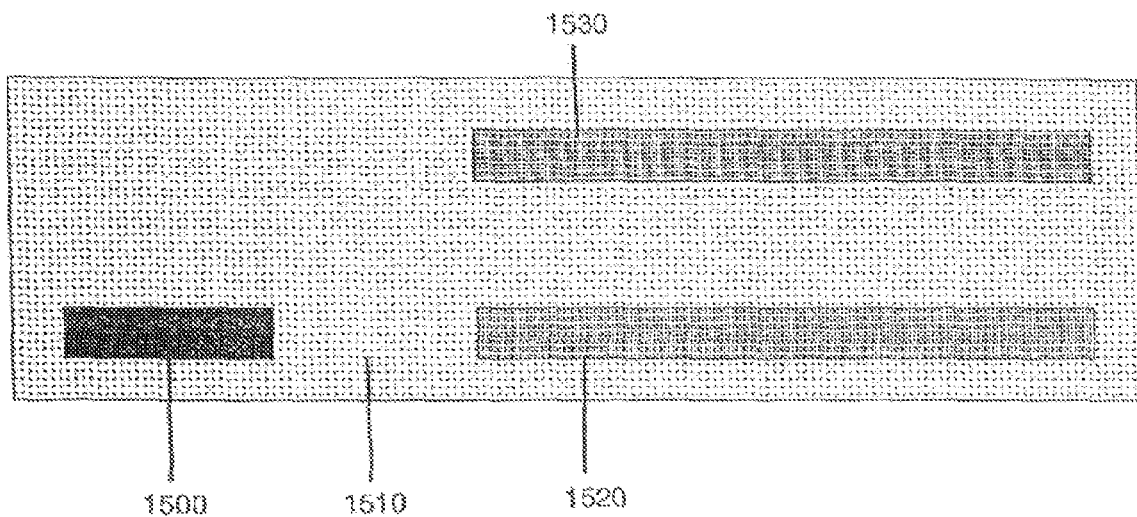
FIG. 15 is a cross section of a thermal bimorph actuator with extra conductor.

In another embodiment, the actuators are thermal bimorphs consisting of a heater (typically poly-silicon resistor), and two materials of different expansion coefficients, patterned with one material on one side and the second on the other side (see FIG. 12 and cross-section FIG. 15), such that applying current to the heater raises the temperature of the bimorph, causing the bimorph to expand or contract. The heater is typically formed with polysilicon. Conductors and the material of higher expansion coefficient 1520 and 1530 are typically aluminum. The assembly is typically encased in oxide 1510. Heating will cause end 1250, FIG. 12, to move to the left. Thermal bimorphs have the advantage of operation at lower voltages. They have the disadvantage of higher power dissipation, slower response (due to heat conduction and convection), and greater drift.

In another embodiment, the spring/actuators are electromagnetically controlled.

In another embodiment, the spring/actuators are controlled by shape memory alloy devices.

All of the embodiments may also use three actuator/spring assemblies instead of four, arranged at typically 120 degrees in a circle around the platform.

Figure 4:
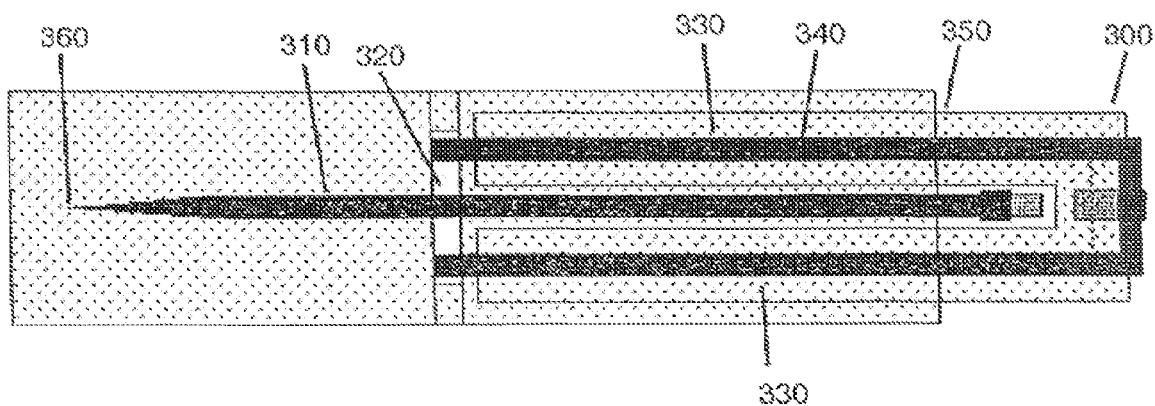
FIG. 4 is an enlarged view of one of the fine tip assemblies with the Z actuator.

On the platform assemblies are control and state engine electronics 220 and one or more Z actuator tip assemblies 230 (in this case 8 assemblies). The Z actuator/tip assemblies are shown in FIG. 4. These assemblies consist of electrostatic actuator 300, electrically isolated tip assembly 310, bridge or bridges 320. The actuator 300 consists of bottom electrodes 330, typically fabricated in the doped well or polysilicon (in double poly processes) and top electrode 340, typically fabricated in poly-silicon.

After post processing, which removes the oxide between electrodes 340 and 330 and under tip assembly 310, the top electrodes, tip, and bridge float above the bottom substrate, anchored at point 350. The bridge 320, typically formed with passivation glass, binds the actuators to the tip assembly. When a potential is applied to the electrodes 330 and 340, electrostatic repulsion pushes the top electrode upwards. The tip assembly is levered upward as well via the bridge.

By extending the tip beyond the edge of the actuators, the tip is leveraged a multiplying height factor approximately based on the number of times the extension is longer than the actuator. As the electrostatic force decreases by the inverse square of the gap, this leverage force is needed to provide a significant motion of the tip.

In an alternate embodiment, the electrostatic actuator and/or tip assembly is folded to conserve space.

In another embodiment, the Z actuators are formed with thermal bimorphs.

In another embodiment, the Z actuators are electromagnetically controlled.

In another embodiment, the Z actuators are controlled by shape memory alloy devices.

The tip region, after fabrication, may have an edge with sufficiently small radius of curvature to be useful as the read/write and sense region for interaction with the media. As a further refinement, a focused ion beam (FIB) deposition machine may be used to deposit a controlled fine tip material, typically tungsten or platinum, to provide a tip region with radius of curvature in the 10 nanometer range.

The FIB machine may also be used to mill down the deposited material in such a way as to form the tip region. Additionally, these machines may be used to subsequently analyze the resulting tip and ensure proper tip fabrication. Alternately, tips may be refined by sputtering of a tip material through an aperture to form a fine tip region. Alternately, the tips may be refined by etching through an aperture above the tip region.

In an alternate Z actuator/tip assembly, an additional piezo resistor, typically made from <100> oriented silicon is inserted in the actuator. This resistor will change resistance depending on the stress induced by the bending of the actuator (see FIG. 47, for example). This is typically amplified and read back during operation. This information can be used to sense height of the actuator.

In an alternate embodiment, the tip can be operated in an AFM mode. In this mode, the tip is set into a resonant vibration mode above the surface of the media. The resonant mode is indicated by a maximum amplitude of travel with a minimum oscillating control voltage amplitude. When a tip approaches the surface, a slight phase shift will occur from a read-back oscillating height sensor amplifier 5010 connected to the tip.

An alternate Z actuator/tip assembly is shown in FIG. 10. This device may include an optional capacitive position sensor for the Z axis (not shown but would be similar to that shown in FIG. 9). Z motion (in and out of the page from the figure) is effected by electrostatic force. There is moving grid 1500 above fixed plate 1510. The moving grid is mechanically tied together and coupled to floating torsion bar comprising separate electrically isolated torsion bars 1520 and 1530 and bridge 1540 which crosses the torsion bars and is electrically isolated from the tip torsion bar.

The torsion bars are mechanically clamped at points 1550 and 1560. Finally lever 1570 is connected electrically to torsion bar 1530 and tip region 1580. The moving assembly consisting of grid 1500, torsion bars 1520 and 1530, bridge 1540, lever 1570 and tip 1580 form a teeter-totter assembly which rotates about the Y axis formed by the torsion bars 1520 and 1530. An electrostatic potential is applied between conductors 1500 and 1510. The attractive force pulls the grid 1500 downward. An opposite arrangement may be configured on the other side of the fulcrum (not shown) to provide a rising force on the left side of the fulcrum. The net effect is one or two forces, one downward on the right side of FIG. 10, the other an optional upward force on the left side of the fulcrum formed by the torsion bars. This motion is typically a fraction of a micron. This movement is amplified by lever 1570 to form a motion of the tip 1580 to typically a few microns.

Figure 9:
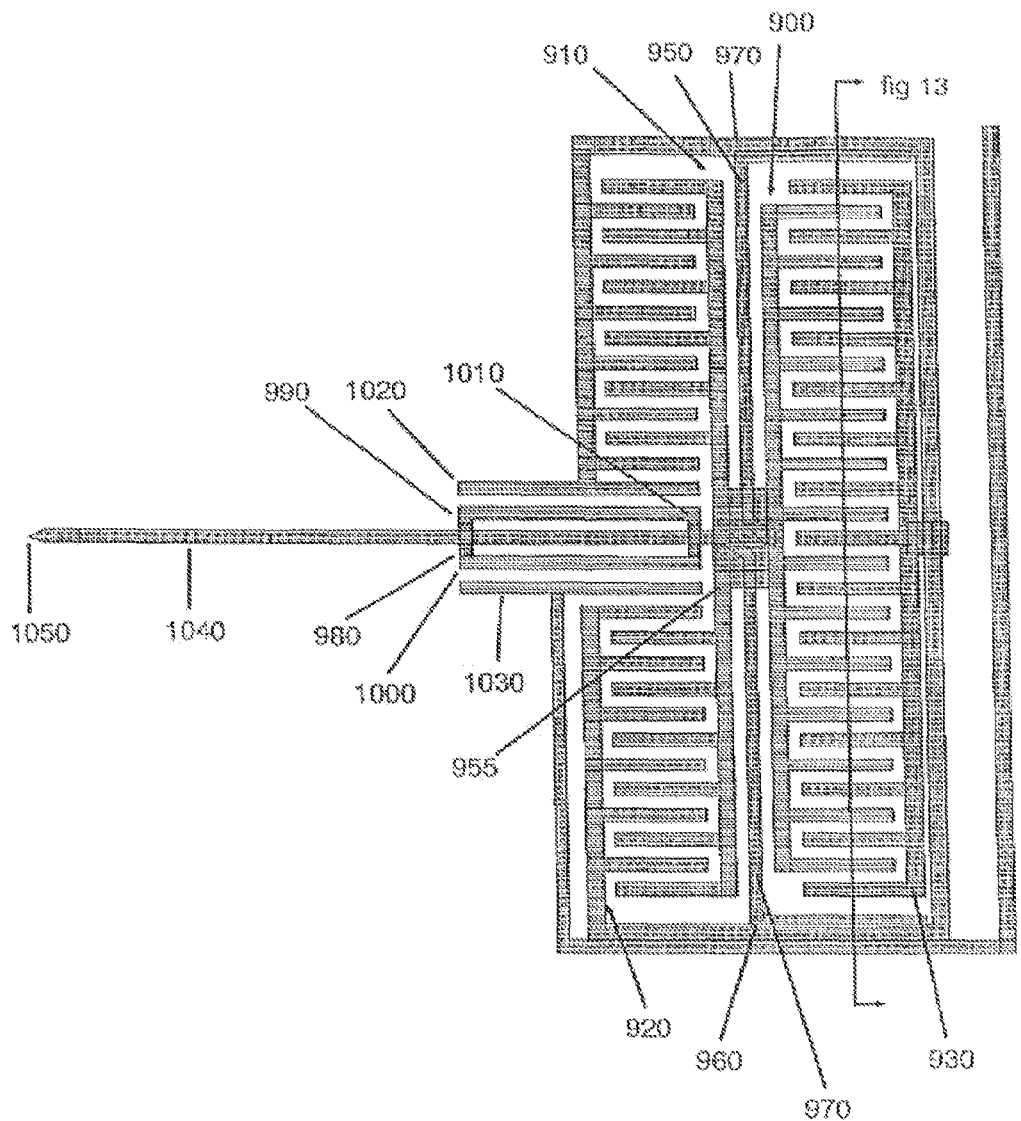
FIG. 9 is an enlarged view of an alternate Z actuator using electrostatic attraction with capacitive position sensor.

This actuator has the advantage of higher force per area due to the closer proximity and better alignment of the Z force along the Z axis over the actuator of FIG. 9.

Alternate Drive Apparatus 5

Figure 38:
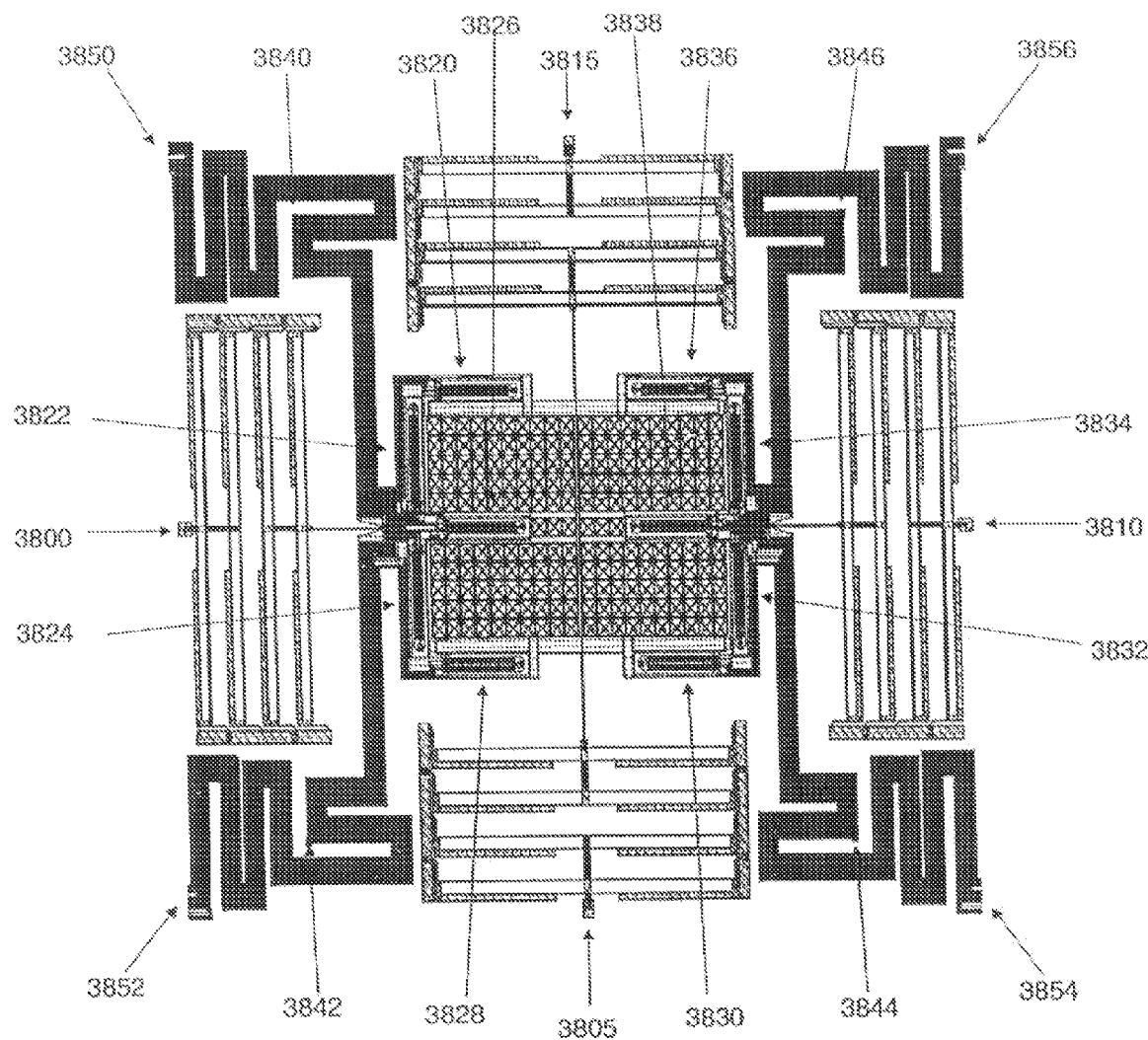
FIG. 38 is an enlarged area of one cell of a molecular array read/write engine with a thermal 2 stage series, 4 stage parallel X and Y actuators, and 10 sets of assemblies consisting of thermally operated Z actuators with cantilevers, heads with fine tips, piezoresistive Z position sensors, 4 spacing nub assemblies integrated on one platform, with connecting wires.
Figure 39:
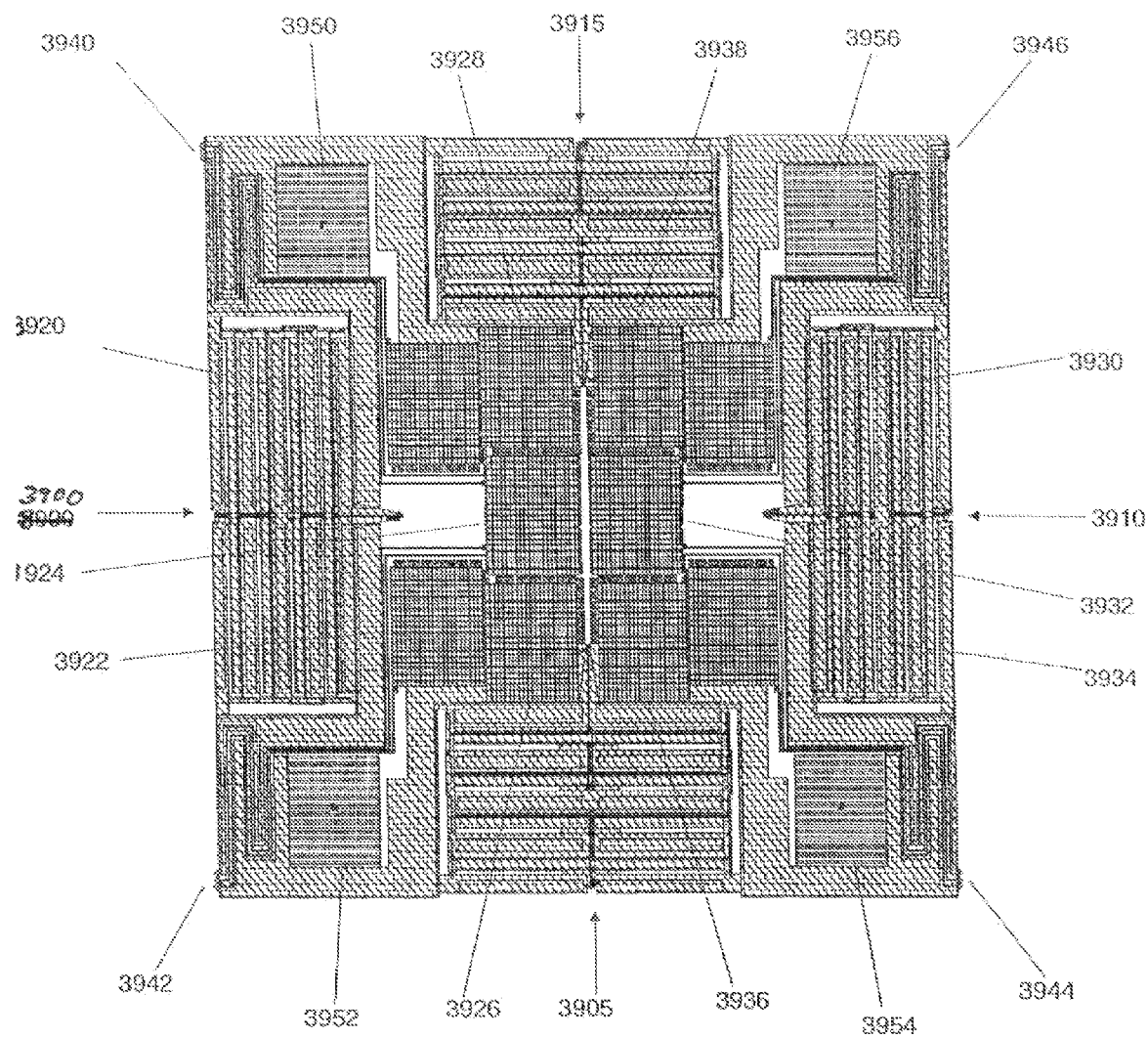
FIG. 39 is an enlarged area of one cell of a XY movable media with servo grid alignment marks with a thermal 2 stage series, 4 stage parallel X and Y actuators, 4 spacer bearing plates integrated on one platform, with connecting wires to each media substrate.

FIGS. 38 and 39 show an embodiment of a memory device with an array of platforms utilizing a thermal drive for X, Y and Z actuators and a separate, movable media. FIG. 38 shows the platform with the Z actuators, Z position sensors, cantilevers and tips. FIG. 39 shows the media platform which moves in a similar fashion as FIG. 38. FIG. 39 is placed over FIG. 38 in normal operation. This apparatus is similar to the Drive Apparatus 1 with the difference being the type of X, Y, and Z actuators. FIG. 38 may be used with either a fixed media or moving media such as FIG. 39. The X and Y actuators are similar to the drive in FIG. 36B and 36C without the capacitive position sensor. In addition, these actuators are placed in 2 stages, each consisting of 4 actuators operating in parallel, such that the position of stage 1 adds to the position of stage 2, thus doubling the travel of this actuator.

FIG. 38 consists of X actuators 3800,3810 and Y actuators 3805,3815. The moving platform in the center area consists of Z assemblies 3820, 3822, 3824, 3826, 3828, 3830, 3832, 3834, 3836, 3838. These are shown in detail in FIG. 40. The Z assemblies are electrically connected through insulated wires originating in fixed positions 3850,3852,3854,3856 and connecting to the moving platform. These wires also pass under and are physically connected to sets of tips anchored at locations 3840,3842,3844,3846. These tips act as bearings against a corresponding plate with optional grooves 3950, 3952,3954,3956. These maintain a fixed space between the platform of FIG. 38 and the media of FIG. 39. The grooves in the plates may be used as a means to force scanning of the platform from FIG. 38 with the media in FIG. 39 to remain on a given track, thus making electronic servoing of track position simplified.

The media platform in FIG. 39 has similar X and Y actuators as FIG. 38, however, these need not be operated in a linear fashion. They may be operated in a simple on-off state to yield one of 3 positions for each axis, left, center, and right for the X axis, up, center, and down for the Y axis. These provide an offset of the media relative to the MARE device of FIG. 38. The media blocks 3920, 3922, 3924, 3926, 3928, 3930, 3932, 3934, 3936, 3938 may contain regularly spaced marks to aid in positioning of the tips on the media. The media may have its substrate electrically connected through a set of insulated wires anchored to fixed positions 3940,3942,3944,3946.

Figure 40:
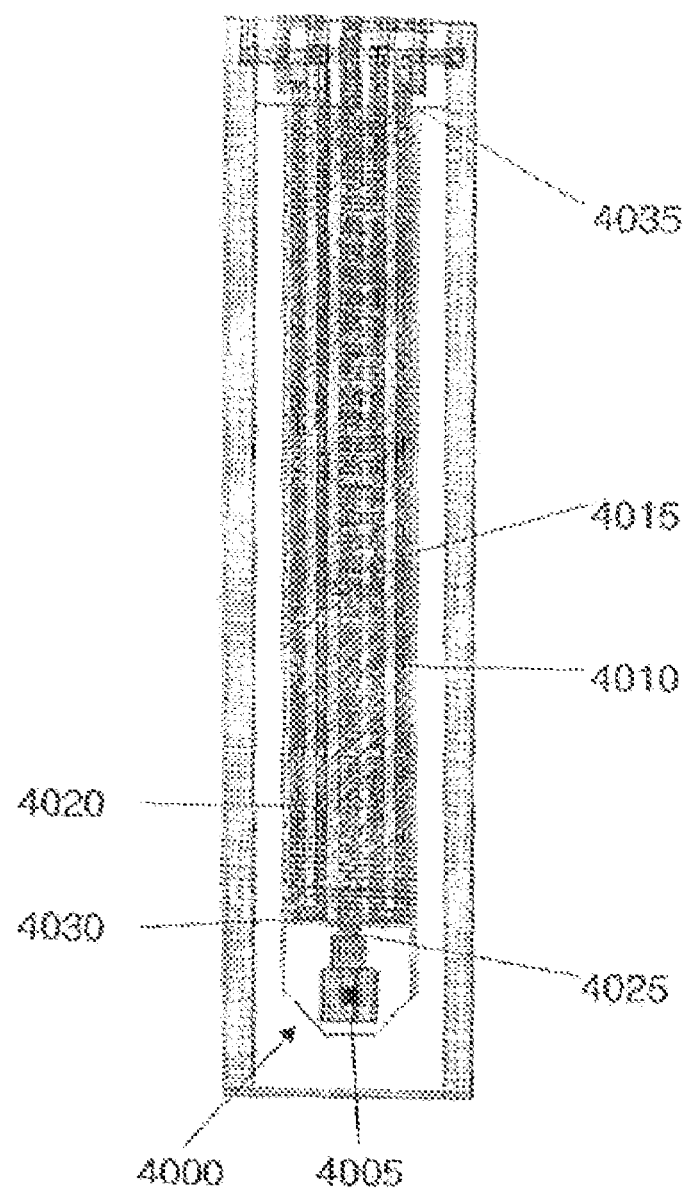
FIG. 40 is an enlarged area of a thermally operated Z actuator with cantilever, conductive head with fine conductive tip, piezoresistive Z position sensor and thermal heater element.
Figure 41:
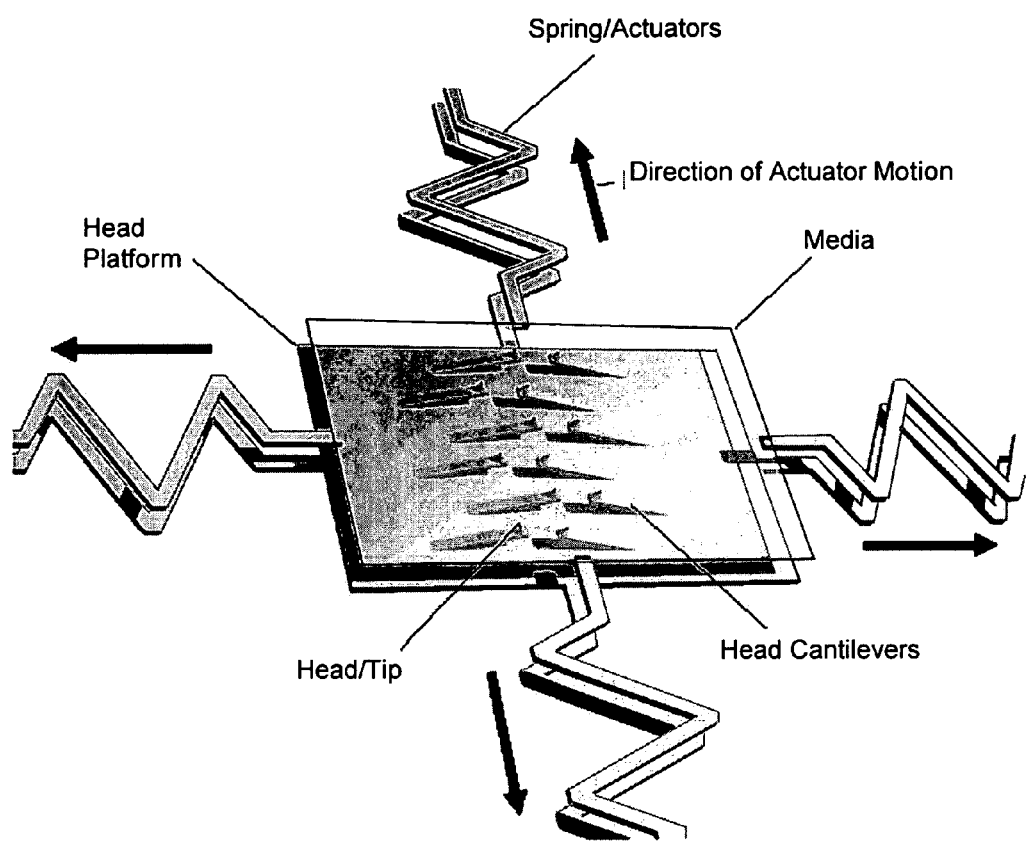
FIG. 41 is an enlarged diagrammatic view of one cell of a molecular array read/write engine with X and Y actuators/springs, and 12 sets of assemblies consisting of Z actuators with cantilevers, conductive heads with fine conductive tips, Z position sensors, movable media consisting of X and Y actuators/springs, and media (shown transparent for clarity)
Figure 42A:
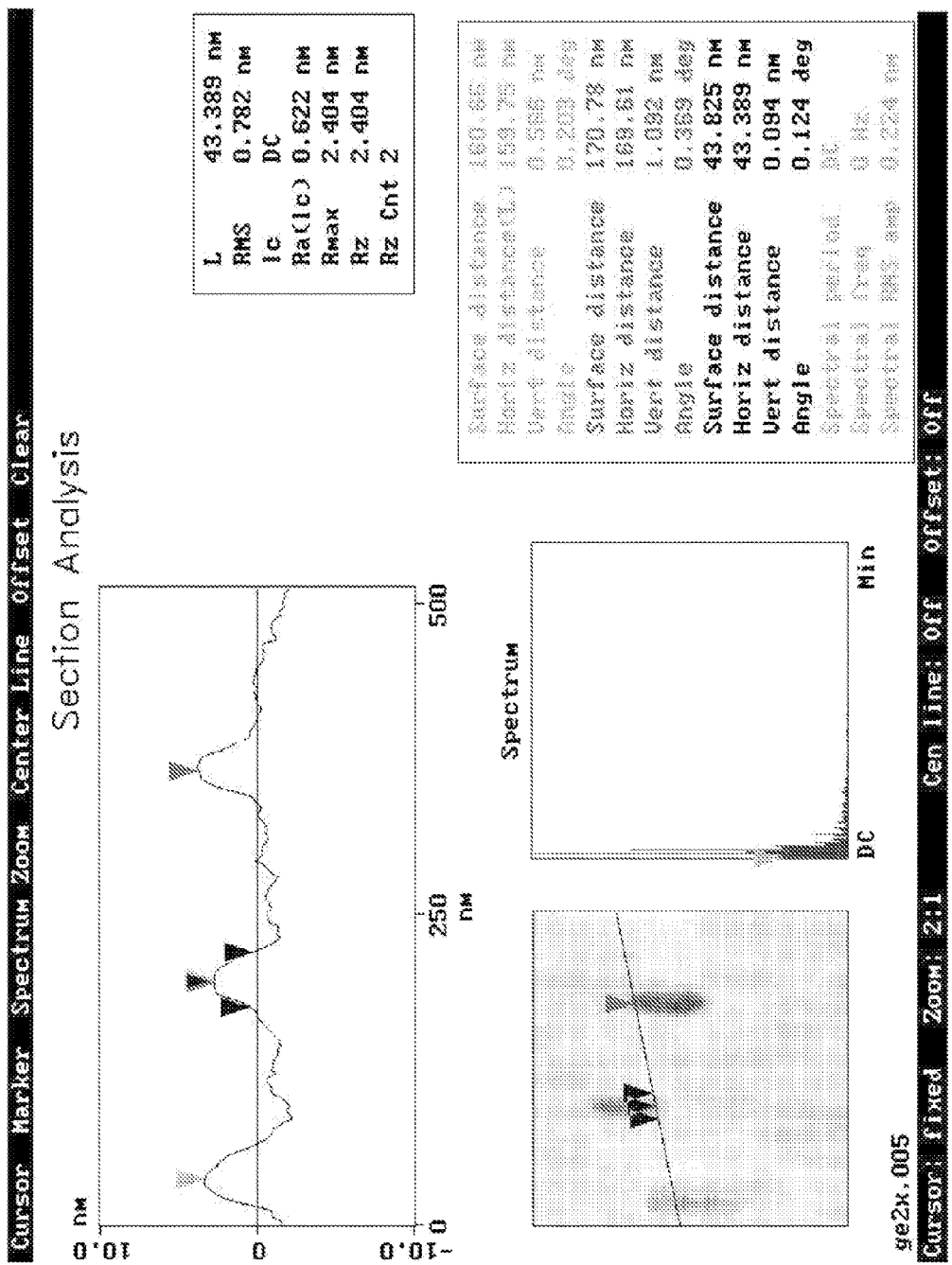
FIG. 42A is view from an atomic force microscope using a conductive tip operated at resonance showing 3 bits written in NO charge storage media with 30-60 nm domains (X and Y axis not same scale)
Figure 42B:
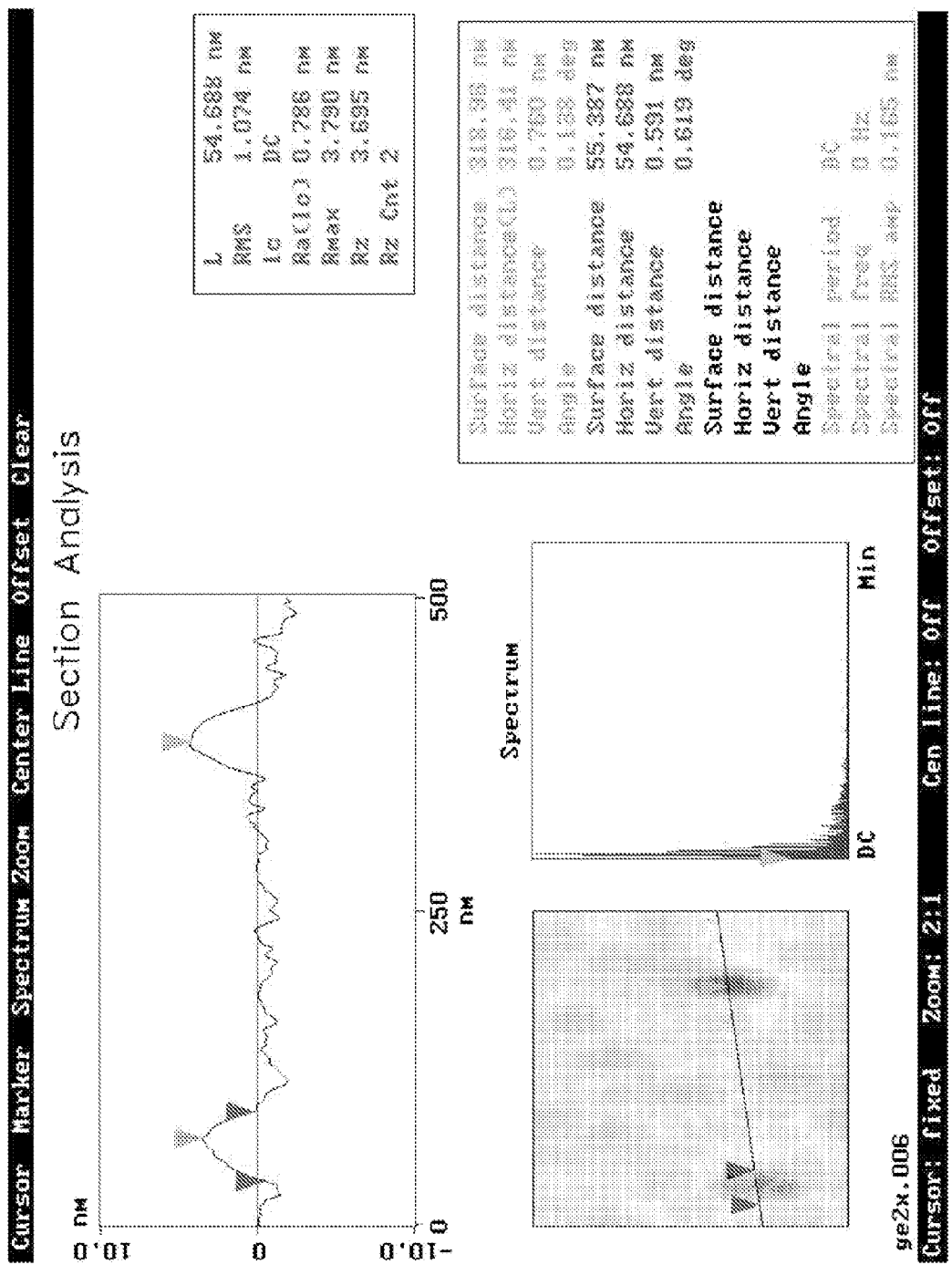
FIG. 42B is same region from 42A with center bit erased using reverse polarity pulse.
Figure 42C:
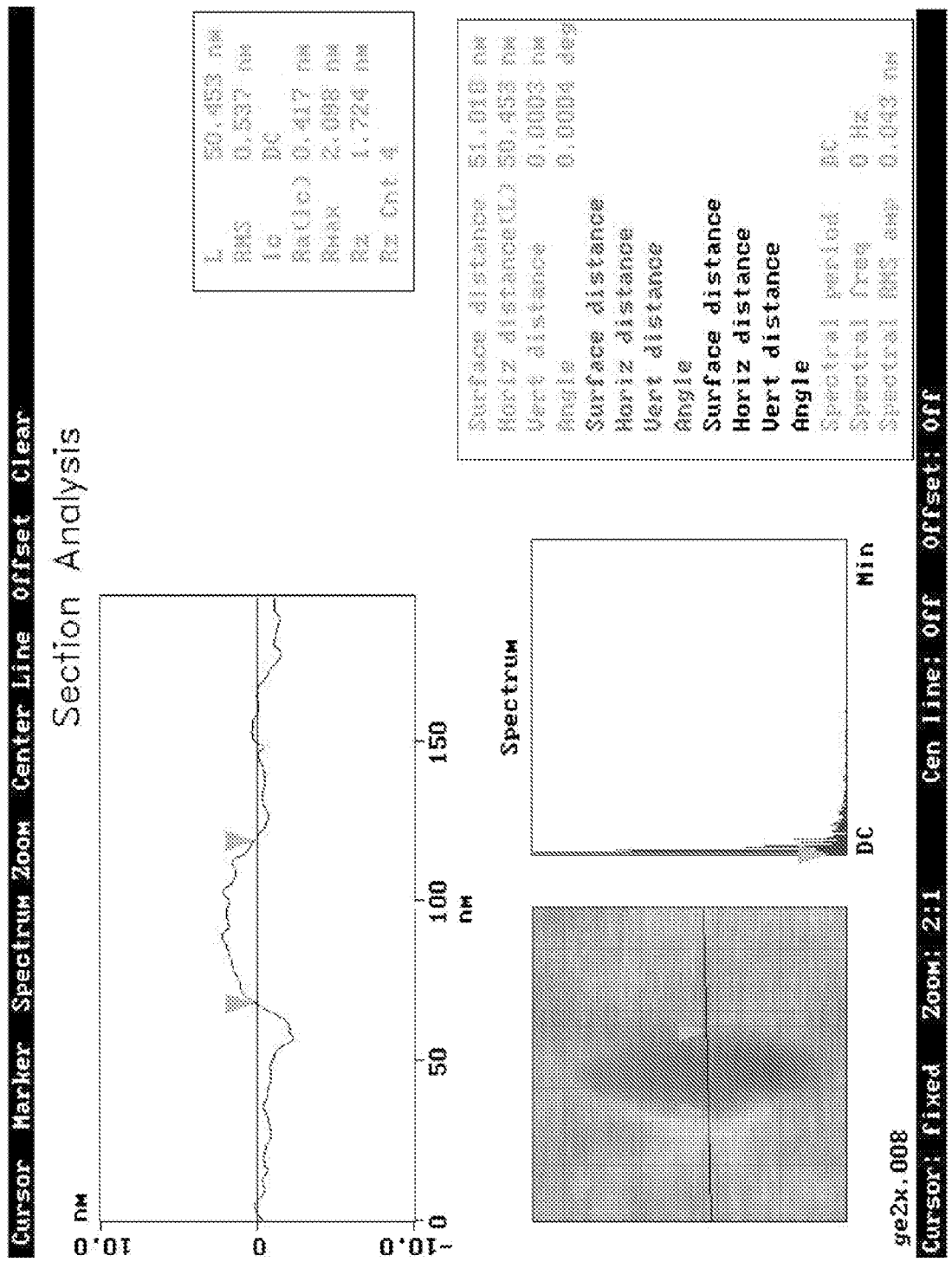
FIG. 42C is a higher magnification view of a written charge storage bit.
Figure 42D:
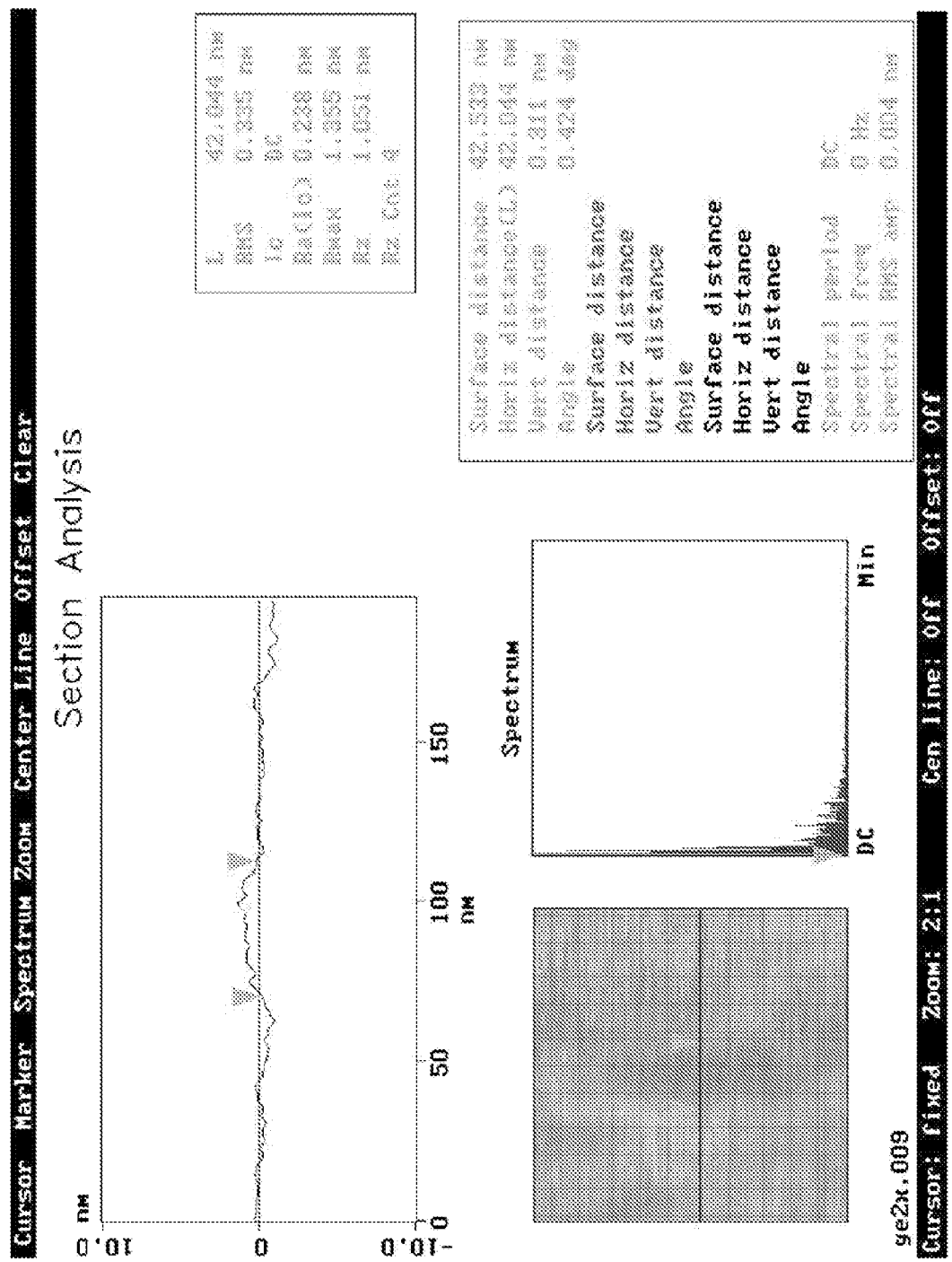
FIG. 42D is a view of region in FIG. 42C after erasure.
Figure 42E:
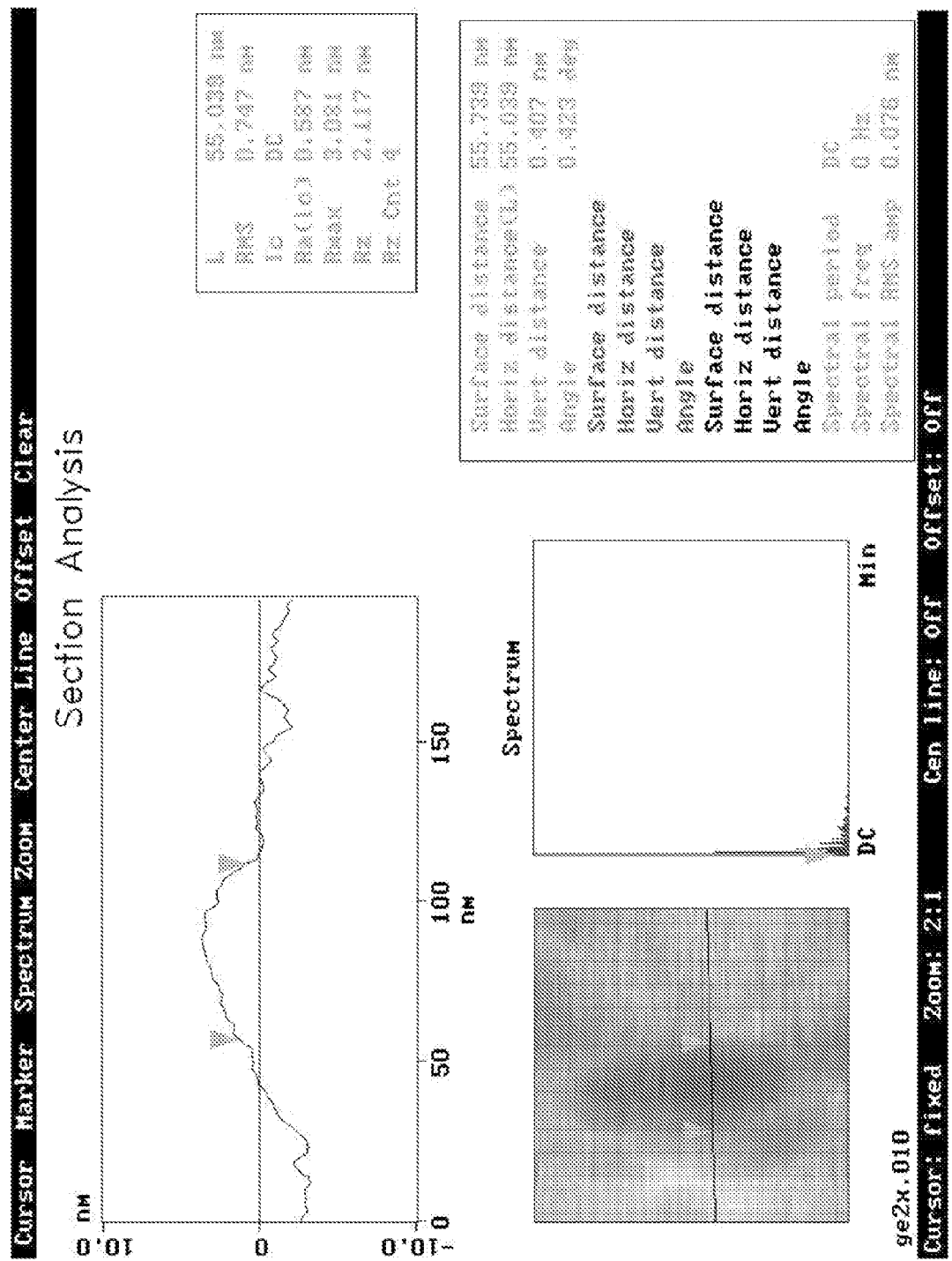
FIG. 42E is a view of region in 42D after re-writing.

The Z actuator assemblies shown in FIG. 40 consist of cantilever block 4000 anchored to base at 4035, sharp tip 4005, electrical connection to tip 4025, heater element 4020, high coefficient of thermal expansion element 4030, piezoresistive sensor 4010 and piezo-resistance thermal compensation sensor 4015. The Z assembly is moved by applying a current through the heater element 4020, which heats thermal expansion element 4030. Not shown is layers of insulating material, typically silicon oxide, which have a much lower coefficient of thermal expansion. As a consequence of the heating, the cantilever bows up (or down) in a generally linear motion of input power to Z tip motion. The piezoresistive element 4010 is placed in stress, which changes its resistance.

The compensation element 4015, made of the same material as the sensor, contains substantial portions of the element in an axis at right angles to the stress, and are thus not subject to the change in resistance due to the motion. However, both elements resistivity will change due to the thermal temperature change from the heating element, and proportionally to the temperature. Thus the change due to temperature can be removed from the data returned from the sensor.

Each of the masks presented throughout this application are actual masks for making the devices. The masks are negatives.

The servo lines are utilized in calibrating movement of the platform (fine tips) and media. The media and platform are first moved to an extreme position, the tips are set to sense, and then the platform and media are moved back from the extreme position until a first servo line is read by the fine tips. As the fine tips move across servo lines, an amount of force required for the movement mechanisms of the media and platform are calculated.

XY Actuators and Springs

Figure 3:
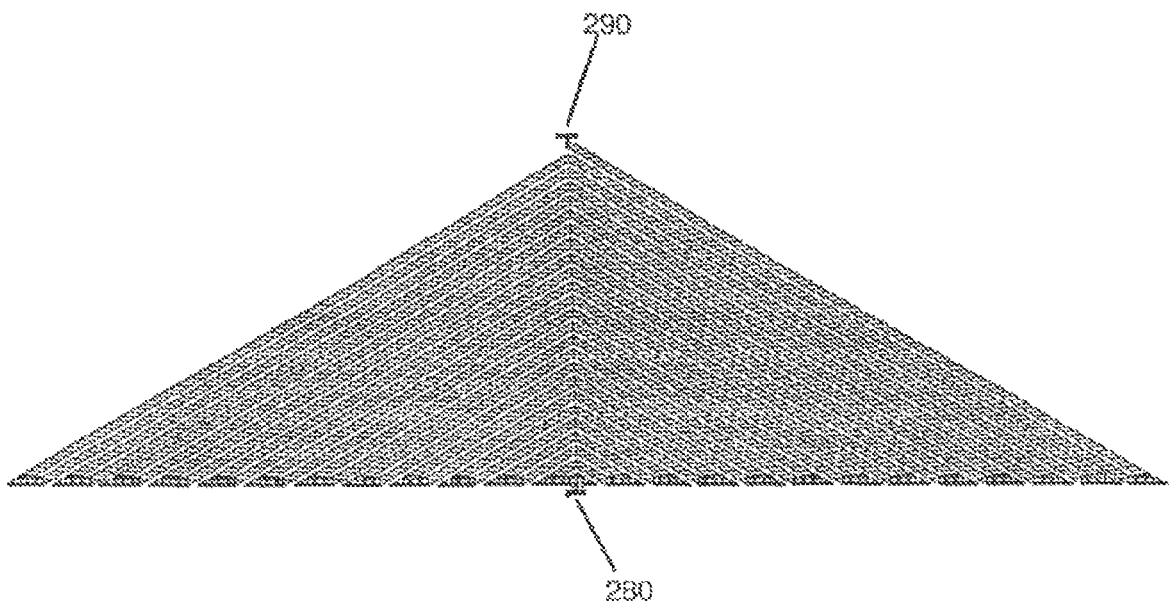
FIG. 3 is an enlarged view of one of the spring/actuator assemblies.

Various actuator and spring configurations are shown in FIG. 3, and FIGS. 5 through 8. In FIG. 3, also shown in FIG. 2, a meander spring is formed with a sandwich of conductors and optional insulators. There may be as few as one conductor. When an electrostatic potential is applied to the conductor, electrostatic repulsion forces the leaves of the spring apart, pushing the moving end 290 of the spring away from the fixed end 280.

Figure 5:
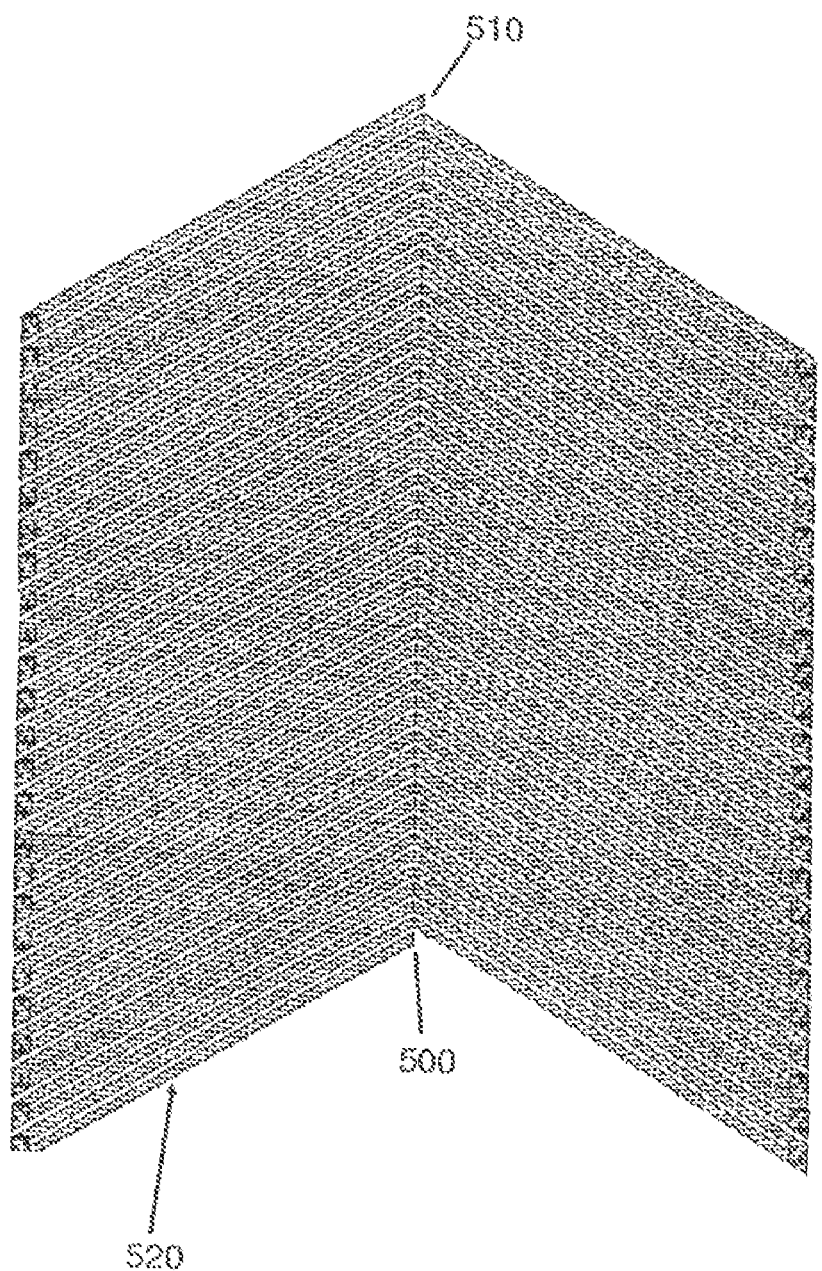
FIG. 5 is an enlarged view of an alternate spring actuator assembly.
Figure 6:
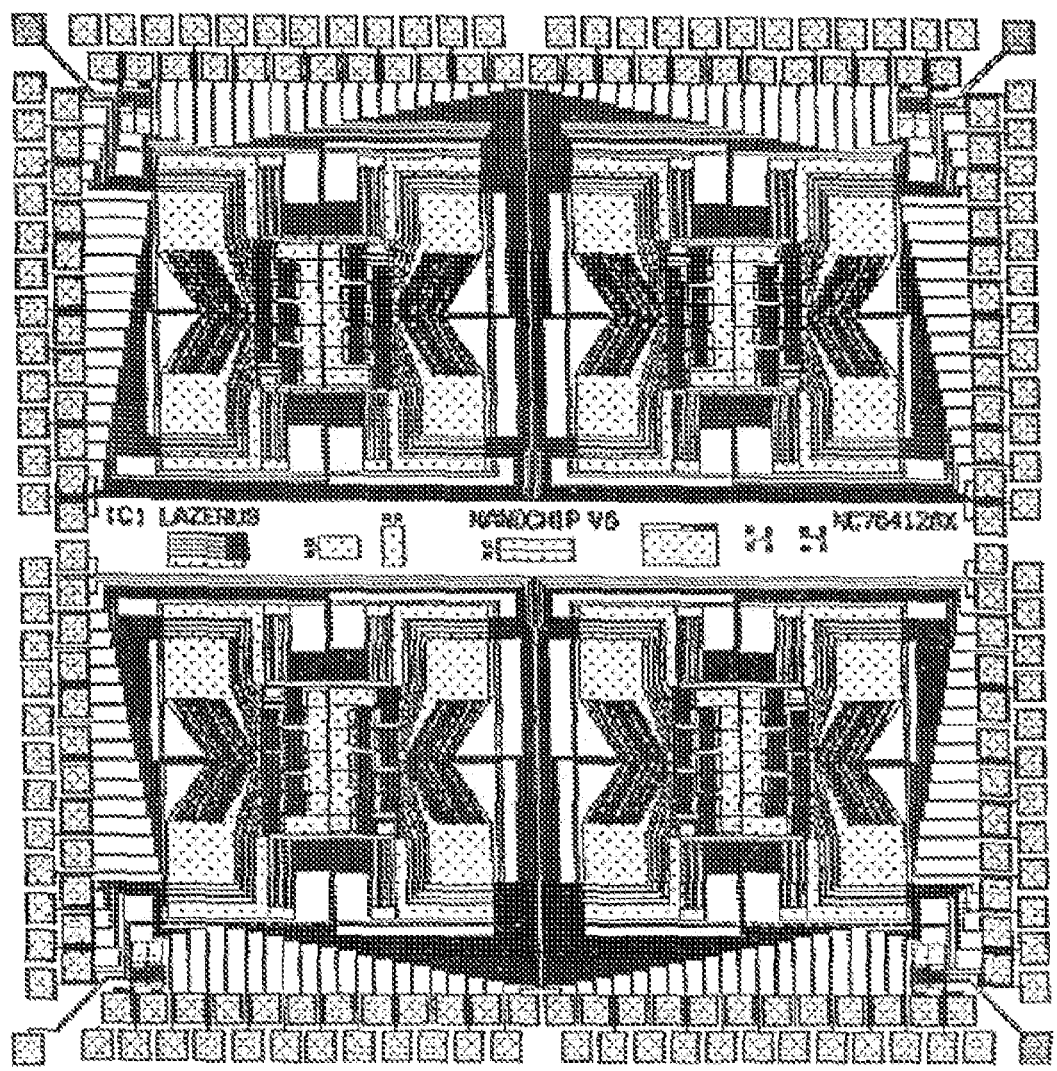
FIG. 6 shows an alternate molecular memory integrated circuit apparatus according to the present invention utilizing four moving platforms each containing 12 fine tips and a single memory surface (positioned over the IC with the media facing down—not shown)

FIG. 5 shows a similar type of spring, which differs in that the length of each row of spring is of the same length. The fixed end is location 500 and the moving end location 510. This has the advantage over spring 3 in having higher compliance per area of spring, but the disadvantage of wasting the space in the triangle of region 520.

Figure 7:
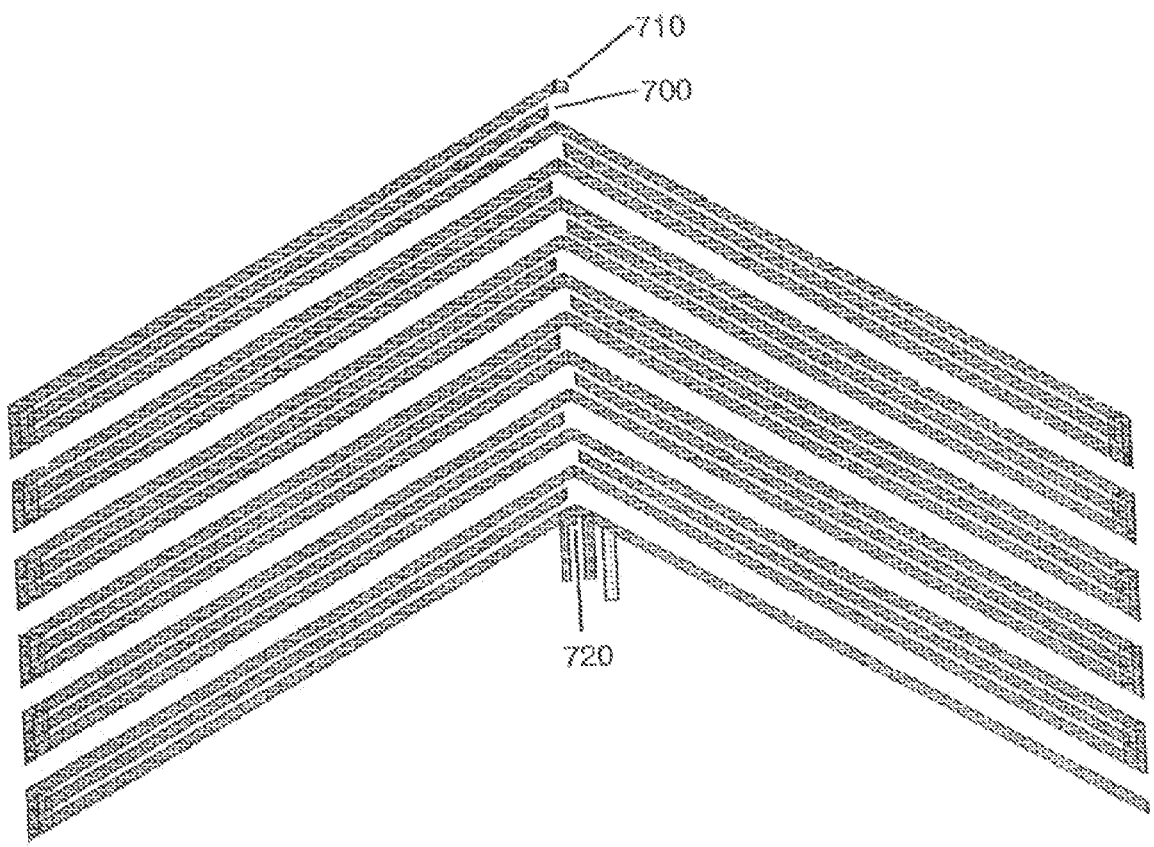
FIG. 7 is an enlarged view of an attraction mode alternate spring actuator assembly.

FIG. 7 is the one embodiment of an actuator/– spring for maximum motion with reasonable compliance in the axis at right angles to the actuation motion. This actuator is also formed from alternating conductors with differing potentials such as between fingers 700 and 710. The actuator is fixed at 720 and moves at end 710.

Figure 8:
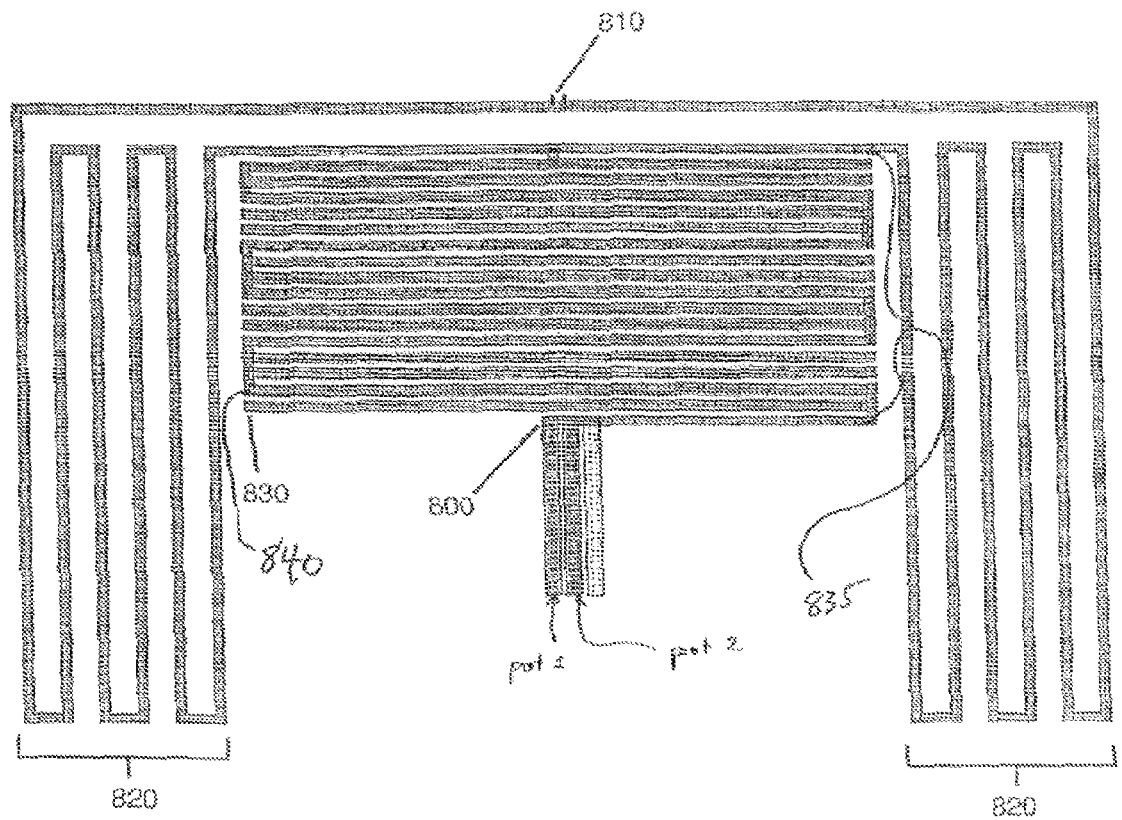
FIG. 8 is an enlarged view of an alternate attraction mode alternate spring actuator assembly with short actuation in the Y axis and long spring movement in the X axis.

FIG. 8 is an embodiment actuator/spring for moderate motion with high compliance in the axis at right angles to the actuation motion. This actuator is designed to maximize stiffness of bending in the Z plane, and when used with another identical spring/– actuator on the opposite side of the platform, forms the major axis of stiffness in the Z plane for the platform. This actuator is also formed from alternating conductors with differing potentials (pot 1, pot 2) running through fingers (830 and 840, for example). The electrostatic force pulling the structure 835 together is a summation of electrostatic forces between adjacent fingers. The actuator is fixed at 800 and moves at end 810.

Figure 14:
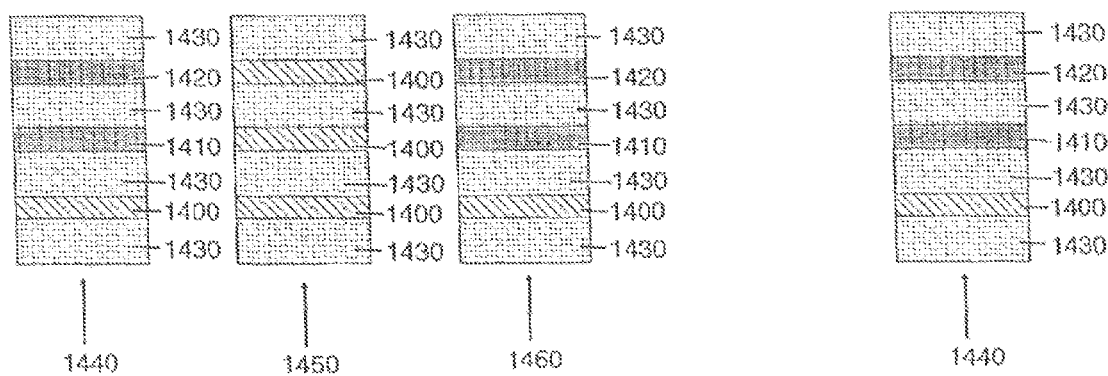
FIG. 14 is a cross section of the actuator portion of the electrostatic actuators 7 and 8.

All of the actuators may optionally contain an additional conductor which may be used either as a driver or as a capacitive sensor for sensing the position of the actuator. An example of the cross section of an embodiment is shown in FIG. 14. Conductors 1400,1410, and 1420 are sandwiched in between insulators 1430. Optionally there will also be insulator on the side walls. Conductors 1400 are set at one potential. Conductors 1410 and optionally 1420 at a different potential. Electrostatic potential will pull the conductor fingers 1440 towards 1450, likewise 1460 towards 1450, thus compressing the actuator. Conductor 1420 or 1410 may optionally be used as a capacitive sensor to determine the position of the actuator by sensing the varying capacitance formed by the varying distance between the conductors as the actuator expands and contracts.

It is important to note that in actuators in FIGS. 3, 5, and 7, the formation of the two sets of conductors formed at an axis some degree away from horizontal (in these cases 30 degrees) forms an improved (lower) compliance in the axis at right angles to the axis of actuation motion.

Alternate Embodiment of XYZ Actuators and Tips

Figure 11:
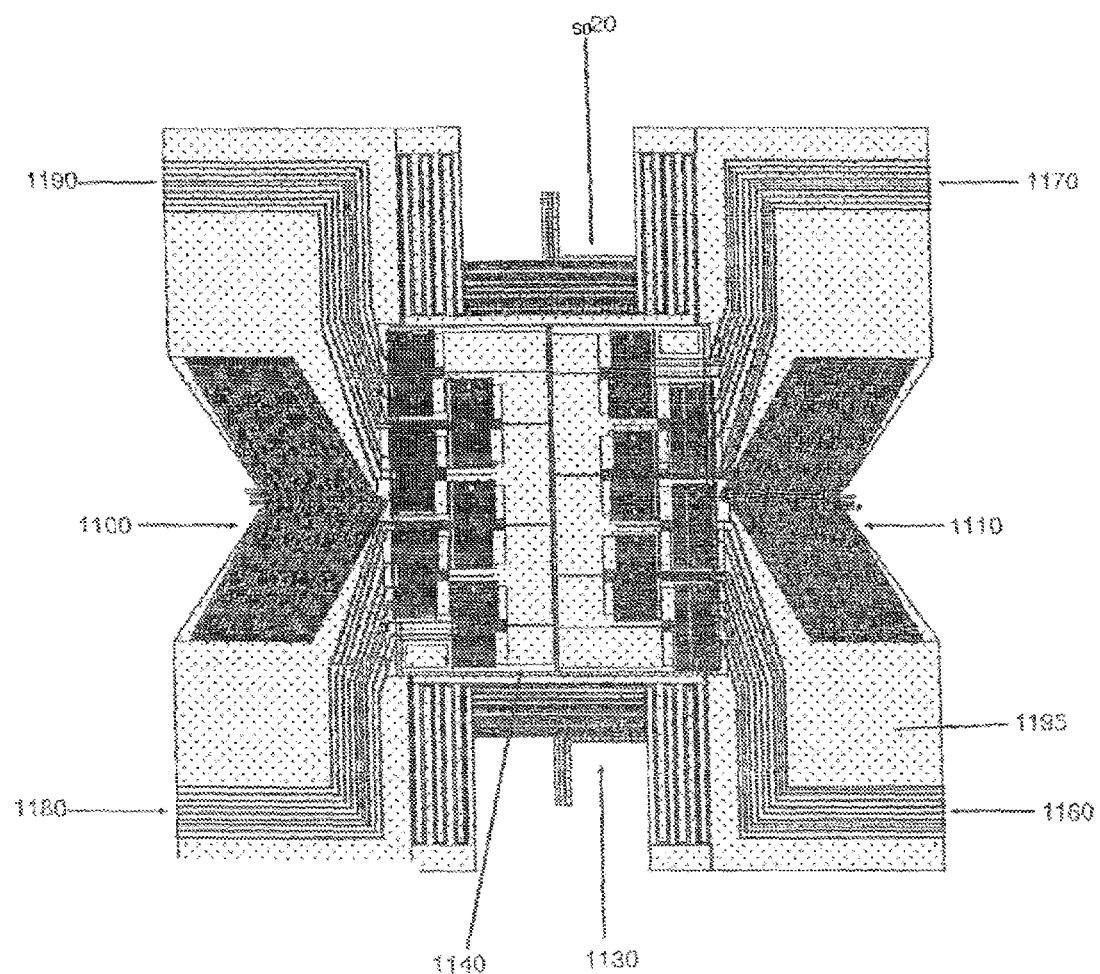
FIG. 11 is an enlarged view of a complete set of 12 Z actuators from FIG. 9, and a pair of actuators from FIGS. 7 and 8, with interconnects.

An alternate embodiment of a cell is shown in FIG. 11. This consists of a pair of X actuators 1100 and 1110, Y actuators 1120 and 1130, twelve Z actuators with tips 1140, and sets of connector conductors 1160-1190. Region 1195 is area etched out under the suspended structure.

Alternate Rotating Media Integrated Circuit

Figure 16:
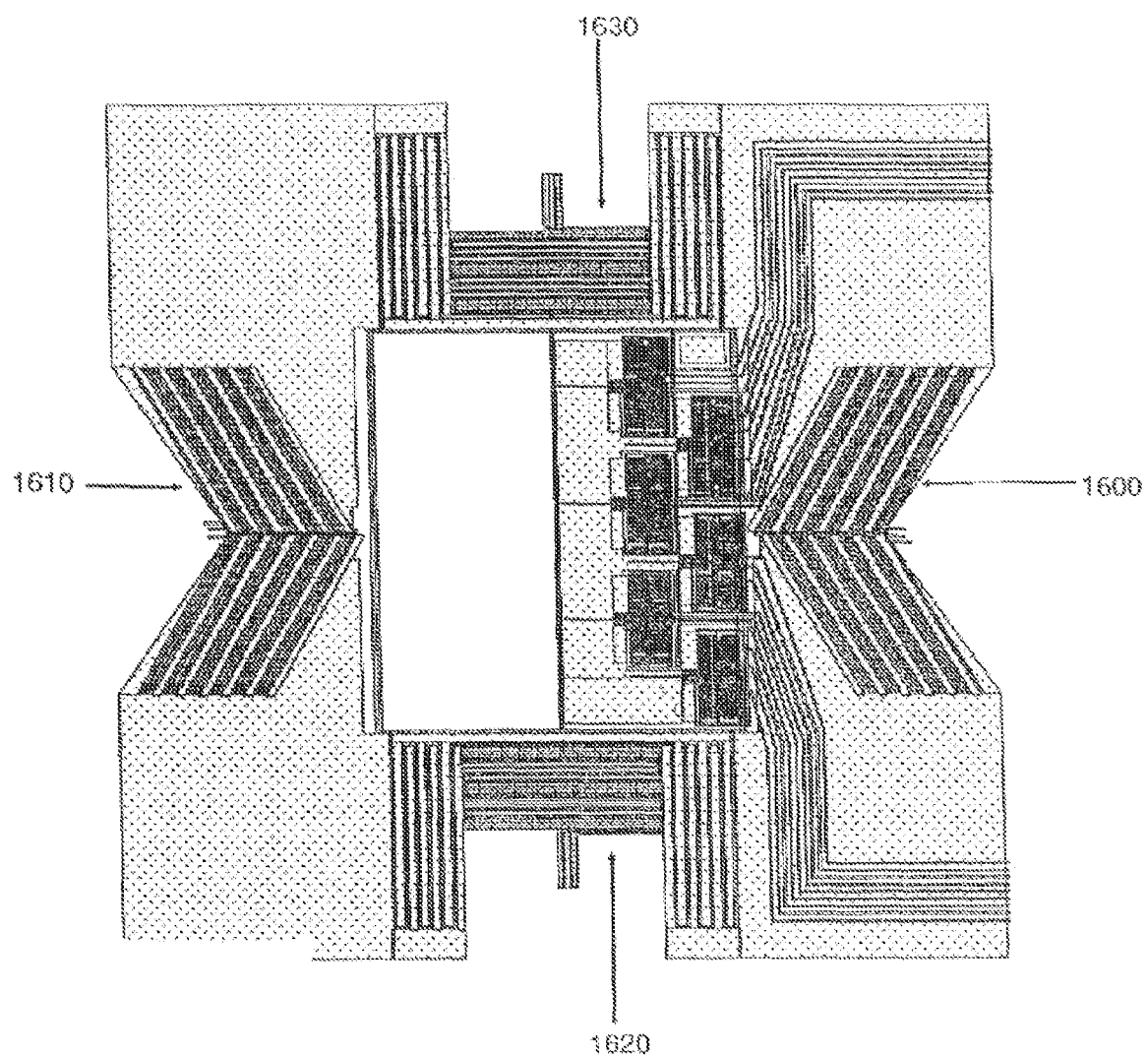
FIG. 16 is an enlarged view of a complete set of 6 Z actuators from FIG. 9, and a pair of actuators from FIGS. 7 and 8, with interconnects, designed for use with the rotating disk memory.
Figure 17:
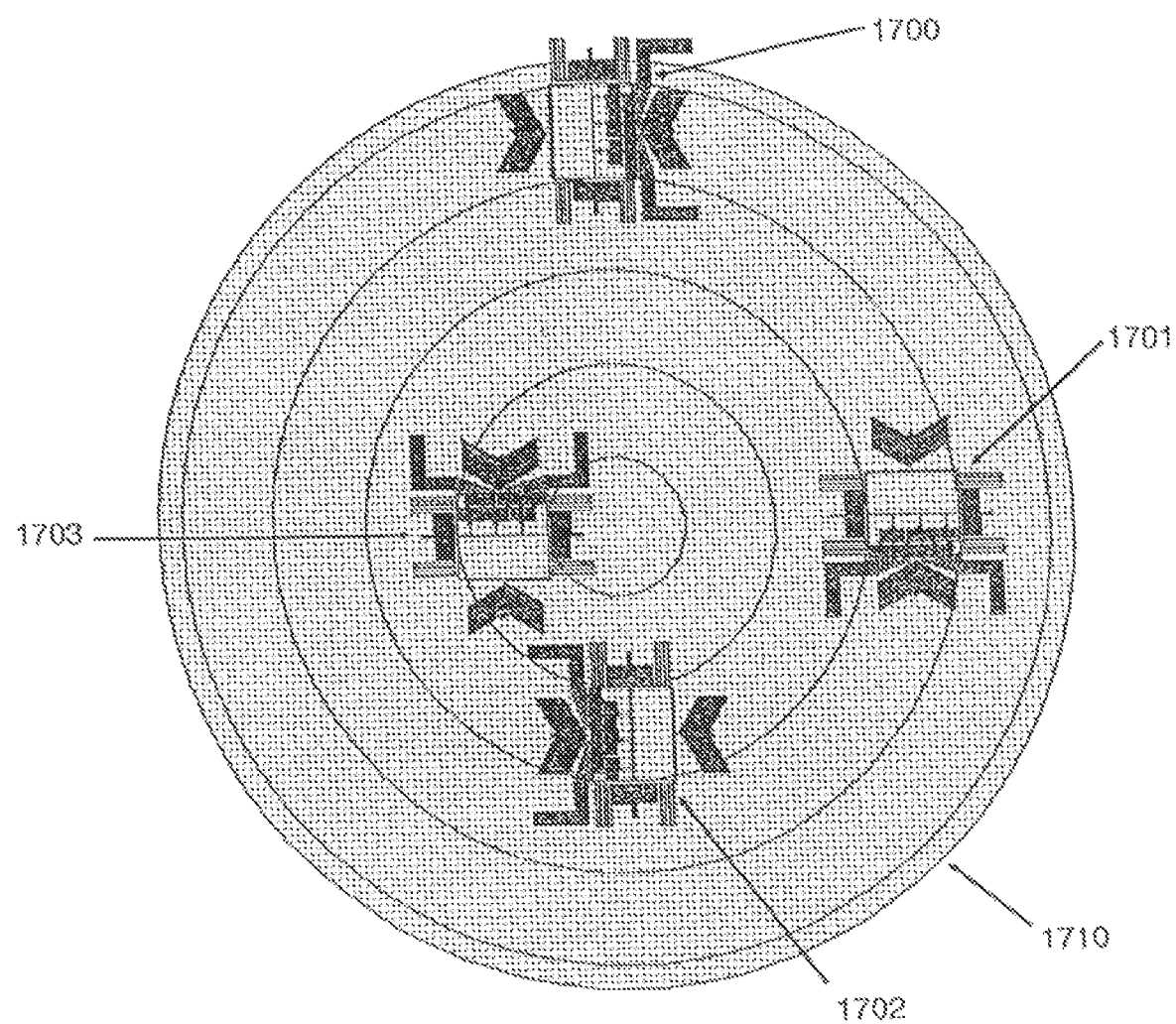
FIG. 17 is an enlarged view of 4 devices from FIG. 16 arrayed around a rotating disk memory.

An alternate version of the Nanochip is the Nanodisk and Nanodrive device shown in FIG. 17. Here, sets of actuators 1700-1703 (shown in FIG. 16) are arrayed around the rotating media Nanodisk 1710. Each actuator platform operates on a set of tracks which are shown within the bounds of the concentric circles in FIG. 17.

By operating the radial positioners 1620 and 1630, individual tracks may be selected. Normally, only one of the 6 tips from each platform is operated at a time. In systems where the disk rotation speed is very slow, rotation speed compensation actuators 1600 and 1610 may not be needed. However, normally the disk media speed is much greater (0.1 to 1 m/sec) than the normal speed with which a conventional non-moving media scan is performed (0.03 m/sec).

For example, in FIG. 17 the disk media might be 4 mm dia. In order to minimize the latency to any piece of data on this disk, the rotation speed should be at least 3600 rpm or 60 revs/sec, for maximum latency of 16 ms. The innermost and outermost useful tracks might be at 1.9 mm and 0.3 mm radius. The corresponding velocities would be 0.7 m/sec and 0.11 m/sec. The actuators 1600 and 1610 are used to apply a speed compensation, by applying a force to the moving platform in a direction the same as the rotation of the disk, causing the relative speed of the platform to the media to be reduced.

The tip is then operated in the same manner as described in the previous application, or in a manner described in this application with regard to different types of tips and media. When the maximum travel of the compensator has been reached, the tips are retracted, the compensators moved to the opposite extreme position, and the process repeated.

In an alternate version, there are multiple tip assemblies arrayed around the disk equally spaced and multiple sets of tips designed to access the same tracks. This allows the access time to any location on the disk to be reduced by a factor n where n is the number of sets of tips for each track. Or the rotation speed may be slowed to the point where the rotation speed compensators are not needed. The number of tips also could be smaller near the hub of the disk, as the linear velocity is slower near the hub.

Figure 29:
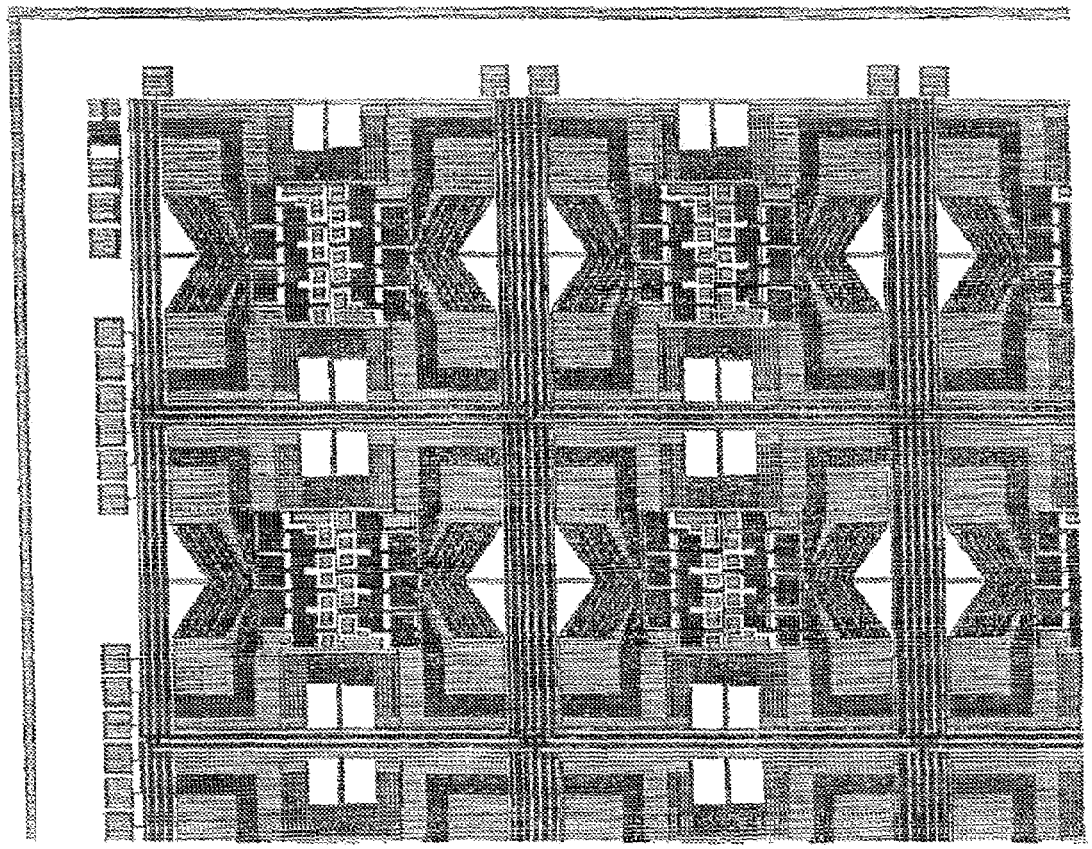
FIG. 29 is an enlarged view of a corner of an array of actuators from FIG. 16 designed with row and column controls and input/output.

Alternate Embodiment Using Array of Actuators with Row and Column Controls and Input/Output An alternate embodiment is shown in FIG. 29. In the following, the use of row and column may be transposed. In this embodiment, a two dimensional array of actuators, each with single or multiple tips, are arrayed. The arrays are connected such that X and Y controls for each platform can be driven individually, by connecting one set of the pair of lines to a common connection for each row, and the opposite of the pair to a common line for each row.

Alternately, drive electronics may be integrated for each platform. Eliminating the need for active electronics on the MARE greatly reduces the number of steps to fabricate the MARE, thus reducing the cost and time to manufacture. Although only one column may be driven at any instant, the inherent capacitance of the system, plus the inertia of the components, allows each section to be multiplexed. Alternately all platforms can be connected electrically to a common set of X and Y controls, with the disadvantage that feedback for each platform is not possible, thus reducing accuracy and thus bit density.

Groups of actuators along a column have a common Z drive connection (ZDcolm). Sets of controls along rows provide the other Z drive connection (ZDrown). Applying a large differential voltage between Zdcolm and ZDrown effectively enables the Z actuation of the intersecting row and column controls on the actuators. Alternately, if all actuators along a single column are enabled with one column drive and all row drives on, all Z actuators on that column will be enabled. Each individual Z drive may have slightly different values to accommodate differing height controls.

Tips of the actuators are also connected in common in sets along rows. When used in tunneling or resistive mode, the data under tips along a column may be read out via the resistance between the tip and the substrate. So all tips under a column may be read or written simultaneously and individually.

In an alternate embodiment, the set of X and Y controls may be split into multiple banks, to allow simultaneous access to multiple blocks of data. The row and column arrangement may be maintained, or additional and separate sets of rows and columns for each bank provided.

In an alternate embodiment, the column enables are connected such that one "column" enable only enables one tip from each actuator platform, and the enable is spread over multiple platforms such that effectively a large number of tips are accessed simultaneously. The advantage of this embodiment is most pronounced when the Z actuators are used in an oscillating AFM mode, where the Z cantilevers are vibrating at a high frequency. This allows only one cantilever vibrating per platform to be operating, reducing problems associated with mechanical coupling between cantilevers.

Performing a Write Operation on Apparatus FIG. 1

To perform a write operation, a control voltage positioning signal is applied either through the I/O pads 10 or separate actuator control input pads. The control voltage is enabled for input by enabling input enable 20 and disabling output enable 30. Four (or three) sets of control voltages, one for each spring/actuator, generate a force which creates a motion of the springs/actuators and subsequently the suspended platform.

This motion is typically designed to first move the platform to a start scan position, nominally an extreme in X or Y. For this discussion, we will use extreme left in X for start position. The Y position will determine the track to be written. A control set is then applied to move the platform, nominally at maximum acceleration, to get the platform up to the nominal scan speed (typically somewhat lower than maximum velocity). Once nominal velocity is achieved (for example, $3 \times 10^{-2}$ m/sec), the tip actuator assemblies are instructed to raise the tip assemblies towards the media surface. While in this mode, the tip is in a read mode, sensing track, sector, and data information.

When the correct track with optional sector position has been reached, as determined by the tip in read mode, the operation of the tip is switched to write mode. When in write mode, the tip bias voltage is alternated between a sense read mode, where the bias voltage is of a low enough value that no change is effected to the memory surface, and a write mode, where the bias voltage is of sufficient intensity to effect a change to the memory surface.

During the sense read mode state, the current between the tip and the memory is measured. If the current has increased, this indicates the tip is closer to the memory surface. Conversely, if the current drops, this indicates the tip is further from the memory surface. This information is processed by the computer and fed to the Z axis positioner to raise or lower the tip to maintain the height required by a particular memory technique described below. The current information in one embodiment is measured via a simple 2 CMOS transistor amplifier, with typical Beta of 50. In the current sensing mode, the tip is first biased at a nominal input voltage such that the output voltage of the amplifier is in a mid-range between + and − supplies.

As the small current starts to flow, depending on the bias of the media, the output of the sense amplifier will begin to rise or fall. This indicates the tip is approaching the media. In an alternate media embodiment, the information is stored as an electronic charge. When the tip approaches the media, the charge is transferred to the tip capacitance. This charge is amplified by the sense amplifier transistors and is indicated by a sudden change in the output voltage of the amplifier, indicating the charge has been transferred to the tip and that the tip is in proximity to the media.

The data portion of the memory is written with an alternating control voltage such that the data pattern will never match a track or sector pattern, and additionally always alternates from one state to another within several data bit states. An example of such a pattern form is non-return to zero, referred to as NRZ. This form also has the advantage of supplying self clocking information when in read mode (the NRZ format has transitions at regular intervals which is utilized for clocking). Also, the state is guaranteed to return to a read sense state often enough to obtain necessary surface height information.

In the capacitive charge storage media method, the above method destroys the data during read, thus requires a subsequent re-write.

In an alternate embodiment, data is stored as an electronic charge on a nitride-oxide-substrate (or NOS) structure. In this embodiment, charge is written by positioning the tip near or on the media (nitride) surface. A voltage pulse of sufficient amplitude to tunnel through the nitride is applied to the tip. A subsequent charge is then stored on the oxide, which then forms a depletion layer in the substrate region. This depletion region modifies the effective capacitance of the area below the tip in effect lowering the capacitance. To read this change in capacitance, a sensitive capacitance measuring circuit is employed. This embodiment has the advantage of not requiring that data bits be re-written after each read.

Many of the media forms can be improved with an additional set of processing steps which effectively alter the shape of the media surface from a continuous sheet to a 2 dimensional array of discrete, small regions. This can be created by use of interference patterns from a laser beam which is reflected back on itself, which effectively creates a grid of spacing ½ the wavelength of the laser source. In one axis this forms spaced lines. Formed at right angles to the first set a grid pattern is formed. This can be used to expose a thin resist, which can then be used to subsequently pattern the media. Use of excimer lasers with wavelengths of 157 nm yields a pattern of 78 nm spacing as an example.

Alternately, this can be achieved by first depositing a thin layer of a metal such as gold on the media surface. The media is then slowly heated to cause the thin metal to form beaded regions with no metal in between the beads. These beads then effectively form a mask. An anisotropic etch, typically with reactive ion etching (RIE) or similar dry etching technique, removes the material in the open areas between the beads.

In an alternate media embodiment, the media consists of structures forming quantum dots. These may be formed using multiple quantum well (MQW) techniques. The media is written by applying a voltage pulse sufficient to change the electron state energy in the trapped quantum well regions.

Manufacturing Techniques

The apparatus described herein are primarily designed to be fabricated with semiconductor processing techniques. A typical apparatus would be first fabricated with a CMOS or BiCMOS fabrication process. Then, the wafer or die would be placed in a silicon etchant and released by a post process etch using wet chemicals such as KOH (potassium hydroxide) or TMAH (tetra-methyl ammonium hydroxide) or dry etching using RIE or plasma etching in an isotropic mode such that etching proceeds under the moving structures.

Alternately, the devices can be released by etching in a vapor of XeF2 (xenon diflouride) or RIE in SF6 (sulfur hexaflouride). Active electronics would be protected by glass or oxide layers. The tips may be fashioned from the single crystal Si in the substrate, or from a low temperature deposited silicon, then protected by a thin coating impervious to the final release etchant. In another alternative, the tips may be fabricated by FIB techniques.

However, in the past, most Micro Electric Mechanical Systems (MEMS) structures have been fabricated with polysilicon or single crystal silicon. These have a high Young's modulus and tend to have lower residual biases in the thin film layers than materials such as oxide and aluminum. Most of the spring structures described herein may be fabricated from silicon or polysilicon, given oxide completely surrounding all structures, and using a final silicon etch.

However, materials such as aluminum and oxide for the MEMS structures, as these have lower Youngs's modulus by a wide margin (69×109 instead of 170×109), aluminum has much lower resistance, and the micromechanical structures can be fabricated out of the same steps which are normally used for the metal interconnects and intermetal dielectrics. Unfortunately, most processes tend to leave quite large residual biases in these materials. But fortunately, the direction of the biases for different layers tend to be different. By careful tailoring of multi-layer films and their biases, and one or more additional process steps, the sum of the residual stresses can be reduced to a very low value.

Figure 21:
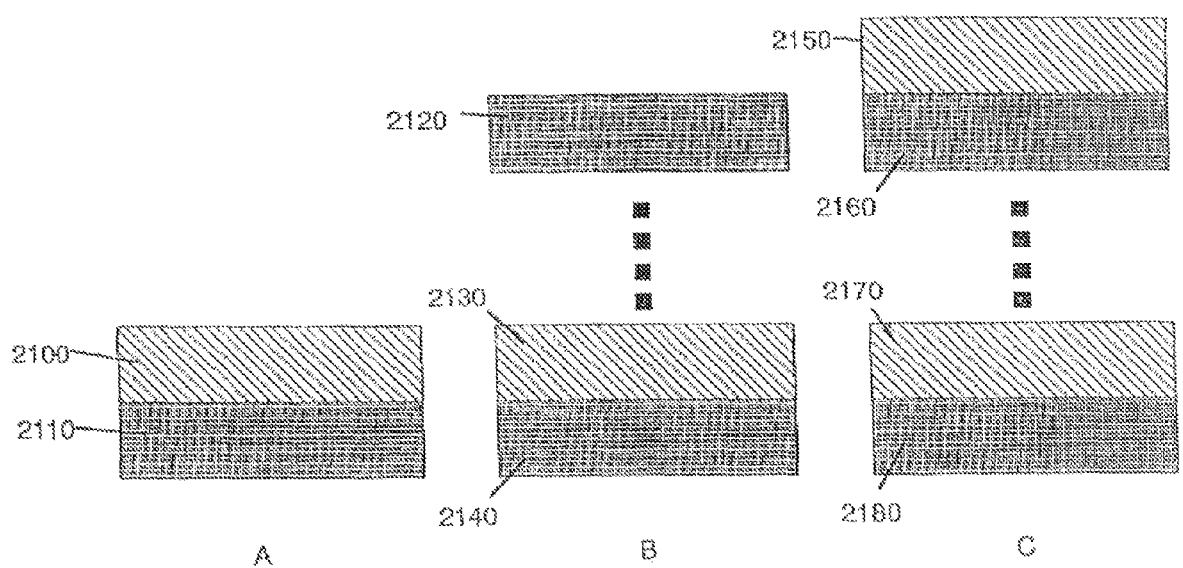
FIG. 21 is three views of thin film multi-layers before processing to reduce stress bias.
Figure 22:
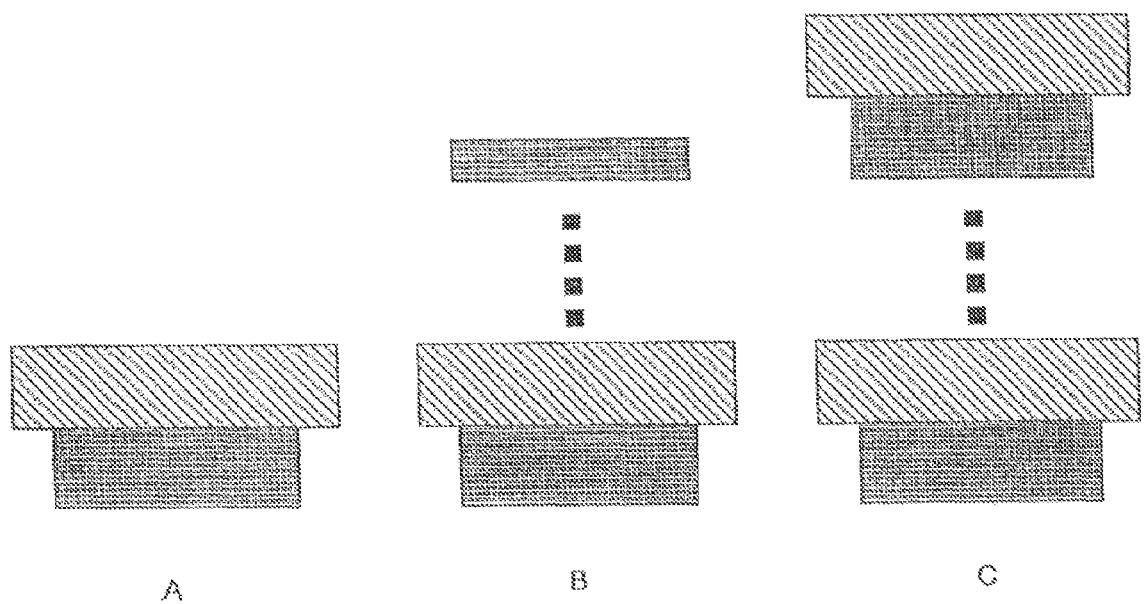
FIG. 22 is three views of thin film multi-layers after processing to reduce stress bias.

FIG. 21 shows 3 examples of multi-layer films. FIG. 21A shows a two layer multi-layer film. If one layer has positive stress T+ and the other layer has negative stress T−, and T++T−>0, by thinning T+, the total stress can be reduced to near zero.

If one layer has negative stress T− and the other layer has positive stress T+, and T++T−<0, by thinning T+, the total stress can be reduced to near zero. The thinning may be performed isotropically or anisotropically, depending on which layers need to be affected. With 3 or more layer films, such as in FIGS. 21B and 21C, if the sum of the positive stress films is TN+, and the sum of the negative stress films is TN−, and TN++TN−>0, by thinning TN+ the sum of stresses can be reduced. If the sum of the positive stress films is TN+, and the sum of the negative stress films is TN−, and TN++TN−<0, by thinning TN− the sum of stresses can be reduced.

As an example, typically 2110, 2120, 2140, 2160, 2180 would be oxide, 2100, 2130, 2150, 2170 would be aluminum. By etching the oxide with HF or Buffered HF, the results of thinning would look like 22*a-c*. Alternately, the total stress bias may be reduced by a post annealing step.

Compensation for Service Defects

The present invention may use any of the techniques previously described in the previous patent application for compensating for surface defects. Additionally, by virtue of the large number of tips, the media may be scanned in a much shorter time than might normally be available in a single head system.

Fine Tip Sharpening

Similarly, fine tip sharpening techniques, such as those described in Rust et al, U.S. Pat. No. 5,453,970, may additionally be used to keep the fine tips clear of debris.

Media

Any one of the media described in the previous application may be used with the current apparatus when used in the current mode of operating the tip. In one embodiment of the re-writable media, a charge is stored on an insulator above a conductor. This is preferably an insulator with a high dielectric coefficient, and extremely low leakage. Examples of dielectrics are silicon dioxide, titanium dioxide, and piezoelectric materials such as PZT. Alternately the charge may be stored in a region below the surface, such as with NOS materials such as silicon nitride over silicon oxide on silicon substrate.

In an alternate capacitive media such as NOS, an alternate read technique is to use a capacitive bridge amplifier which senses the small difference in capacitance on one of the legs of a bridge (the capacitor being the NOS data bit). This has the advantage of not destroying the data bit during read. Unfortunately, the sense electronics are considerably more complicated.

Method for Data Compression

Figure 27:
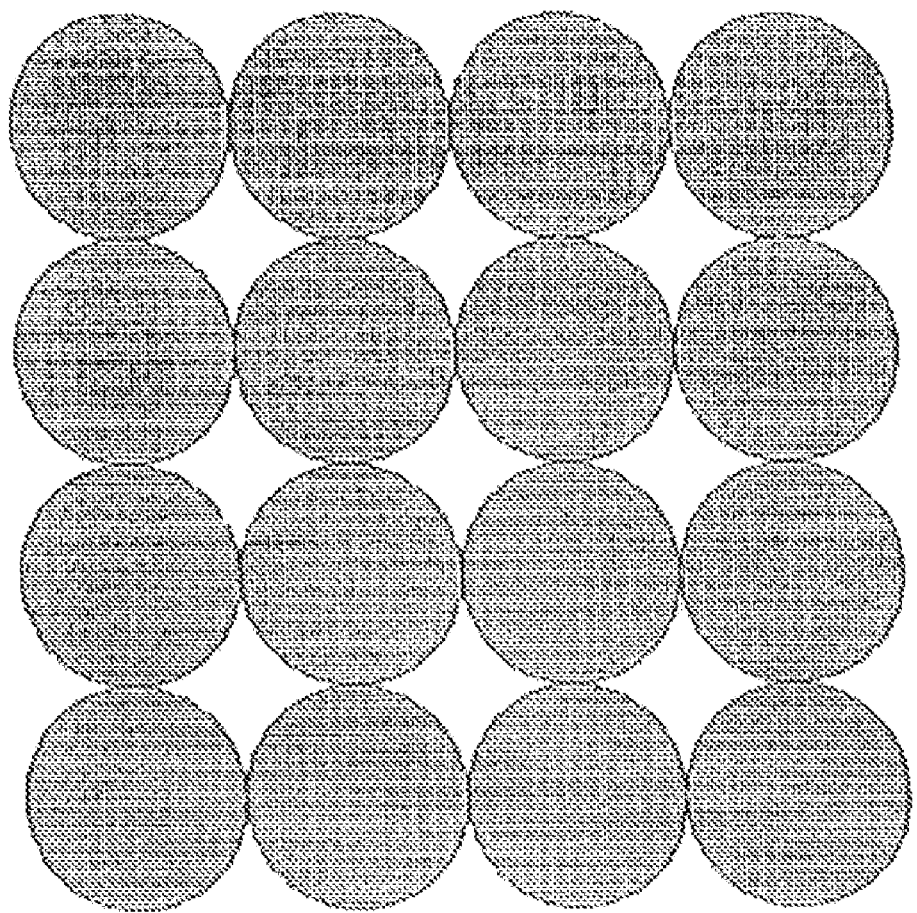
FIG. 27 is an enlarged view of a regular rectangular data storage scheme.
Figure 28:
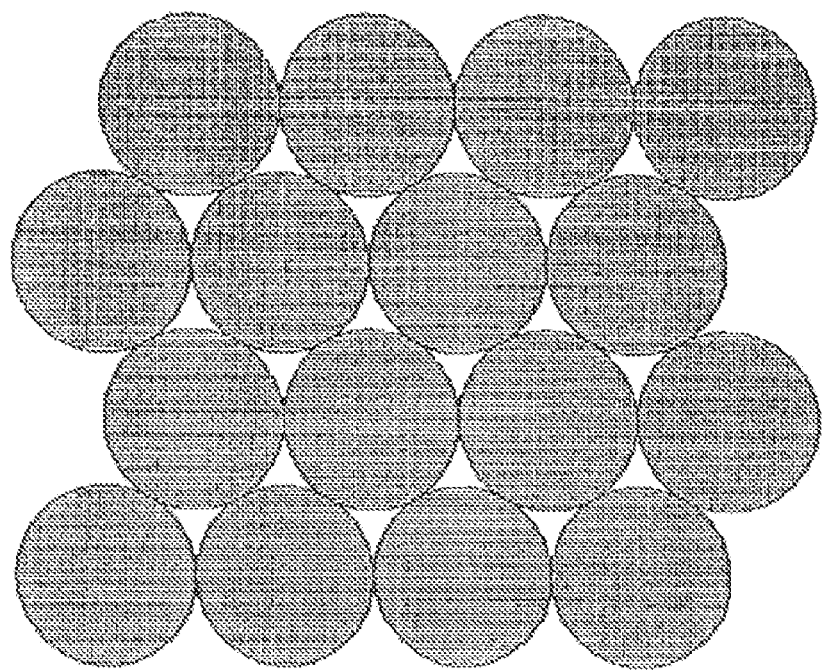
FIG. 28 is an enlarged view of a honeycomb data storage scheme.

FIG. 27 shows a typical configuration for the orientation of stored bits. FIG. 28 shows a honeycomb data storage configuration which provides a 15% storage improvement. The area of a bit changes from: D—diameter of bit rectangular array area: D2 honeycomb array area: D2 tan(pi/3)/2 or approx. 0.86D2 The spacing from center to center remains the same, so Gaussian distribution bit shapes all can benefit from this compaction method.

Mare as Lithography Apparatus

The current contenders for production scale lithography for the under 0.25 u regime are X-ray—costly and still limited to perhaps 0.1 u, and ion beam projection—a still experimental system again with probable limits of 0.1 u. Both of these systems also are for exposure only—they have no inherent metrology capability for analyzing the results. The MARE portion of the Nanochip is itself a high speed lithography instrument with up to 10 nm resolution. The Nanochips inherent parallelism will allow the patterning of a 6" wafer in approx. 8 minutes (5×5 cm Nanochip, 1 Mhz/tip data rate, 30 nm line width).

In addition, the Nanochip lithography instrument will allow the patterning to be checked for accuracy by the same instrument. This can be used to identify particle defects and used as a gauge to eliminate unnecessary processing. Also, the data for the mask remains digitally represented—there is no need for an intermediate mask to be generated.

Additionally, by scanning the tip in the presence of a bistable gas or liquid medium which changes to a solid state when in the field of the voltage/current spike produced by the tip region, materials may be deposited on a surface a layer at a time and built up to construct three dimensional geometries. STMs have been used to pattern photoresist and form very fine geometries (10 nm lines), additionally silicon dioxide has been formed in silicon, which can then be used as a mask for additional semiconductor processing steps.

The MARE and molecular media technologies in this application will also be a primary enabling force for flat-panel display fabrication for field emission displays. The diamond media forms donut shaped hillocks of extremely fine dimension. These can be used as field emitters for field-emission based flat panel displays.

In one embodiment, the media is constructed of a base from any material having charge storage capability. For example, any material that stores electrons when a charge is applied. The charge storage capabilities are then enhanced by augmentation of grain boundaries of the media material. This augmentation is performed by applying material coating (texture coating, PMMA, for example) to the surface of the media material, and then removing the coating. Pit markings remain that augment the grain boundaries of the media material, and enhance the charge storage capabilities of the media. Examples of the augmented grain boundaries can be seen in the photographs of FIGS. 42A-42E.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. Portions of the invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to program a computer to perform any of the processes of the present invention.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software supporting and controlling devices and mechanisms according to the present invention, as described herein.

Obviously, numerous modifications and variations of the present invention are possible in light of the above teachings.

The invention claimed is:

1. A system for storing information, comprising:
    a media;
    a tip adapted to write information to and read information from said media;
    a media movement mechanism attached to said media and configured to move said media in response to media control signals; and
    a capacitive sensor configured to detect an amount of relative movement of said media and said tip in at least an x-axis direction, the capacitive sensor including:
        a fixed comb having fingers protruding in an x-axis direction,
        a moving comb connected having fingers protruding in an x-axis direction; and
        an electrical path connected to said fixed comb and an electrical path connected to said moving comb;
    wherein relative movement in at least the x-axis direction is determined at least in pan on a change in capacitance between said fixed and moving combs of said capacitive sensor.

2. The system of claim 1, wherein:
    the media includes a nitride recording layer; and
    the tip is adapted to cause one of electrons and electron holes to be formed in the nitride recording layer.

3. The system of claim 1, wherein:
    the media includes PZT; and
    the tip is adapted to cause an anomaly within the PZT.

4. The system of claim 1, wherein the fingers of the fixed comb are interleaved with the fingers of the moving comb.

5. The system of claim 1, wherein:
    the tip extends toward the media from a cantilever; and
    the cantilever is adapted to be actuated in a z-direction by applying an electrostatic force to the cantilever.

6. The system of claim 1, wherein the capacitive sensor is a first capacitive sensor; and further comprising:
a second capacitive sensor configured to detect an amount of relative movement of said media and said tip in at least a y-axis direction, the second capacitive sensor including:
a fixed comb having fingers protruding in a y-axis direction,
a moving comb connected having fingers protruding in a y-axis direction; and
an electrical path connected to said fixed comb and an electrical path connected to said moving comb;
wherein relative movement in at least the y-axis direction is determined at least in part on a change in capacitance between said fixed and moving combs of said second capacitive sensor.

7. The system of claim 6, further comprising:
a third capacitive sensor configured to detect an amount of relative movement of said media and said tip in at least an x-axis direction, the third capacitive sensor including:
a fixed comb having fingers protruding in a x-axis direction,
a moving comb connected having fingers protruding in a x-axis direction; and
an electrical path connected to said fixed comb and an electrical path connected to said moving comb;
wherein relative movement in at least the x-axis direction is determined at least in part on a change in capacitance between said fixed and moving combs of said first and third capacitive sensors; and
a fourth capacitive sensor configured to detect an amount of relative movement of said media and said tip in at least a y-axis direction, the fourth capacitive sensor including:
a fixed comb having fingers protruding in a y-axis direction,
a moving comb connected having fingers protruding in a y-axis direction; and
an electrical path connected to said fixed comb and an electrical path connected to said moving comb;
wherein relative movement in at least the y-axis direction is determined at least in part on a change in capacitance between said fixed and moving combs of said second and fourth capacitive sensors.

8. A system for storing information, comprising:
a media;
at least one tip adapted to write information and read information on said media;
a media movement mechanism attached to said media and configured to move said media in response to media control signals; and
a capacitive comb array including:
a fixed comb including fingers, and
a moving comb including fingers operably connected with the median
wherein the fingers of the fixed comb are interleaved between the fingers of the moving comb; and
capacitive outputs adapted to allow a measurement of capacitance carried by said capacitive comb array.

9. The system of claim 8, wherein:
the media includes a nitride recording layer; and
the at least one tip is adapted to cause one of electrons and electron holes to be formed in the nitride recording layer.

10. The system of claim 8, wherein:
the media includes PZT; and
the at least one tip is adapted to cause an anomaly within the PZT.

11. The system of claim 8, wherein relative movement of the media and the at least one tip in an x-axis direction is determined based on the capacitive comb array.

12. The system of claim 11, wherein the capacitive comb array is a first capacitive comb array; and further comprising:
a second capacitive comb array including:
a fixed comb including fingers, and
a moving comb including fingers operably connected with the media,
wherein the fingers of the fixed comb are interleaved between the fingers of the moving comb; and
capacitive outputs adapted to allow a measurement of capacitance carried by said second capacitive comb array;
wherein relative movement of the media and the at least one tip in a y-axis direction is determined based on the second capacitive comb array.

13. The system of claim 8, wherein:
the at least one tip extends toward the media from a corresponding cantilever; and
the cantilever is adapted to be actuated in a z-direction by applying an electrostatic force to the cantilever.

14. The system of claim 13, wherein:
the cantilever is fixedly associated with a platform by a torsion bar; and
when the electrostatic force is applied to the cantilever, the cantilever pivots about the torsion bar.

15. The system of claim 14, wherein:
the electrostatic force is applied to a portion of the cantilever on opposite side of a pivot point of the torsion bar relative to the at least one tip; and
the electrostatic force attracts the portion toward the platform, thereby causing the at least one tip to pivot away from the platform and towards the media.

16. A method of determining relative movement of a tip and a media on which information is stored in a storage device, the method comprising:
operatively associating a fixed comb of a capacitive sensor with a static portion of the storage device;
operatively associating a moving comb of the capacitive sensor with a moving portion of the storage device;
determining relative movement of the fixed comb and the moving comb based at least in part on a change in capacitance between said fixed and moving combs;
determining relative movement of the tip and the media based on the relative movement of the fixed comb and the moving comb.

17. A system for storing information, comprising:
a media;
a tip adapted to electrically communicate with said media;
a movement mechanism configured to move one of the media and the tip in response to control signals; and
a capacitive sensor configured to detect an amount of relative movement of said media and said tip, the capacitive sensor including:
a fixed member,
a moving member, at least of a portion of the moving member overlapping the fixed member; and
an electrical path connected to said fixed member and an electrical path connected to said moving member;
wherein relative movement is determined at least in part on a change in capacitance between said fixed and moving members of said capacitive sensor.

18. The system of claim 17, wherein:
the media includes a nitride recording layer; and
the tip is adapted to cause one of electrons and electron holes to be formed in the nitride recording layer.

19. The system of claim 17, wherein:
the media includes PZT; and
the tip is adapted to cause an anomaly within the PZT.

20. The system of claim 17, wherein:
the fixed member is a comb and the moving member is a comb; and
fingers of the fixed member are interleaved with fingers of the moving member.

* * * * *

UNITED STATES PATENT AND TRADEMARK OFFICE
CERTIFICATE OF CORRECTION

| | | |
|---|---|---|
| PATENT NO. | : 7,391,707 B2 | Page 1 of 1 |
| APPLICATION NO. | : 11/670941 | |
| DATED | : June 24, 2008 | |
| INVENTOR(S) | : Culver et al. | |

It is certified that error appears in the above-identified patent and that said Letters Patent is hereby corrected as shown below:

In the claims:

Column 32, line 51: Delete "pan" and insert --part--

Column 33, line 55: Delete "median" and insert --media;--

Signed and Sealed this

Twenty-sixth Day of August, 2008

JON W. DUDAS
*Director of the United States Patent and Trademark Office*